(12) United States Patent
Kori et al.

(10) Patent No.: US 11,676,814 B2
(45) Date of Patent: Jun. 13, 2023

(54) MATERIAL FOR FORMING ORGANIC FILM, SUBSTRATE FOR MANUFACTURING SEMICONDUCTOR APPARATUS, METHOD FOR FORMING ORGANIC FILM, AND PATTERNING PROCESS

(71) Applicant: SHIN-ETSU CHEMICAL CO., LTD., Tokyo (JP)

(72) Inventors: Daisuke Kori, Joetsu (JP); Takashi Sawamura, Joetsu (JP); Keisuke Niida, Joetsu (JP); Seiichiro Tachibana, Joetsu (JP); Takeru Watanabe, Joetsu (JP); Tsutomu Ogihara, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 372 days.

(21) Appl. No.: 16/884,203

(22) Filed: May 27, 2020

(65) Prior Publication Data
US 2020/0381247 A1 Dec. 3, 2020

(30) Foreign Application Priority Data
May 27, 2019 (JP) .............................. JP2019-98636

(51) Int. Cl.
*H01L 21/027* (2006.01)
*H01L 21/033* (2006.01)
*G03F 7/09* (2006.01)

(52) U.S. Cl.
CPC .......... *H01L 21/0271* (2013.01); *G03F 7/091* (2013.01); *G03F 7/094* (2013.01); *H01L 21/033* (2013.01)

(58) Field of Classification Search
CPC ........ G03F 7/162; G03F 7/168; G03F 7/2002; G03F 7/30; G03F 7/091; G03F 7/094;
(Continued)

(56) References Cited

U.S. PATENT DOCUMENTS

2002/0106909 A1 8/2002 Kato et al.
2005/0255712 A1 11/2005 Kato et al.
(Continued)

FOREIGN PATENT DOCUMENTS

JP 2002-334869 A 11/2002
JP 2003-213130 A 7/2003
(Continued)

OTHER PUBLICATIONS

Nov. 30, 2020 Extended European Search Report issued in European Patent Application No. 20176205.1.
(Continued)

*Primary Examiner* — Caleen O Sullivan
(74) *Attorney, Agent, or Firm* — Oliff PLC

(57) ABSTRACT

A material for forming an organic film using a polymer including an imide group for forming an organic underlayer film that cures under film-forming conditions in the air and in an inert gas, generates no by-product in heat resistance and embedding and flattening characteristics of a pattern formed on a substrate, also adhesiveness to a substrate for manufacturing a semiconductor apparatus, a method for forming an organic film, and a patterning process. The material includes (A) a polymer having a repeating unit represented by the following general formula (1A) whose terminal group is a group represented by either of the
(Continued)

following general formulae (1B) or (1C), and (B) an organic solvent:

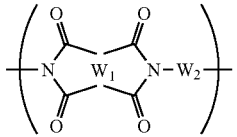

(1A)

wherein, $W_1$ represents a tetravalent organic group, and $W_2$ represents a divalent organic group:

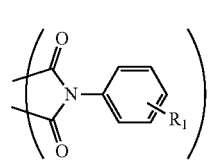

(1B)

(1C)

wherein, $R_1$ represents any of the groups represented by the following formula (1D), and two or more of $R_1$s may be used in combination.

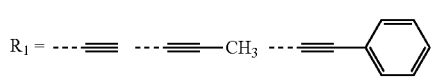

(1D)

23 Claims, 3 Drawing Sheets

(58) Field of Classification Search
CPC . G03F 7/09; G03F 7/11; G03F 7/0002; G03F 7/004; G03F 7/037; H01L 21/02126; H01L 21/02164; H01L 21/02186; H01L 21/02271; H01L 21/0332; H01L 21/0337; H01L 21/31144; H01L 21/32139; H01L 21/0271; H01L 21/033; H01L 21/3081; H01L 21/3086; C08G 73/126; C08G 73/127; C08G 73/1032; C08G 73/1075; C08J 5/18; C08J 2379/08; C08J 2479/08; C08L 79/08
USPC ............ 430/5, 311, 330, 270.1, 271.1, 272.1
See application file for complete search history.

(56) References Cited

U.S. PATENT DOCUMENTS

| | | |
|---|---|---|
| 2006/0019195 A1 | 1/2006 | Hatakeyama et al. |
| 2006/0204891 A1 | 9/2006 | Hatakeyama |
| 2009/0274978 A1 | 11/2009 | Ohashi et al. |
| 2010/0099044 A1 | 4/2010 | Hatakeyama et al. |
| 2012/0252217 A1 | 10/2012 | Minegishi et al. |
| 2013/0084705 A1 | 4/2013 | Nakafuji et al. |
| 2013/0302990 A1 | 11/2013 | Watanabe et al. |
| 2016/0085152 A1 | 3/2016 | Nakafuji et al. |
| 2017/0184968 A1 | 6/2017 | Kori et al. |
| 2018/0046078 A1* | 2/2018 | Karasawa ............. G03F 7/0752 |

FOREIGN PATENT DOCUMENTS

| | | |
|---|---|---|
| JP | 2004-126547 A | 4/2004 |
| JP | 2005-128509 A | 5/2005 |
| JP | 2006-285095 A | 10/2006 |
| JP | 2006-293298 A | 10/2006 |
| JP | 2007-199653 A | 8/2007 |
| JP | 2009-185190 A | 8/2009 |
| JP | 2009-269953 A | 11/2009 |
| JP | 2010-122297 A | 6/2010 |
| JP | 2010-122656 A | 6/2010 |
| JP | 2010-181605 A | 8/2010 |
| JP | 2012-215842 A | 11/2012 |
| JP | 2013-083939 A | 5/2013 |
| JP | 2013-137334 A | 7/2013 |
| JP | 2013-253227 A | 12/2013 |
| JP | 2014-218632 A | 11/2014 |
| JP | 2015-093966 A | 5/2015 |
| JP | 2016-044272 A | 4/2016 |
| JP | 2016-060886 A | 4/2016 |
| JP | 2017-119671 A | 7/2017 |
| JP | 2018-119122 A | 8/2018 |
| KR | 10-2017-0076585 A | 7/2017 |
| WO | 2004/066377 A1 | 8/2004 |
| WO | 2014/208324 A1 | 12/2014 |
| WO | 2017/217292 A1 | 12/2017 |
| WO | 2018/212116 A1 | 11/2018 |

OTHER PUBLICATIONS

Nov. 10, 2021 Office Action issued in Korean Patent Application No. 2020-0063027.
Dec. 2, 2021 Office Action and Search Report issued in Taiwanese Patent Application No. 109117302.
May 24, 2021 Office Action issued in Korean Patent Application No. 10-2020-0063027.
Apr. 4, 2023 Office Action issued in Japanese Patent Application No. 2020-75273.

* cited by examiner

[FIG. 1]
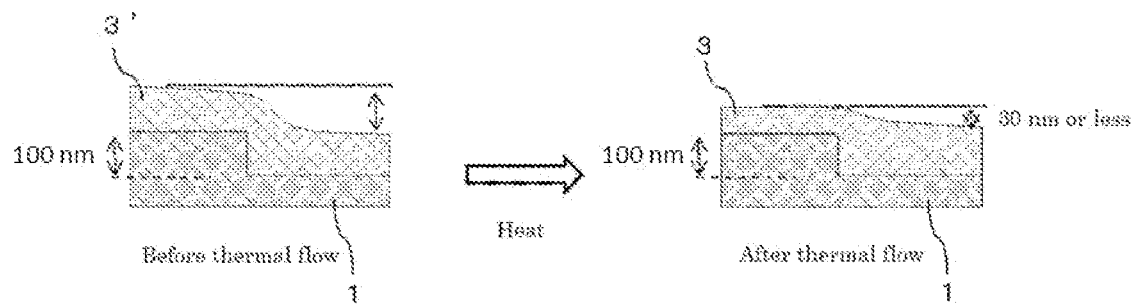
[FIG. 2]
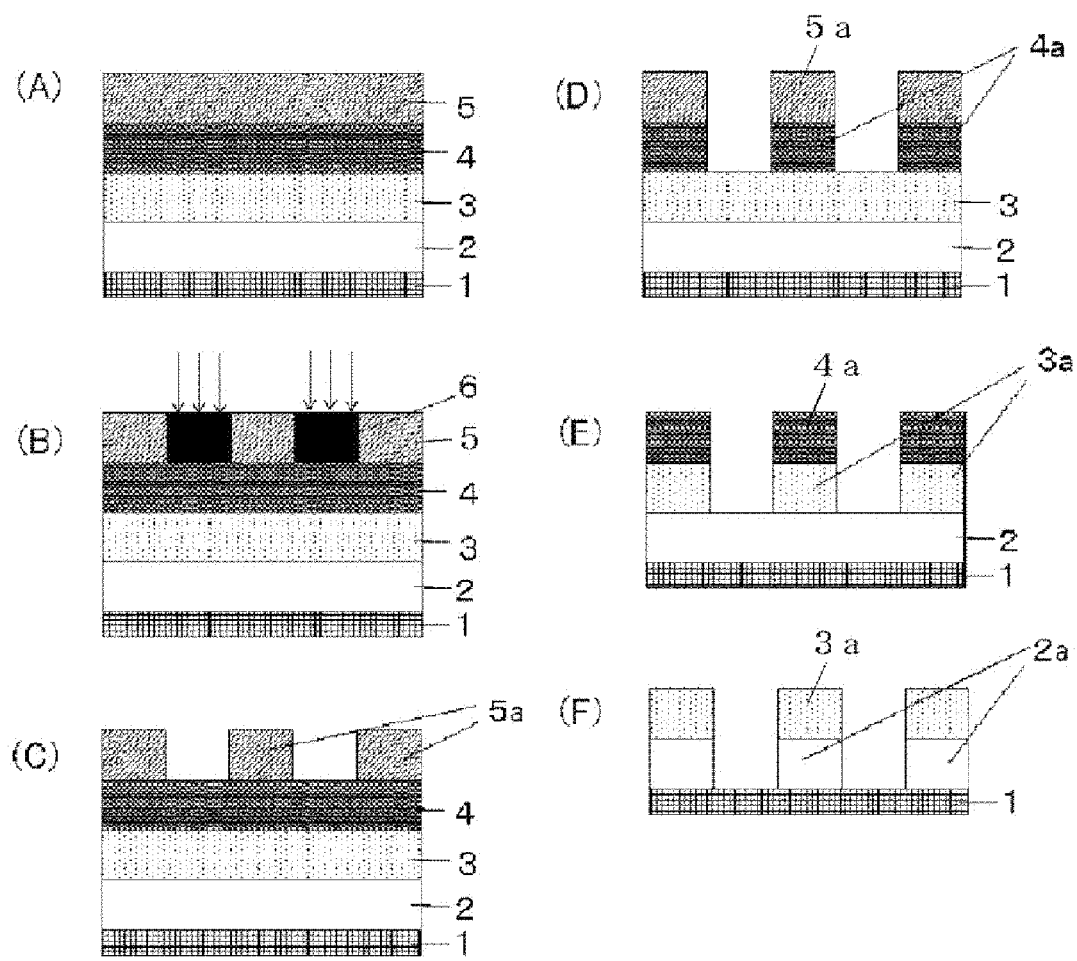

[FIG. 3]
(G)
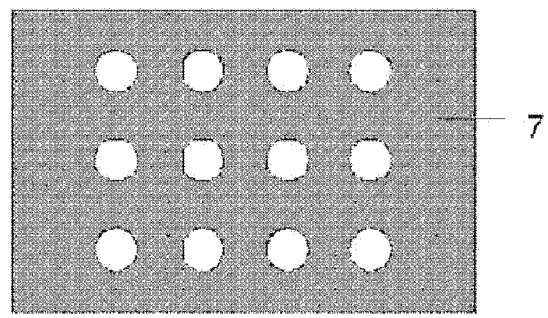
(H)
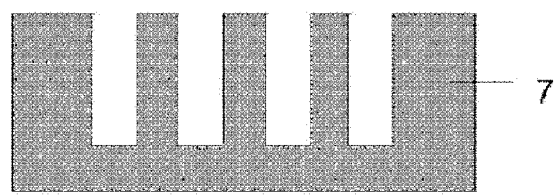
(I)
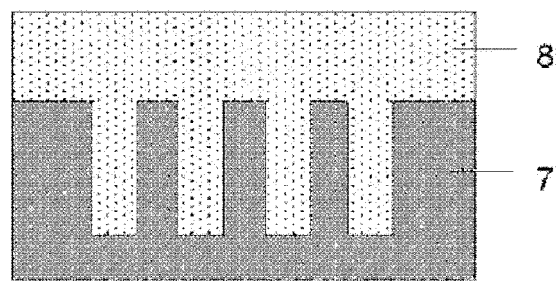

[FIG. 4]
(J)
(K)
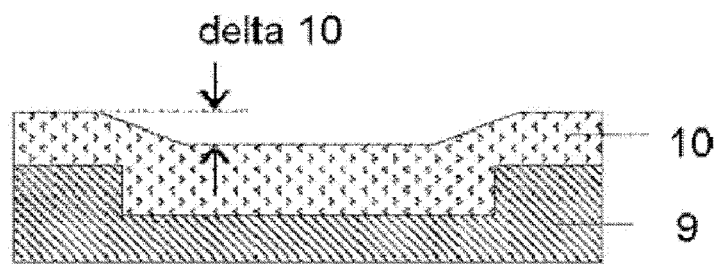
[FIG. 5]
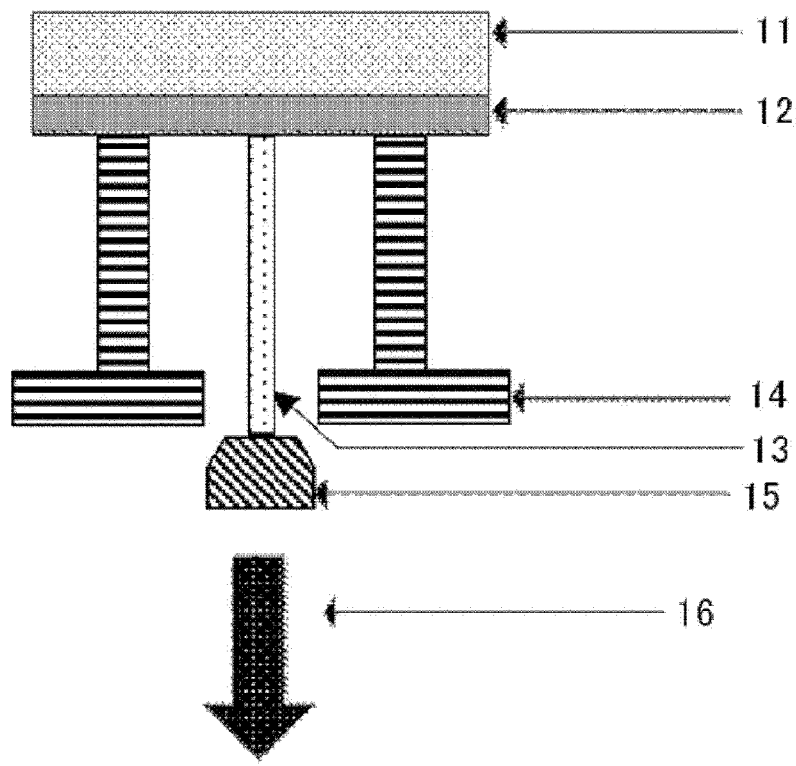

MATERIAL FOR FORMING ORGANIC FILM, SUBSTRATE FOR MANUFACTURING SEMICONDUCTOR APPARATUS, METHOD FOR FORMING ORGANIC FILM, AND PATTERNING PROCESS

TECHNICAL FIELD

The present invention relates to a material for forming an organic film used in manufacturing a semiconductor apparatus, a substrate for manufacturing a semiconductor apparatus using the material, a method for forming an organic film, and a patterning process by a multilayer resist method.

BACKGROUND ART

In recent years, higher integration and speed of semiconductor apparatuses have been achieved by miniaturization of pattern dimensions using shorter wavelengths of light sources in lithography technology (photolithography) using light exposure as general-purpose technology. For forming such a fine circuit pattern on a semiconductor apparatus substrate (substrate to be processed), generally, a method in which the substrate to be processed is processed by dry-etching using a photoresist film in which a normal pattern is formed as an etching mask is used. However, no effective dry etching method capable of ensuring complete etching selectivity between a photoresist film and a substrate to be processed is actually present, so that there has been generalized substrate processing by a multilayer resist method in recent years. This method is a method in which an intermediate film having a different etching selectivity from a photoresist film (hereinafter referred to as "resist upper layer film") is interposed between the resist upper layer film and a substrate to be processed and a pattern is obtained in the resist upper layer film, and then, the pattern is transferred to the intermediate film by dry etching using the resist upper layer film pattern as a dry etching mask, and further the pattern is transferred to the substrate to be processed by dry etching using the intermediate film as a dry etching mask.

As one of multilayer resist methods, there is a three-layer resist method which can be carried out using a general resist composition used in a single-layer resist method. In this method, a material for an organic underlayer film composed of an organic resin-containing composition is applied on a substrate to be processed and fired to form an organic underlayer film (hereinafter referred to as "organic film"), a material for a resist intermediate film composed of a silicon-containing resin-containing composition is coated thereon and fired to form a silicon-containing film (hereinafter referred to as "silicon intermediate film"), and a general organic photoresist film (hereinafter referred to as "resist upper layer film") is formed thereon. When the resist upper layer film is subjected to patterning and then dry etching by fluorine-based gas plasma, an organic resist upper layer film can take a good etching selectivity ratio relative to the silicon intermediate film, so that the resist upper layer film pattern can be transferred to the silicon intermediate film. According to this method, even when a resist upper layer film which does not have sufficient film thickness for directly processing a substrate to be processed or a resist upper layer film which does not have sufficient dry etching resistance for processing the substrate to be processed is used, pattern can be readily transferred to a silicon intermediate film since a silicon intermediate film generally has a thickness equal to or thinner than that of the resist upper layer film. Subsequently, when pattern transfer is carried out to the organic underlayer film by dry etching using oxygen-based or hydrogen-based gas plasma by using the silicon intermediate film subjected to pattern transfer as a dry etching mask, pattern transfer can be carried out to the organic underlayer film having sufficient dry etching resistance for processing a substrate. By using this organic underlayer film pattern subjected to pattern transfer, pattern transfer can be carried out to the substrate by dry etching using fluorine-based gas, chlorine-based gas, or the like.

On the other hand, miniaturization in the manufacturing process of a semiconductor apparatus is approaching an essential limit derived from the wavelength of a light source for photolithography. Therefore, in recent years, high integration of a semiconductor apparatus which does not rely on miniaturization has been studied, and as one of the methods, a semiconductor apparatus having a complicated structure such as a multi-gate structure has been studied, and some of the semiconductor apparatuses have already been put to practical use. When these structures are formed by a multilayer resist method, a material for an organic film capable of flattening (planarization) by embedding minute patterns such as a hole, a trench and a fin formed on a substrate to be processed with a film without voids, or embedding a level difference, a pattern concentrated portion or a non-patterned region with a film can be applied. By forming a flat organic underlayer film surface on a stepped substrate using such a material for an organic film, fluctuation in film thickness of a silicon intermediate film or a resist upper layer film formed thereon is suppressed and reduction in focal tolerance of photolithography and margin in the subsequent processing step of a substrate to be processed can be suppressed. According to this procedure, semiconductor apparatuses can be manufactured with good yield. On the other hand, in a single-layer resist method, a film thickness of an upper layer resist film becomes thick for embedding substrates to be processed having a level difference and a pattern, and patterning tolerance at the exposure becomes narrower such as pattern collapse after exposure and development caused thereby and degradation in pattern shape due to reflection from the substrate at the exposure, whereby it is difficult to manufacture semiconductor apparatuses with good yield.

Moreover, as a means for achieving higher speed of next-generation semiconductor apparatuses, for example, application of a novel material having high electron mobility using strained silicon, gallium arsenide or the like, and precision material such as ultrathin film polysilicon controlled by the angstrom order has been starting to be considered. However, in such a substrate to be processed to which such a novel precision material has been applied, the material is corroded by oxygen in the air under conditions for forming flattened films using the above-mentioned material for organic underlayer film, e.g., under film forming conditions of 300° C. or higher in the air, so that speeding up of semiconductor apparatuses cannot achieve performance as expected by the material design and there is a possibility that the yield which can establish as industrial production may not be achieved. Therefore, in order to avoid decrease in yield due to corrosion of the substrate by air under such high temperature conditions, a material for organic underlayer film that can be formed in an inert gas is expected.

Conventionally, it has been known a condensation resin using a carbonyl compound such as ketones and aldehydes or aromatic alcohols as a condensing agent for a phenol-based or naphthol-based compound as a material for forming an organic film for multilayer resist methods. For example, there may be exemplified by a fluorene bisphenol novolac resin disclosed in Patent Document 1, a bisphenol compound and the novolac resin disclosed in Patent Document 2, a novolac resin of an adamantane phenol compound disclosed in Patent Document 3, and a binaphthol compound and the novolac resin disclosed in Patent Document 4. Such a material is formed as a film having solvent resistance to a coated film material used in the next process by crosslinking due to a methylol compound as a crosslinking agent or by curing action due to crosslinking reaction by oxidation at an α-position of an aromatic ring by the action of oxygen in the air and the subsequent condensation.

Further, there has been known a material in which a triple bond is applied as an intermolecular crosslinking group of a curable resin. For example, there have been known Patent Documents 5 to 11, etc. In these materials, a cured film having solvent resistance is formed by not only the above-mentioned crosslinking derived from methylol but also crosslinking by polymerization of the triple bond. However, these materials for forming an organic film do not have sufficient filling characteristics and flattening characteristics of a pattern formed on a substrate.

Further, as examples having an imide structure shown in the present invention, there have been known a resin having a polyimide structure disclosed in Patent Documents 12 and 13, and Patent Document 14, etc., using a compound having a bismaleimide structure, but in these materials, there is no example of a terminal substituent having a triple bond on a nitrogen atom, and it has not been known about formation of a cured film in an inert gas, film thickness variation due to thermal decomposition under high temperature conditions, embedding characteristics and planarization characteristics, etc.

CITATION LIST

Patent Literature

Patent Document 1: JP 2005-128509A
Patent Document 2: JP 2006-293298A
Patent Document 3: JP 2006-285095A
Patent Document 4: JP 2010-122656A
Patent Document 5: JP 2010-181605A
Patent Document 6: WO2014-208324
Patent Document 7: JP 2012-215842A
Patent Document 8: JP 2016-044272A
Patent Document 9: JP 2016-060886A
Patent Document 10: JP 2017-119671A
Patent Document 11: JP 2013-083939A
Patent Document 12: JP 2013-137334A
Patent Document 13: JP 2010-122297A
Patent Document 14: WO2018-212116

SUMMARY OF INVENTION

Technical Problem

The present invention has been made in view of the above-mentioned circumstance, and an object thereof is to provide a material for forming an organic film using a polymer including an imide group capable of forming an organic underlayer film that cures under film-forming conditions not only in the air but also in an inert gas, generates no by-product, is excellent in not only heat resistance and embedding and flattening characteristics of a pattern formed on a substrate, but also good adhesiveness to a substrate, a substrate for manufacturing a semiconductor apparatus using the material, a method for forming an organic film, and a patterning process.

Solution to Problem

To solve the above-mentioned problems, the present invention provides a material for forming an organic film, which comprises (A) a polymer having a repeating unit represented by the following general formula (1A) whose terminal group is a group represented by either of the following general formulae (1B) or (1C), and (B) an organic solvent:

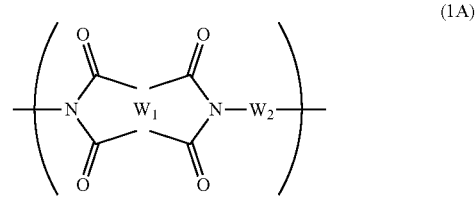

wherein, $W_1$ represents a tetravalent organic group, and $W_2$ represents a divalent organic group:

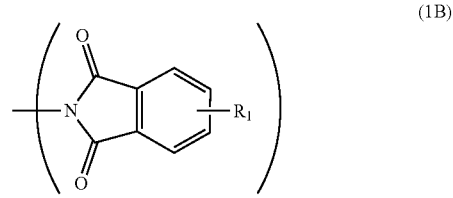

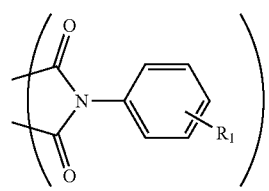

wherein, $R_1$ represents any of the groups represented by the following formula (1D), and two or more of $R_1$s may be used in combination.

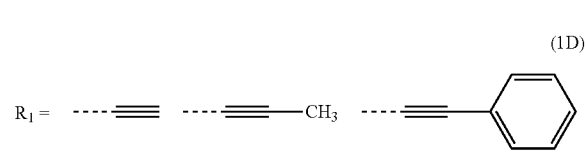

Such a material for forming an organic film is capable of forming an organic film that cures even under film-forming conditions not only in the air but also in an inert gas by the action of a terminal crosslinking group, and since the main chain is constituted by a polyimide skeleton, it becomes a material for forming an organic film capable of forming an organic film having high heat resistance, good adhesiveness to a substrate, and high degree embedding/flattening characteristics.

Also, $W_1$ in the general formula (1A) is preferably a group represented by the following general formula (1E):

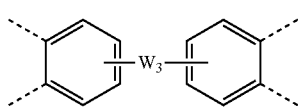

(1E)

wherein, $W_3$ represents a single bond or a divalent organic group, a benzene ring in the formula may have a substituent(s), and the substituent on the benzene ring and the organic group in $W_3$ may be bonded to each other to form a cyclic organic group.

Having such a partial structure in the main chain is preferable from the viewpoint of imparting excellent heat resistance.

In addition, $W_1$ in the general formula (1A) is preferably any of the groups represented by the following formula (1F):

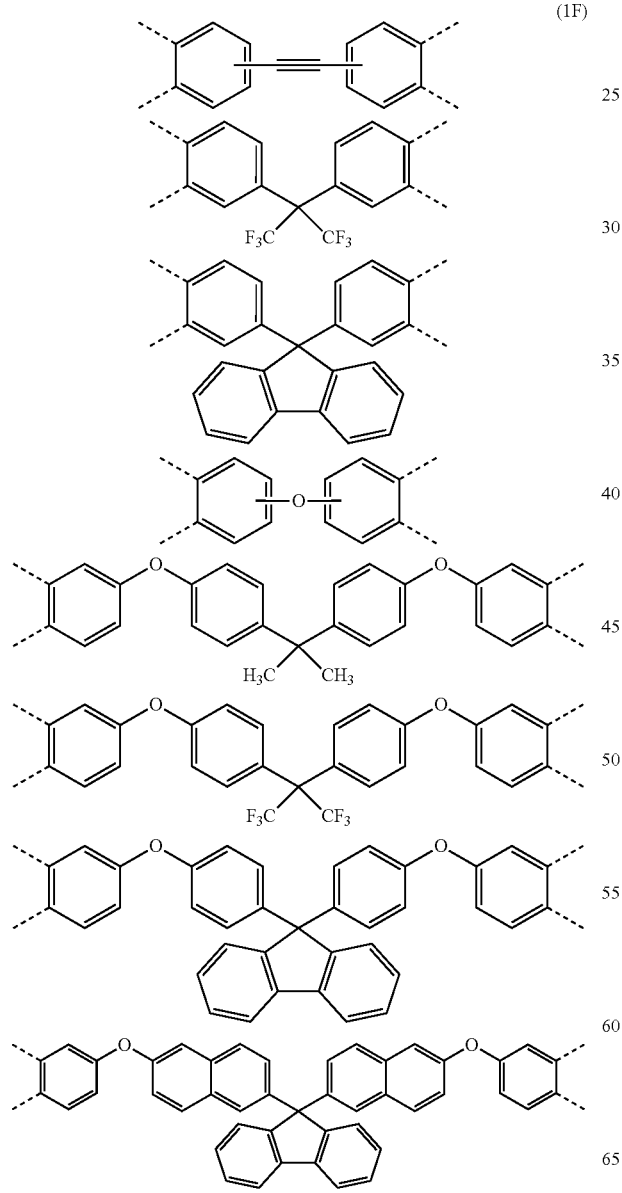

(1F)

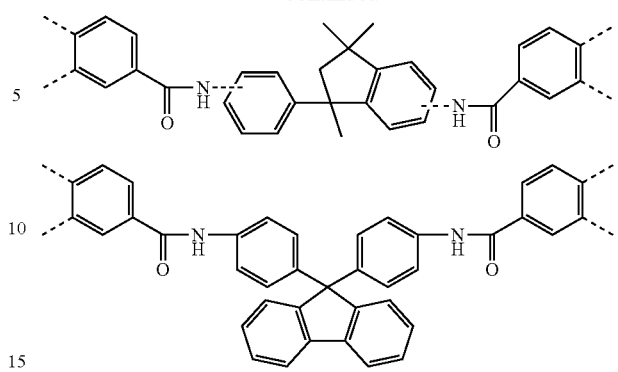

wherein, a substituent(s) may be present on an aromatic ring in the above formula.

Having such a partial structure in the main chain is preferable from the viewpoint of providing both heat resistance and thermal fluidity.

Also, $W_2$ in the general formula (1A) is preferably a group represented by the following general formula (1G):

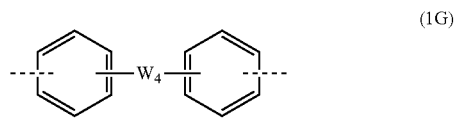

(1G)

wherein, $W_4$ represents a single bond or a divalent organic group, a benzene ring in the formula may have a substituent(s), and the substituent(s) on the benzene ring and the organic group in $W_4$ may be bonded to each other to form a cyclic organic group.

Having such a partial structure in the main chain is preferable from the viewpoint of imparting excellent heat resistance.

Also, $W_2$ in the general formula (1A) is preferably any of the groups represented by the following formula (1H):

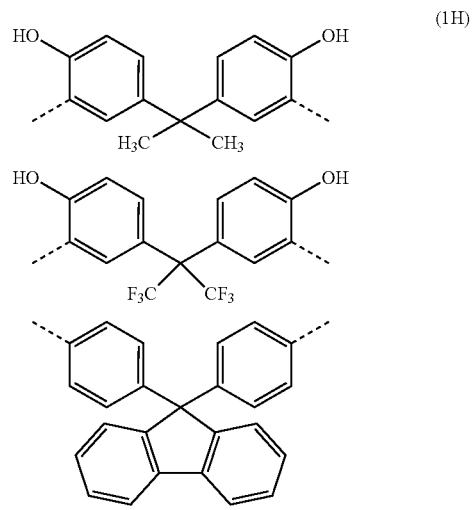

(1H)

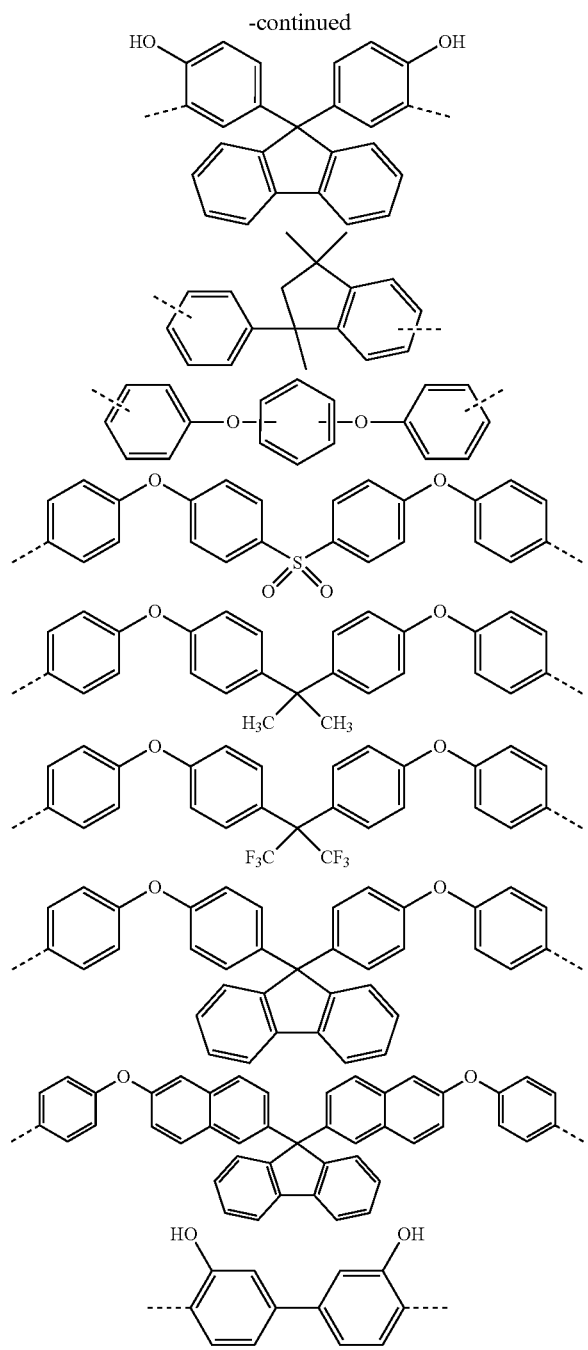

wherein, a substituent(s) may be present on an aromatic ring in the formula.

Having such a partial structure in the main chain is preferable from the viewpoint of providing both heat resistance and thermal fluidity.

Also, $W_1$ in the general formula (1A) is preferably one or more of the groups represented by the formula (1F) and $W_2$ in the general formula (1A) is preferably one or more of the groups represented by the formula (1H).

By combining the above organic groups for $W_1$ and $W_2$, thermal fluidity, heat resistance and adhesiveness can be made better.

The weight average molecular weight of the component (A) is preferably 1,000 to 10,000.

A material for forming an organic film including such a polymer in the Mw range can suppress outgas upon baking without impairing solubility to an organic solvent.

Also, the component (B) is preferably a mixture of one or more kinds of an organic solvent(s) having a boiling point of less than 180° C. and one or more kinds of an organic solvent(s) having a boiling point of 180° C. or higher.

When such a material for forming an organic film is employed, thermal fluidity is provided to a film due to addition of a solvent(s) having a high-boiling point to the above polymer, whereby it becomes a material for forming an organic film having both of high degree embedding/flattening characteristics.

The material for forming an organic film preferably further includes one or more of (C) an acid generator, (D) a surfactant, (E) a crosslinking agent and (F) a plasticizer.

When such a material for forming an organic film containing these components is employed, it can be made a material for forming an organic film more excellent in coatability or embedding/flattening characteristics.

The present invention also provides a substrate for manufacturing a semiconductor apparatus in which an organic film obtained by curing the above material for forming an organic film is formed on a substrate.

When the organic film obtained by curing the material for forming an organic film of the present invention is employed, it becomes an organic film having no minute hole due to embedding failure or no unevenness on the surface of the organic film due to insufficient flattening by having both of higher embedding/flattening characteristics. The substrate for manufacturing a semiconductor apparatus flattened by such an organic film becomes wide in process tolerance at the time of patterning and is possible to manufacture a semiconductor apparatus with good yield.

Also, in the present invention, it is provided a method for forming an organic film applied in the process of manufacturing a semiconductor apparatus, which comprises spin-coating the above material for forming an organic film on a substrate to be processed, and heat-treating the substrate to be processed coated with the material for forming an organic film at a temperature of 50° C. or higher and 600° C. or lower in the range of 10 seconds to 7,200 seconds in an inert gas atmosphere to obtain a cured film.

Moreover, in the present invention, it is provided a method for forming an organic film applied in the process of manufacturing a semiconductor apparatus, which comprises spin-coating the above material for forming an organic film on a substrate to be processed, heat-treating the substrate to be processed coated with the material for forming an organic film at a temperature of 50° C. or higher and 250° C. or lower in the range of 5 seconds to 600 seconds in the air to form a coated film, and subsequently heat-treating the same at a temperature of 200° C. or higher and 600° C. or lower in the range of 10 seconds to 7,200 seconds in an inert gas atmosphere to obtain a cured film.

The organic film applied in the process of manufacturing a semiconductor apparatus formed by the method of the present invention has high heat resistance and high degree embedding/flattening characteristics, and when it is used in the process of manufacturing a semiconductor apparatus, yield of the semiconductor apparatus becomes good.

At this time, the oxygen concentration in the inert gas is preferably 1% or less.

When the material for forming an organic film of the present invention is employed, even when it is heated in such an inert gas atmosphere, it cures sufficiently without generating sublimate, and can form an organic film excellent in adhesiveness to a substrate.

In addition, the substrate to be processed used may have a structure or a step with a height of 30 nm or more.

The method for forming an organic film of the present invention is particularly useful for forming a flat organic film on such a substrate to be processed.

In addition, in the present invention, it is provided a patterning process which comprises forming an organic film on a body to be processed using the above material for forming an organic film, forming a silicon-containing resist intermediate film on the organic film using a material for a silicon-containing resist intermediate film, forming a resist upper layer film on the silicon-containing resist intermediate film using a photoresist composition, forming a circuit pattern in the resist upper layer film, transferring the pattern to the silicon-containing resist intermediate film by etching using the resist upper layer film in which the pattern has been formed as a mask, transferring the pattern to the organic film by etching using the silicon-containing resist intermediate film to which the pattern has been transferred as a mask, and further transferring the pattern to the body to be processed by etching using the organic film to which the pattern has been transferred as a mask.

Further, in the present invention, it is provided a patterning process which comprises forming an organic film on a body to be processed using the above material for forming an organic film, forming a silicon-containing resist intermediate film on the organic film using a material for a silicon-containing resist intermediate film, forming an organic antireflection film on the silicon-containing resist intermediate film, forming a resist upper layer film on the organic antireflection film using a photoresist composition to provide a four-layer film structure, forming a circuit pattern in the resist upper layer film, transferring the pattern to the organic antireflection film and the silicon-containing resist intermediate film by etching using the resist upper layer film in which the pattern has been formed as a mask, transferring the pattern to the organic film by etching using the silicon-containing resist intermediate film to which the pattern has been transferred as a mask, and further transferring the pattern to the body to be processed by etching using the organic film to which the pattern has been transferred as a mask.

Moreover, in the present invention, it is provided a patterning process which comprises forming an organic film on a body to be processed using the above material for forming an organic film, forming an inorganic hard mask selected from a silicon oxide film, a silicon nitride film, a silicon oxynitride film, a titanium oxide film and a titanium nitride film on the organic film, forming a resist upper layer film on the inorganic hard mask using a photoresist composition, forming a circuit pattern in the resist upper layer film, transferring the pattern to the inorganic hard mask by etching using the resist upper layer film in which the pattern has been formed as a mask, transferring the pattern to the organic film by etching using the inorganic hard mask to which the pattern has been transferred as a mask, and further transferring the pattern to the body to be processed by etching using the organic film to which the pattern has been transferred as a mask.

Further, in the present invention, it is provided a patterning process which comprises forming an organic film on a body to be processed using the above material for forming an organic film, forming an inorganic hard mask selected from a silicon oxide film, a silicon nitride film, a silicon oxynitride film, a titanium oxide film and a titanium nitride film on the organic film, forming an organic antireflection film on the inorganic hard mask, forming a resist upper layer film on the organic antireflection film using a photoresist composition to provide a four-layer film structure, forming a circuit pattern in the resist upper layer film, transferring the pattern to the organic antireflection film and the inorganic hard mask by etching using the resist upper layer film in which the pattern has been formed as a mask, transferring the pattern to the organic film by etching using the inorganic hard mask to which the pattern has been transferred as a mask, and further transferring the pattern to the body to be processed by etching using the organic film to which the pattern has been transferred as a mask.

The material for forming an organic film of the present invention can be suitably used in various patterning processes such as three-layer resist process using a silicon-containing resist intermediate film or an inorganic hard mask, and four-layer resist process using an organic antireflection film in addition thereto. In the process of manufacturing a semiconductor apparatus, when a circuit pattern is formed by using such a patterning process of the present invention, a semiconductor apparatus can be manufactured with good yield.

The inorganic hard mask is preferably formed by a CVD method or an ALD method.

In the patterning process of the present invention, an inorganic hard mask can be formed by, for example, such a method.

Also, in the above formation of the circuit pattern, it is preferable that the circuit pattern is formed by lithography using a light whose wavelength is 10 nm or more and 300 nm or less, direct writing by electron beam, nanoimprinting, or a combination thereof.

Further, in the above formation of the circuit pattern, it is preferable that the circuit pattern formed is developed by an alkaline development or an organic solvent.

In the patterning process of the present invention, such means for forming a circuit pattern and development can preferably be used.

Also, as the body to be processed, it is preferable to use a semiconductor apparatus substrate, or the semiconductor apparatus substrate coated with any of a metal film, a metal carbide film, a metal oxide film, a metal nitride film, a metal oxycarbide film and a metal oxynitride film.

Further, the body to be processed used preferably contains silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof.

When the patterning process of the present invention is employed, a pattern can be formed by processing the above-described body to be processed.

Advantageous Effects of Invention

As described above, the material for forming an organic film of the present invention can form a cured film without generating by-products even in film formation in an inert gas in which corrosion of the substrate is prevented, so that it is useful for forming an organic underlayer film having both high degree embedding and flattening characteristics. Also, the material for forming an organic film of the present invention is a material for forming an organic film having excellent embedding/flattening characteristics and various characteristics such as heat resistance, etching resistance and adhesion. Therefore, it is extremely useful, for example, as a material for an organic film in multilayer resist methods such as a two-layer resist method, a three-layer resist method using a silicon-containing intermediate film and a four-layer resist method using a silicon-containing intermediate film and an organic antireflection film, or a flattening material for manufacturing a semiconductor apparatus. Further, the organic film formed from the material for forming an organic film of the present invention has excellent heat resistance, so that even when a CVD hard mask is formed on the organic underlayer film, there is no fluctuation in film thickness due to thermal decomposition, and it is suitable for patterning.

BRIEF DESCRIPTION OF DRAWINGS

FIG. 1 is an explanatory diagram of flattening characteristics according to the present invention.

FIG. 2 is an explanatory diagram of one example of a patterning process by a three-layer resist method of the present invention.

FIG. 3 is an explanatory diagram of a method for evaluating embedding characteristics in Examples.

FIG. 4 is an explanatory diagram of a method for evaluating the flattening characteristics in Examples.

FIG. 5 is an explanatory diagram of a method for measuring the adhesiveness in Examples.

DESCRIPTION OF EMBODIMENTS

As described above, it has been desired to develop a material for forming an organic film which can form an organic underlayer film having not only excellent embedding and flattening characteristics of a pattern formed on the substrate but also excellent dry etching resistance during substrate processing without generating by-products even at film forming conditions in an inert gas, for example, 300° C. or higher, in order to prevent from generating corrosion of the substrate, and has no film thickness fluctuation of the organic underlayer film by thermal decomposition even when a CVD hard mask is formed on the organic underlayer film.

Usually, when an organic underlayer film is to be formed, a compound for forming an organic film is dissolved in an organic solvent to form a composition, which is coated onto a substrate on which the structure or wiring of a semiconductor apparatus is formed, and fired to form an organic underlayer film. Immediately after coating of the composition, a coating film along the shape of the level difference structure on the substrate is formed, but when the coating film is baked, most of the organic solvent evaporates until it hardens and the organic film is formed by the compound for forming an organic film remaining on the substrate. The present inventors concluded that if the compound for forming an organic film remaining on the substrate at this time has sufficient thermal fluidity, it is possible to flatten the level difference shape immediately after coating by thermal fluidization to form a flat film.

The present inventors have further studied intensively, and have found that by using a polymer having a polyimide structure represented by the general formula (1A) in the main skeleton and a group having a triple bond represented by $R_1$ as a thermosetting group represented by the general formulae (1B) and (1C) which is introduced as a terminal group, as a material for forming an organic film, it has a thermosetting property equivalent to that of a conventional underlayer film material not only in air but also in an inert gas and also has high degree embedding/flattening characteristics since it is excellent in thermal fluidity. Further, they have also found that it becomes a material which provides a material for forming an organic film having good adhesiveness to a substrate and high heat resistance without fluctuation in thickness of the coated film due to thermal decomposition even when a CVD hard mask is formed, whereby completed the present invention.

That is, the present invention provides a material for forming an organic film, which comprises (A) a polymer having a repeating unit represented by the above general formula (1A) whose terminal group is a group represented by either of the above general formula (1B) or (1C), and (B) an organic solvent.

The present invention will be described in detail, but the present invention is not limited thereto.

<(A) Polymer>

A polymer for forming an organic film used in the material for forming an organic film of the present invention has a repeating unit represented by the following general formula (1A) and its terminal group is a group represented by either of the following general formula (1B) or (1C):

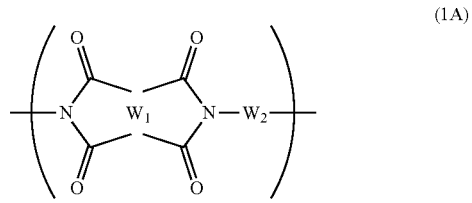

wherein, $W_1$ represents a tetravalent organic group, and $W_2$ represents a divalent organic group:

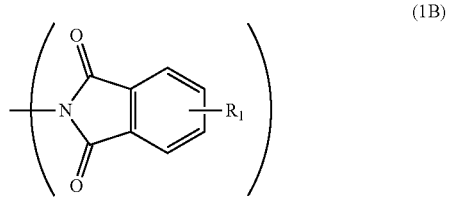

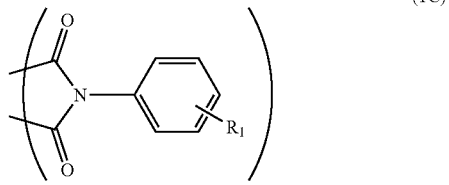

wherein, $R_1$ represents any of the groups represented by the following formula (1D), and two or more of $R_1$s may be used in combination.

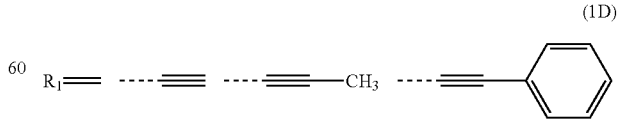

By preliminarily making the polyimide structure which has a closed ring as in the above (1A), (1B), and (1C), an elimination reaction is not occurred such as dehydration of water by-produced when a precursor of a polyimide compound such as polyamic acid is thermally closed, and as a result, film shrinkage is suppressed and the flatness of the organic film is not impaired. Also, by making a stable imide structure in advance, decomposition of a polyimide compound precursor such as polyamic acid by an equilibrium reaction can be suppressed, which is advantageous in terms of storage stability. Further, the polyimide structure contributes to improvement of the adhesive force to the substrate as well as provision of heat resistance. By improving the adhesive force, it is possible to prevent the film from being peeled off when an inorganic hard mask formed by using the CVD method or the ALD method is formed directly on the organic film, and to form an organic film having excellent process tolerance.

The $R_1$ represented by the above formula (1D) functions as a thermal crosslinking group. It is preferably an ethynyl group or an ethynylphenyl group in view of curability, heat resistance, and easily available raw materials.

As $W_1$ in the above general formula, there may be exemplified by the following structural formulae, and a substituent(s) may be present on these aromatic rings. Also, as the substituent, there may be exemplified by a hydroxyl group, a trifluoromethyl group, an alkyl group having 1 to 10 carbon atoms, an alkynyl group or an alkenyl group having 3 to 10 carbon atoms, an alkyloxy group having 1 to 10 carbon atoms, an alkynyloxy group or an alkenyloxy group having 3 to 10 carbon atoms, an aryl group having 6 to 10 carbon atoms, a nitro group, a halogen group, a nitrile group, an alkoxycarbonyl group having 1 to 10 carbon atoms and an alkanoyloxy group having 1 to 10 carbon atoms.

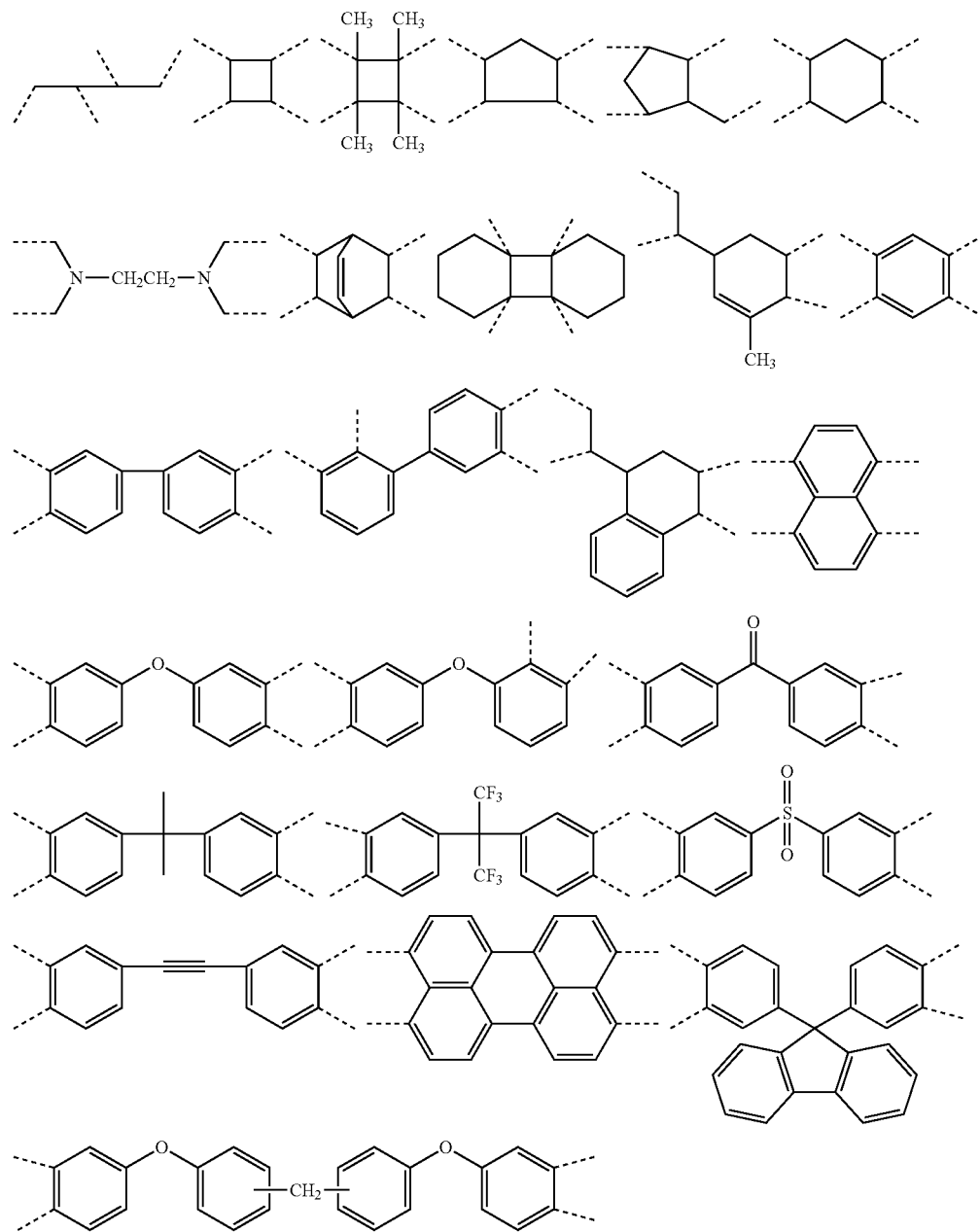

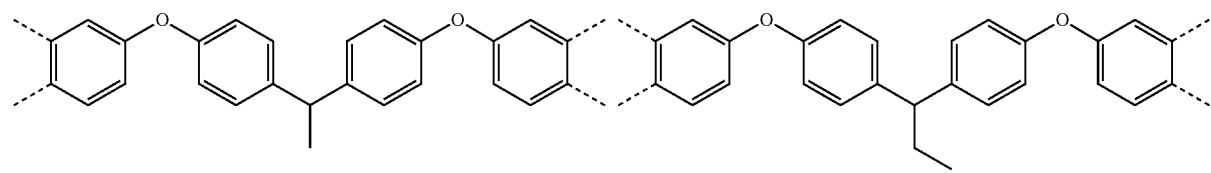
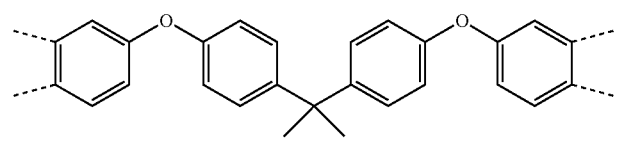
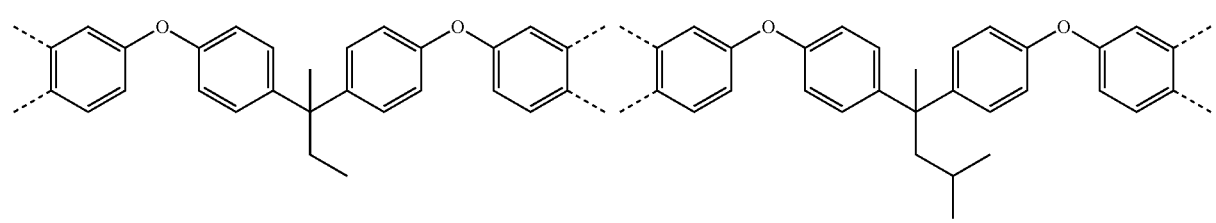
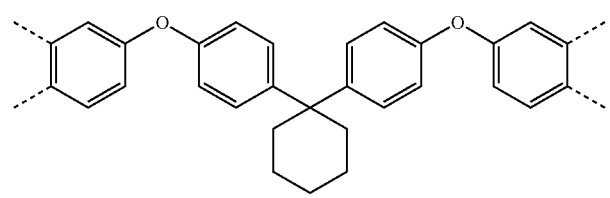
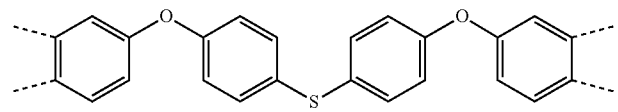
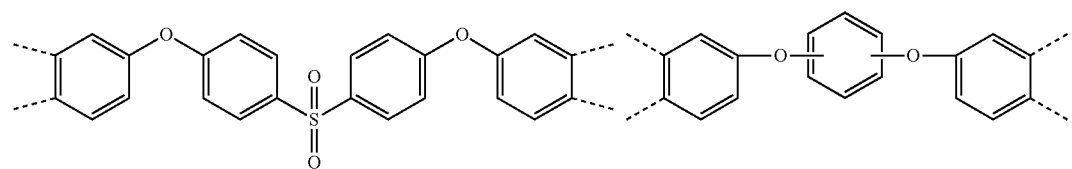
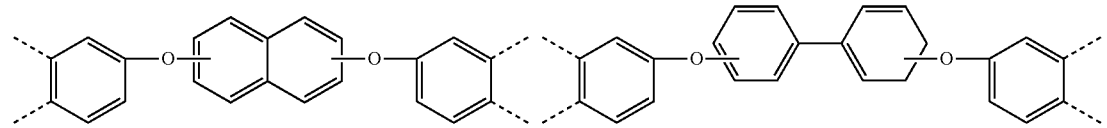
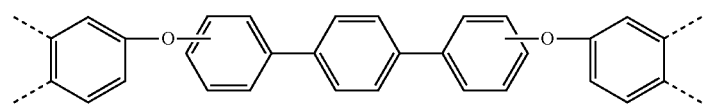
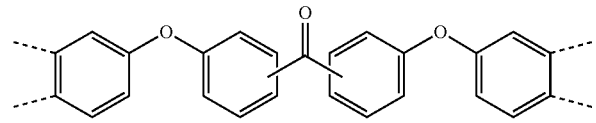
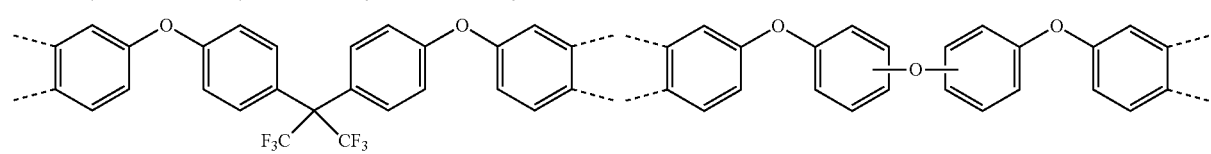

-continued
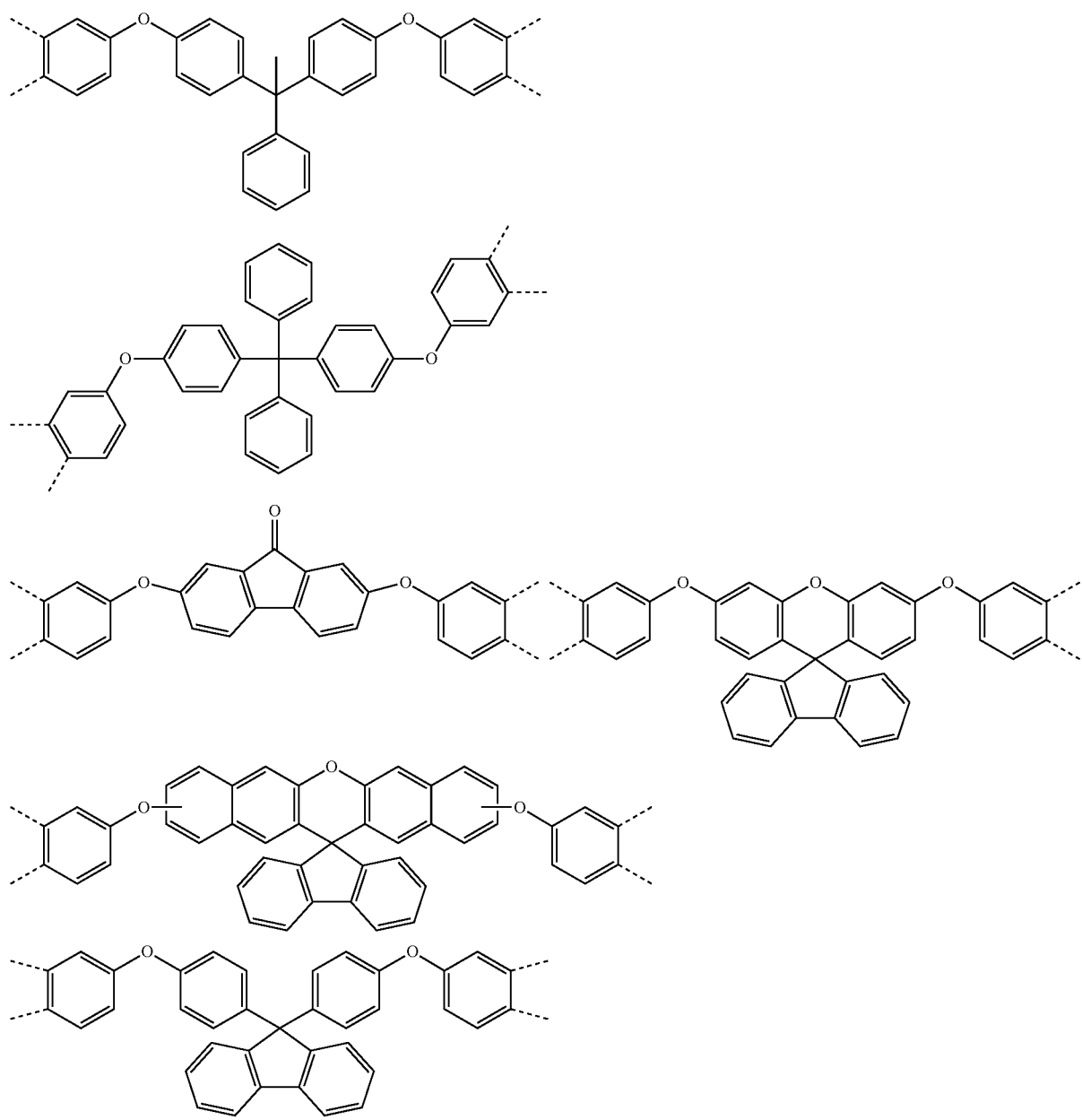

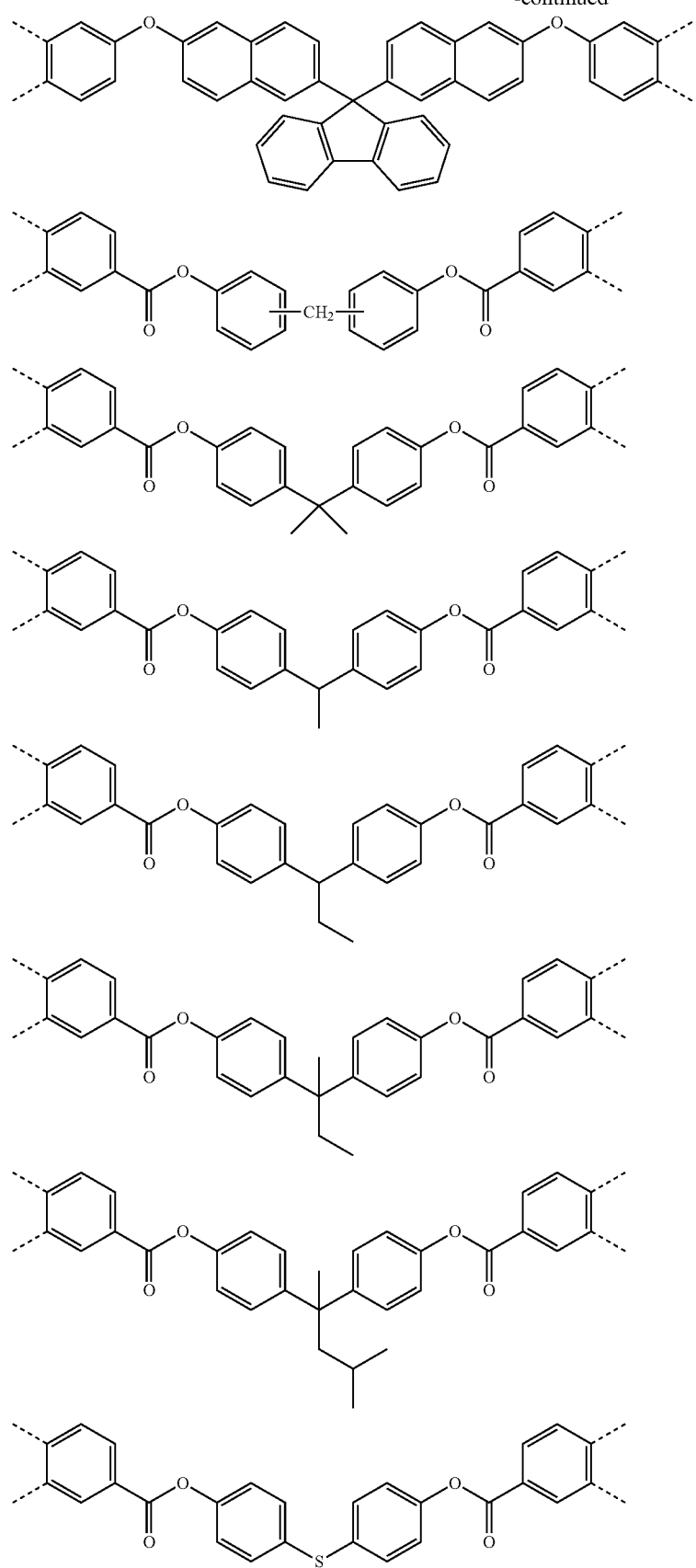

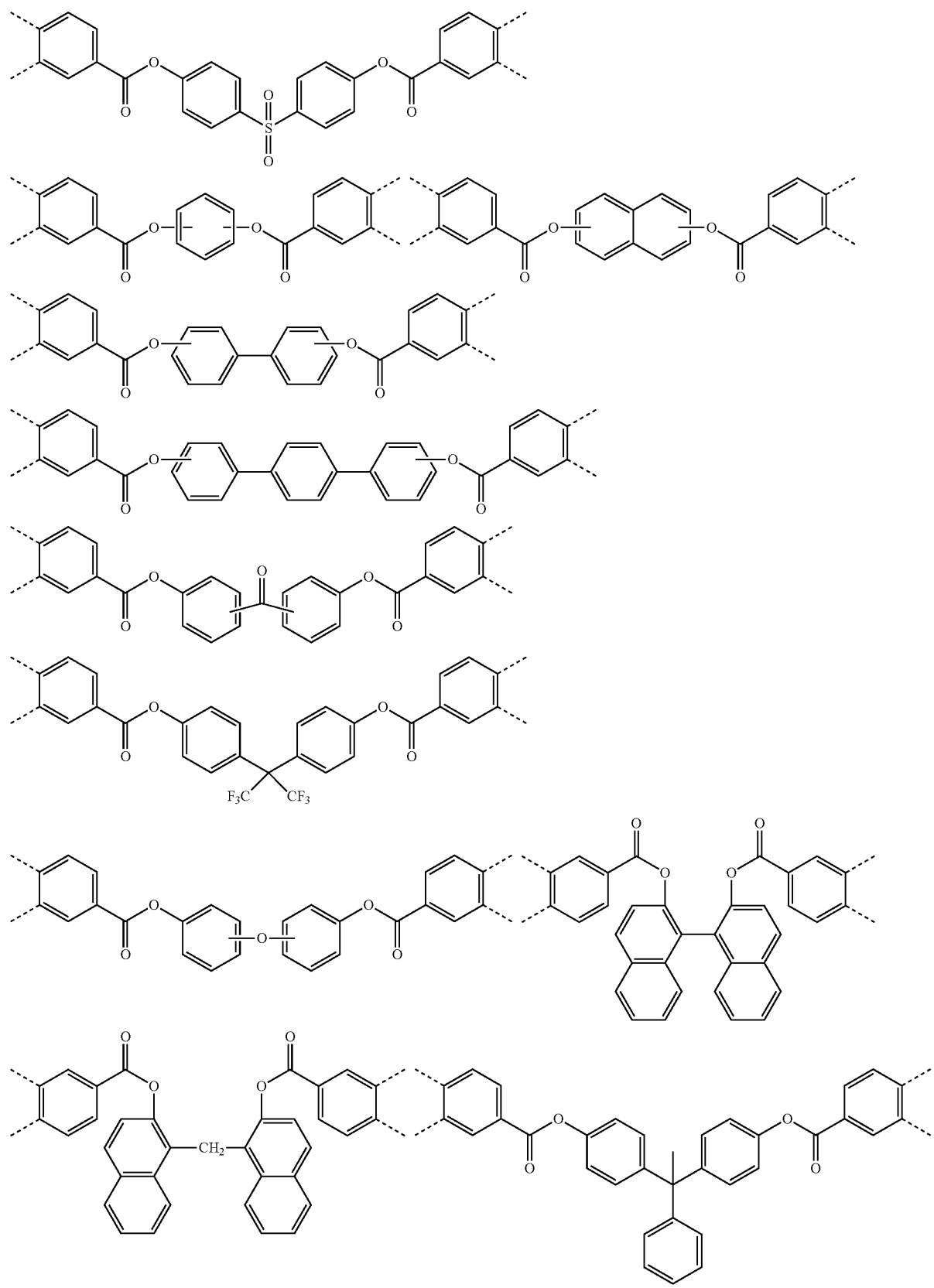

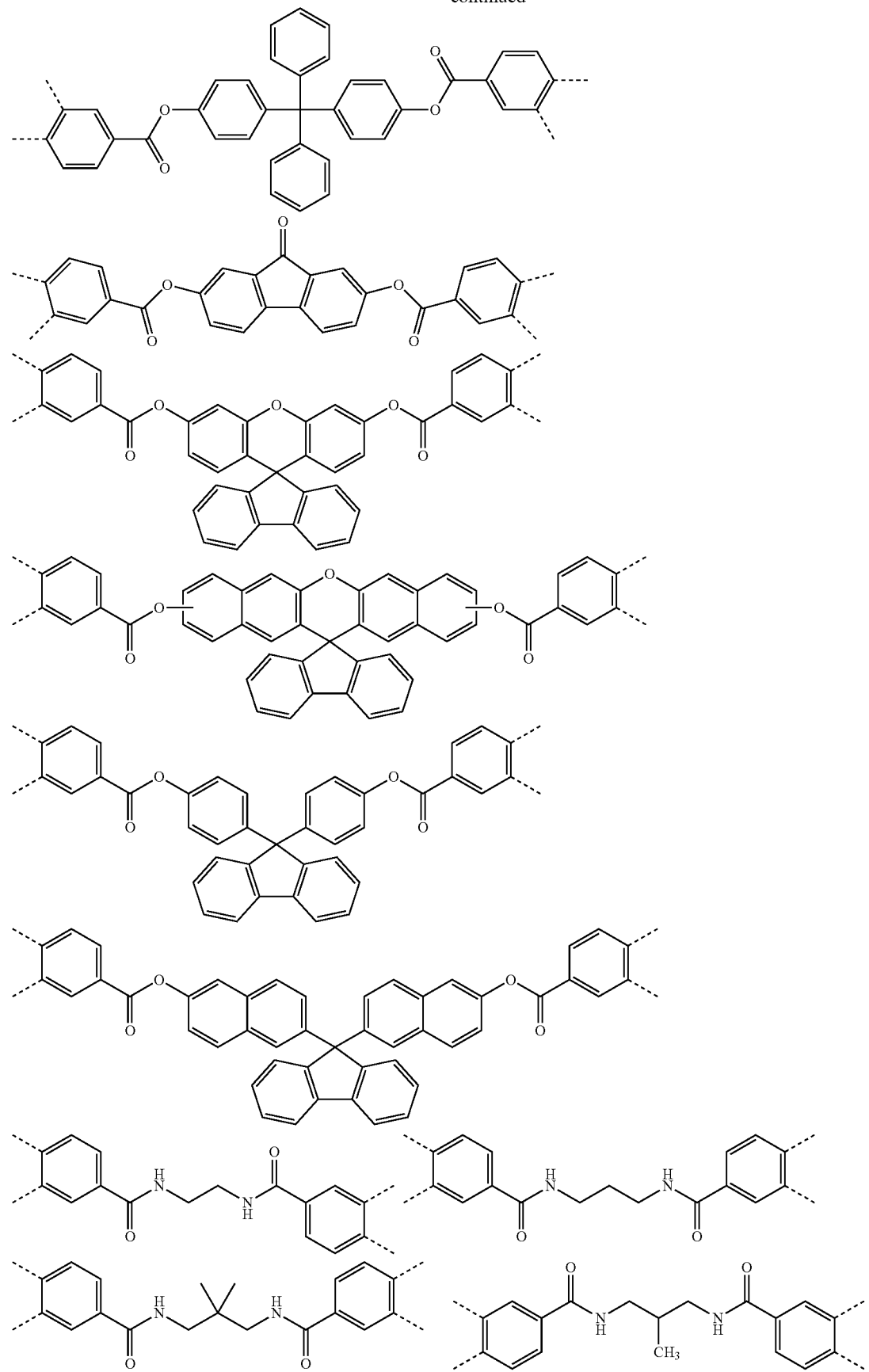

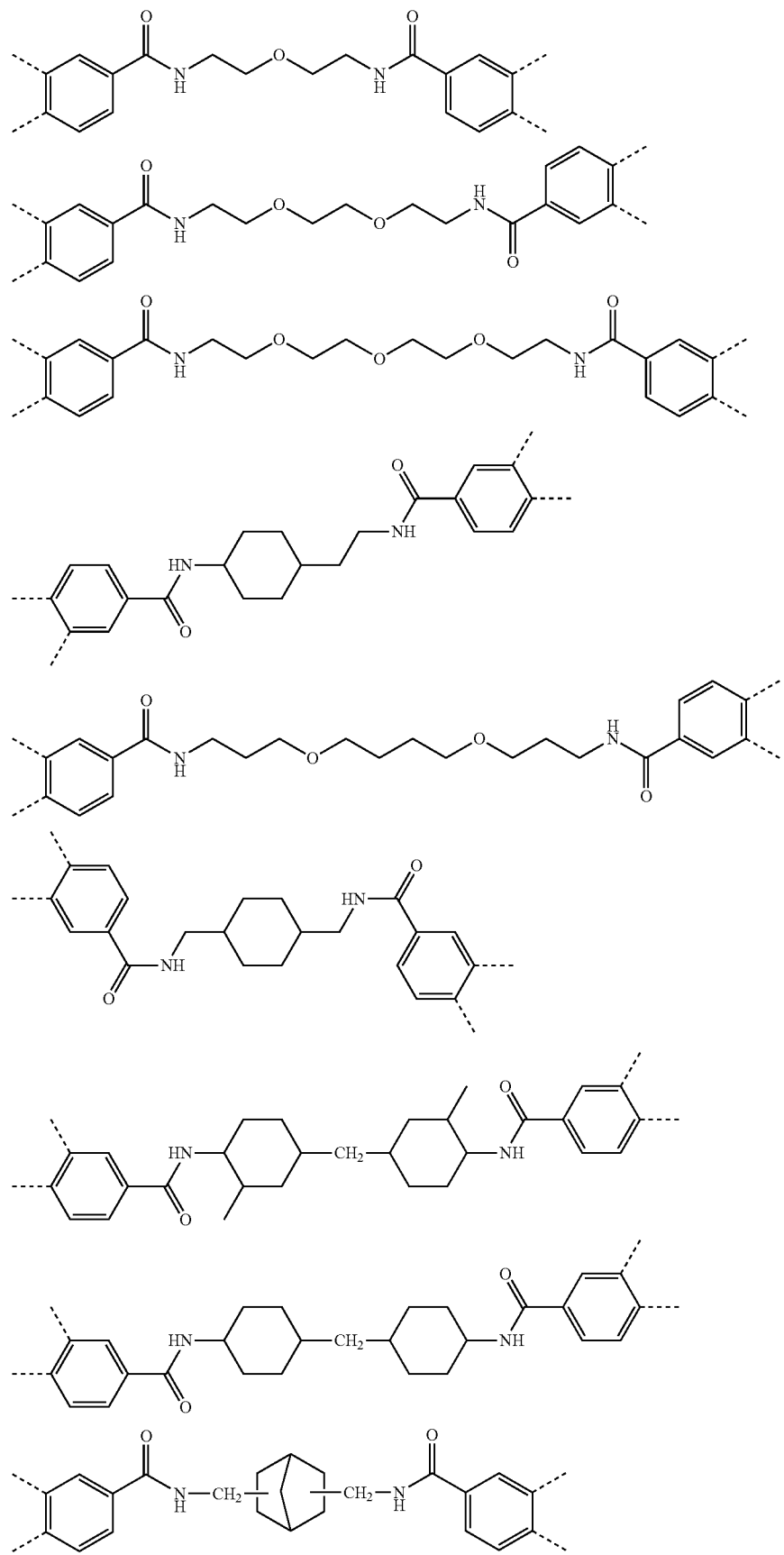

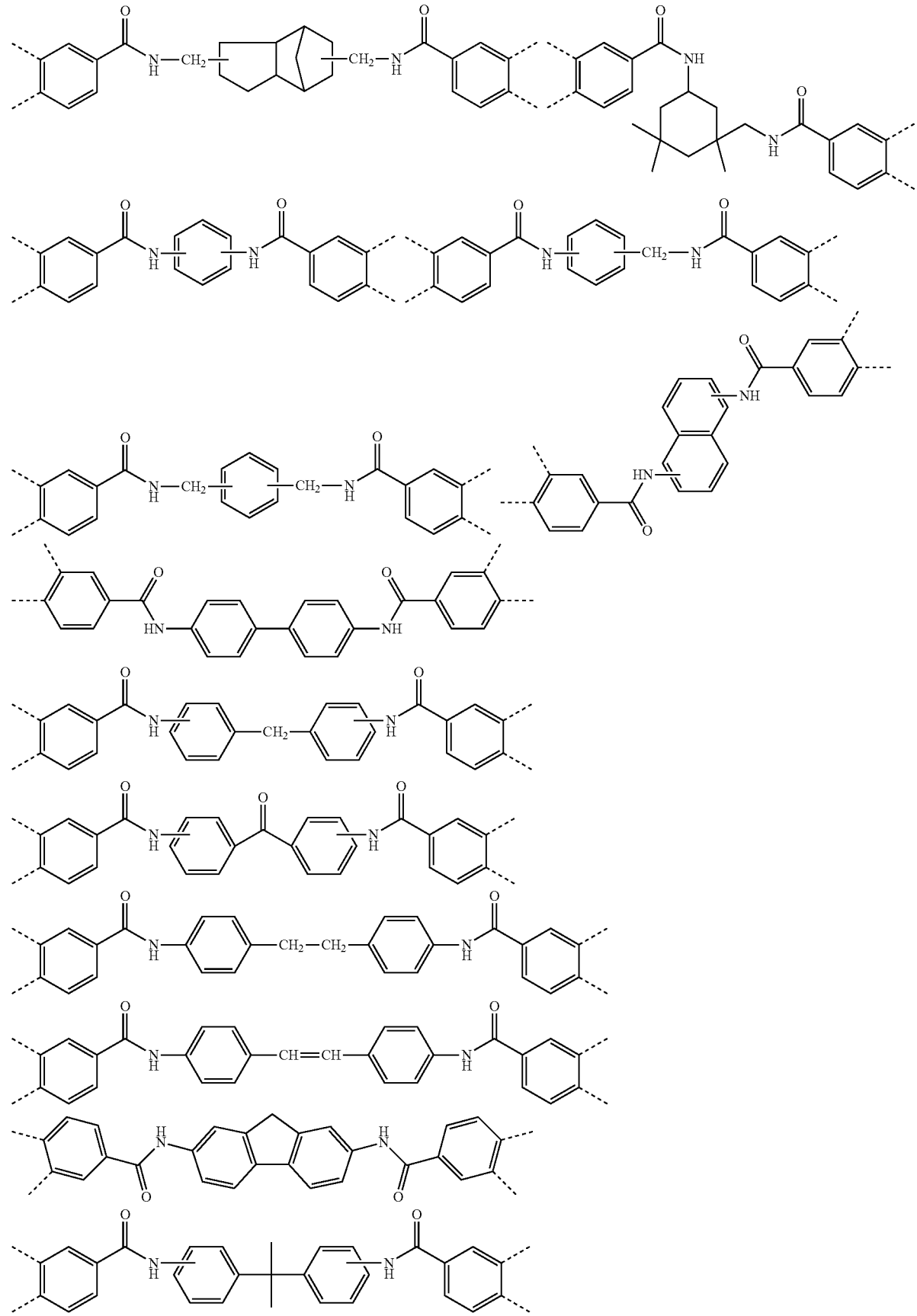

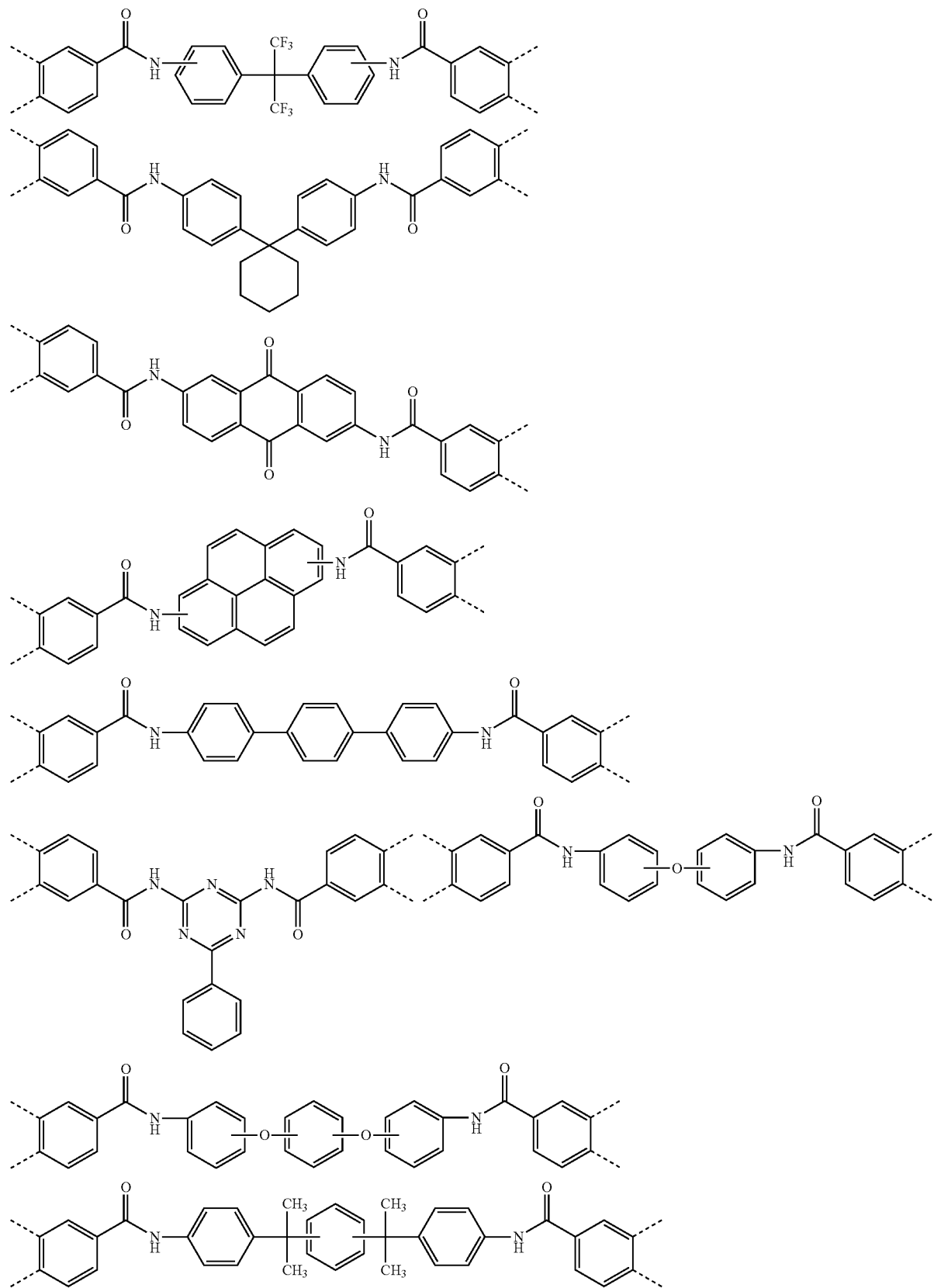

-continued

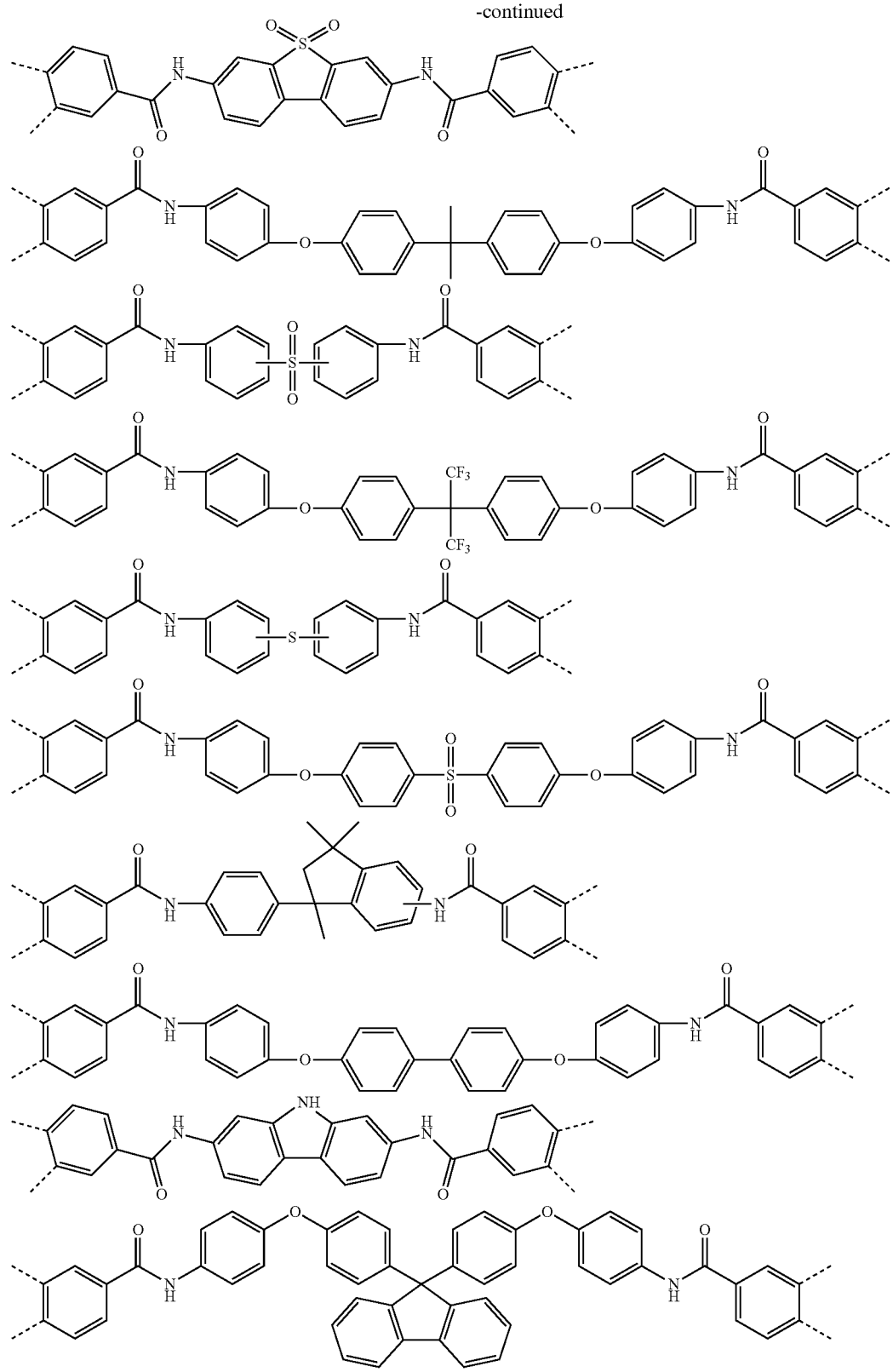

As $W_2$ in the above general formula, there may be exemplified by the following structural formulae, and a substituent(s) may be present on these aromatic rings. Also, as the substituent, there may be exemplified by a hydroxyl group, a trifluoromethyl group, an alkyl group having 1 to 10 carbon atoms, an alkynyl group or an alkenyl group having 3 to 10 carbon atoms, an alkyloxy group having 1 to 10 carbon atoms, an alkynyloxy group or an alkenyloxy group having 3 to 10 carbon atoms, an aryl group having 6 to 10 carbon atoms, a thiol group, a nitro group, a halogen group, a nitrile group, a sulfonate group, an alkoxycarbonyl group having 1 to 10 carbon atoms and an alkanoyloxy group having 1 to 10 carbon atoms.
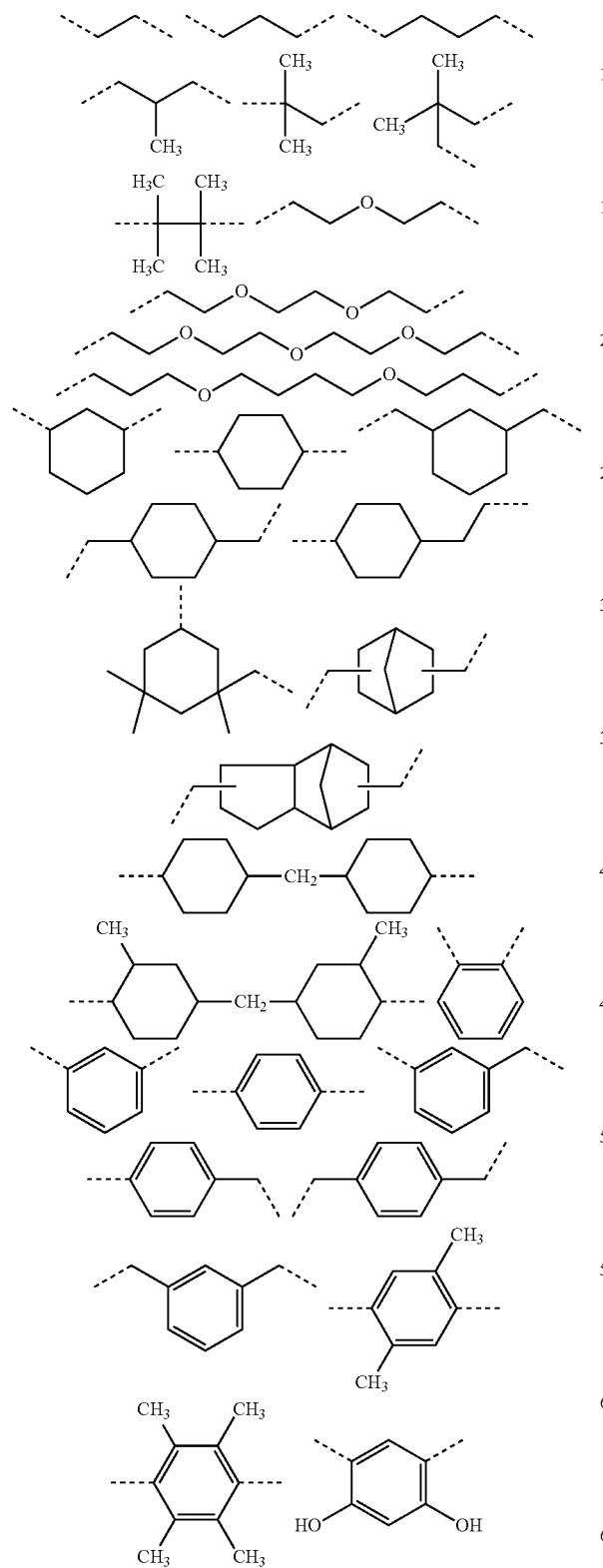
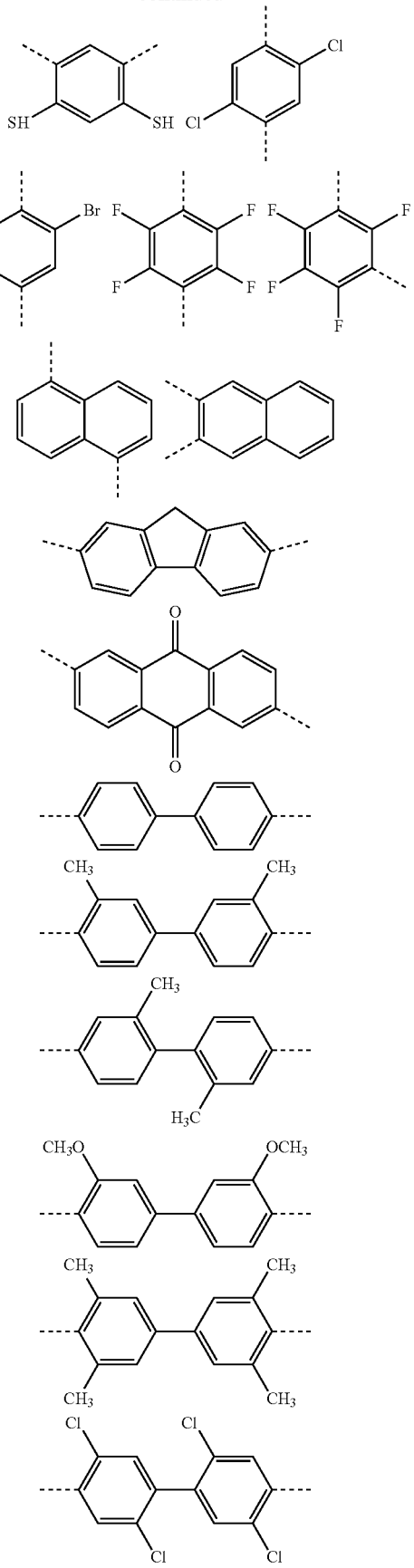
-continued

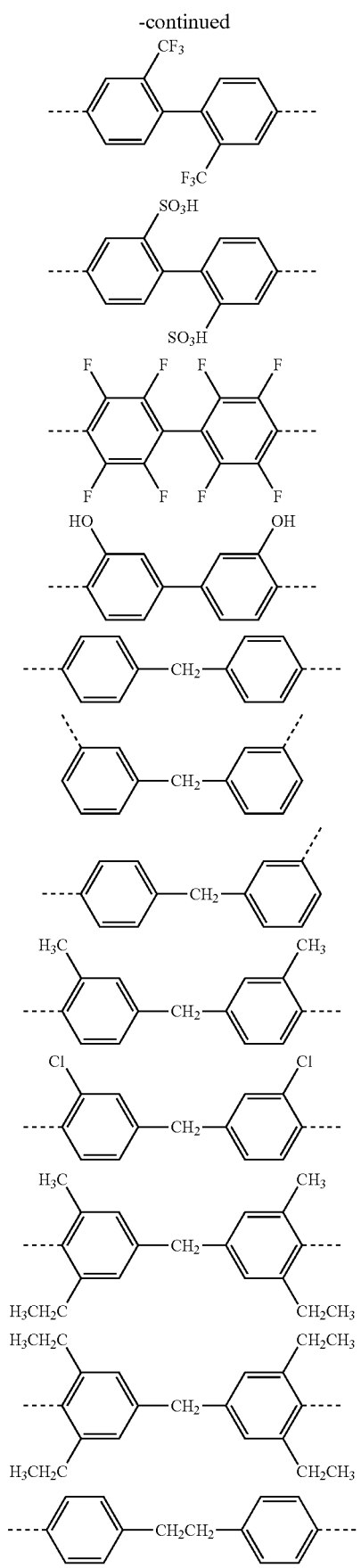
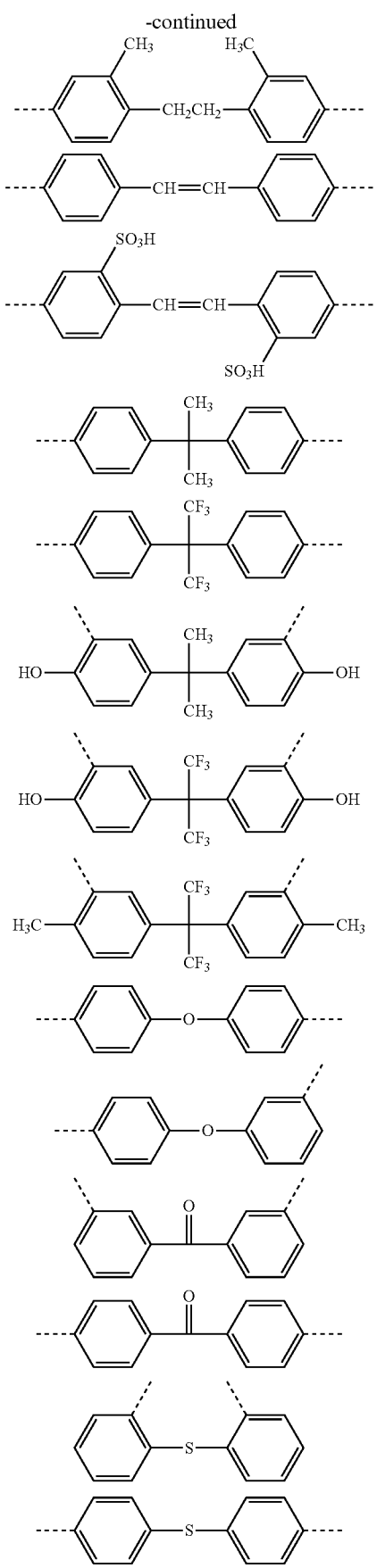

-continued
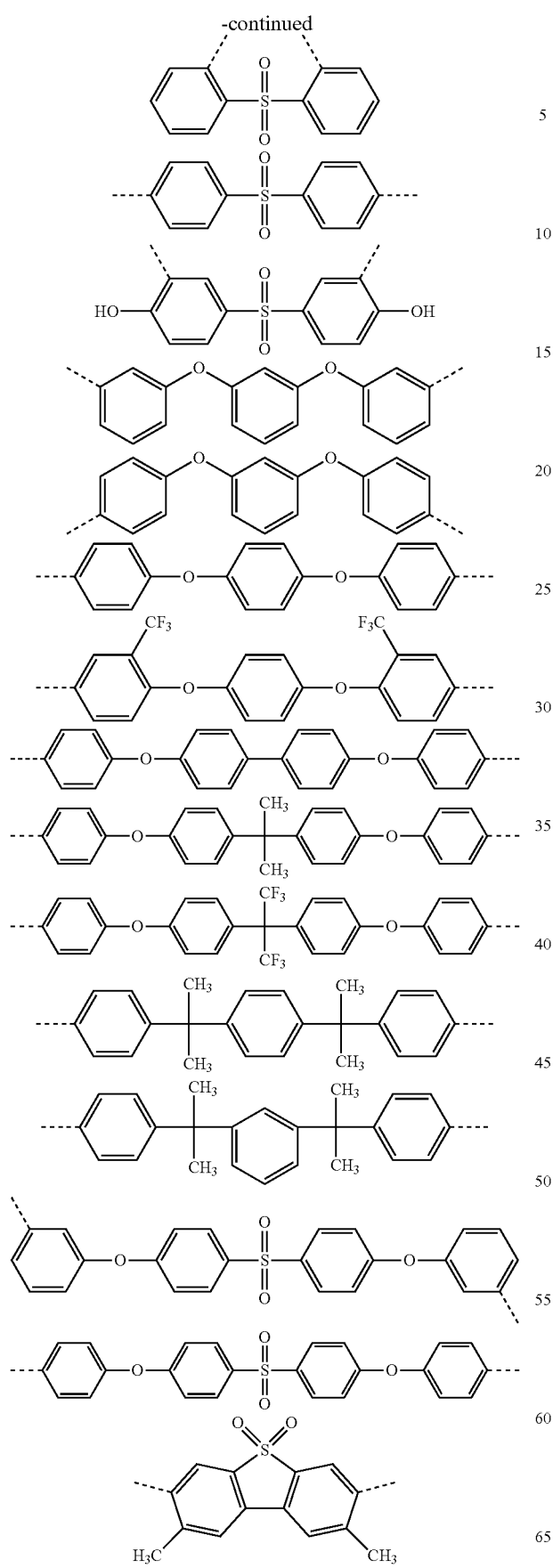
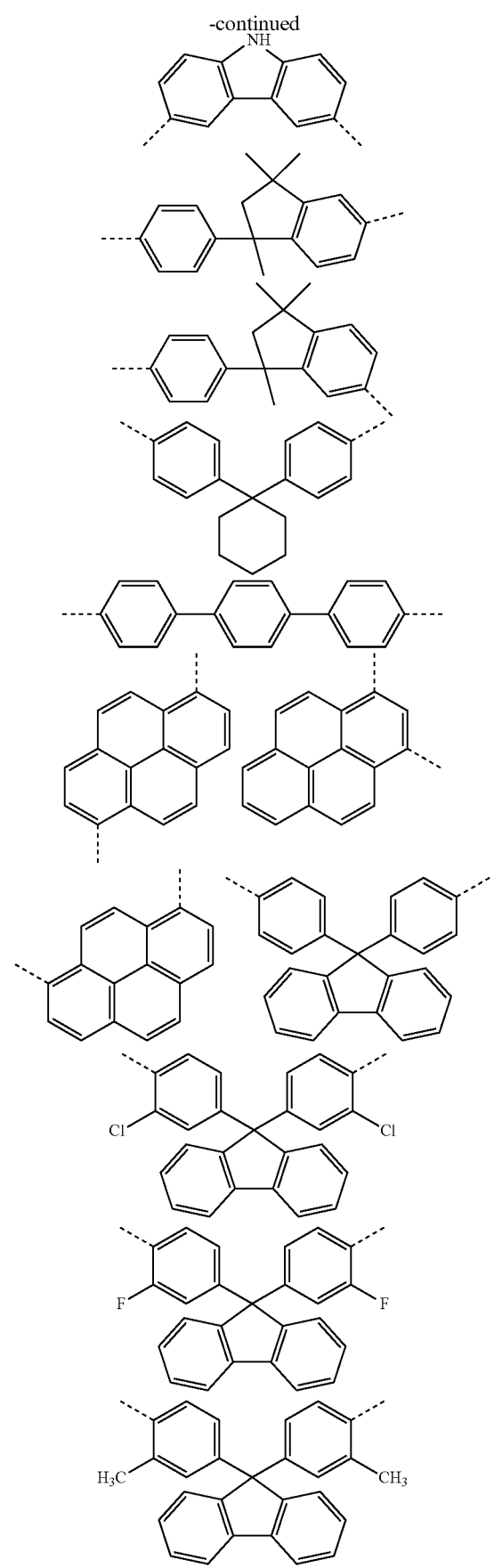

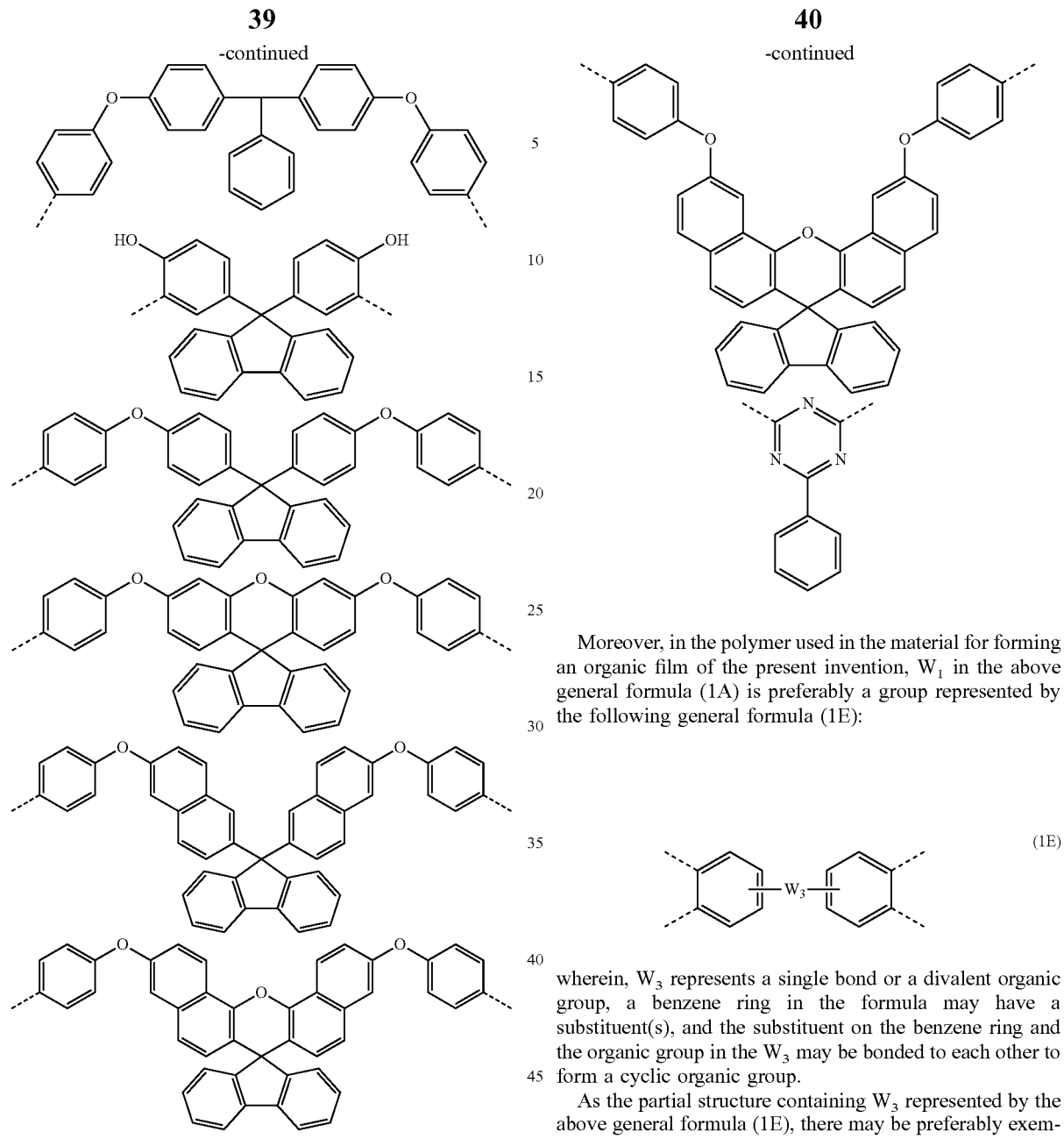

Moreover, in the polymer used in the material for forming an organic film of the present invention, $W_1$ in the above general formula (1A) is preferably a group represented by the following general formula (1E):

(1E)

wherein, $W_3$ represents a single bond or a divalent organic group, a benzene ring in the formula may have a substituent(s), and the substituent on the benzene ring and the organic group in the $W_3$ may be bonded to each other to form a cyclic organic group.

As the partial structure containing $W_3$ represented by the above general formula (1E), there may be preferably exemplified by the following formulae.

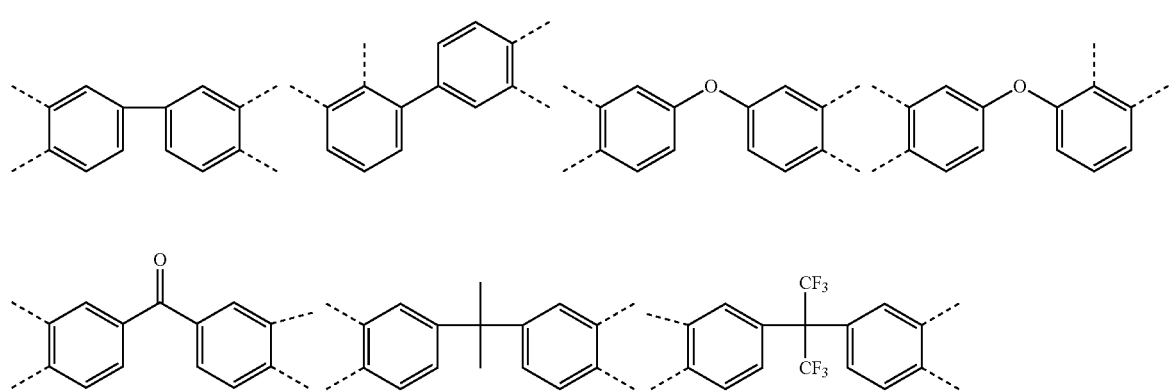

-continued
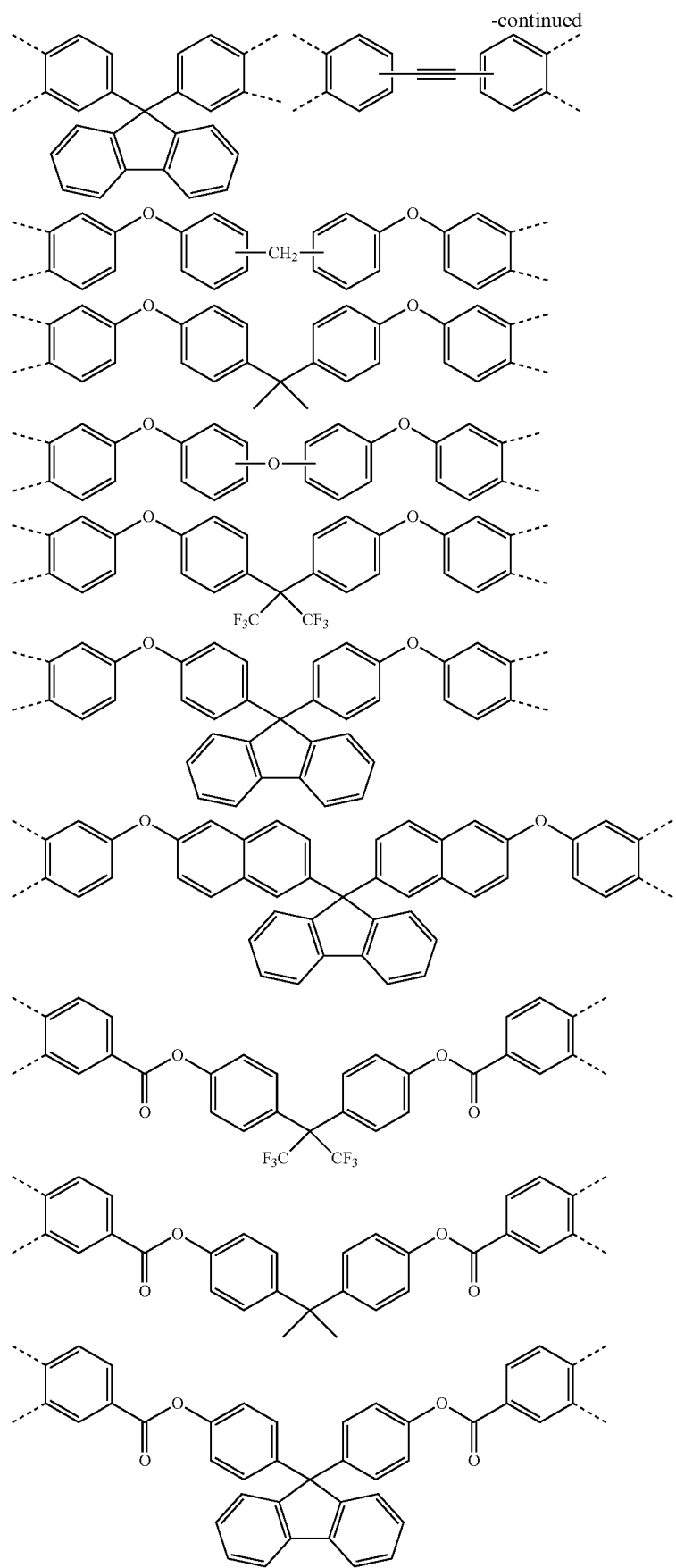

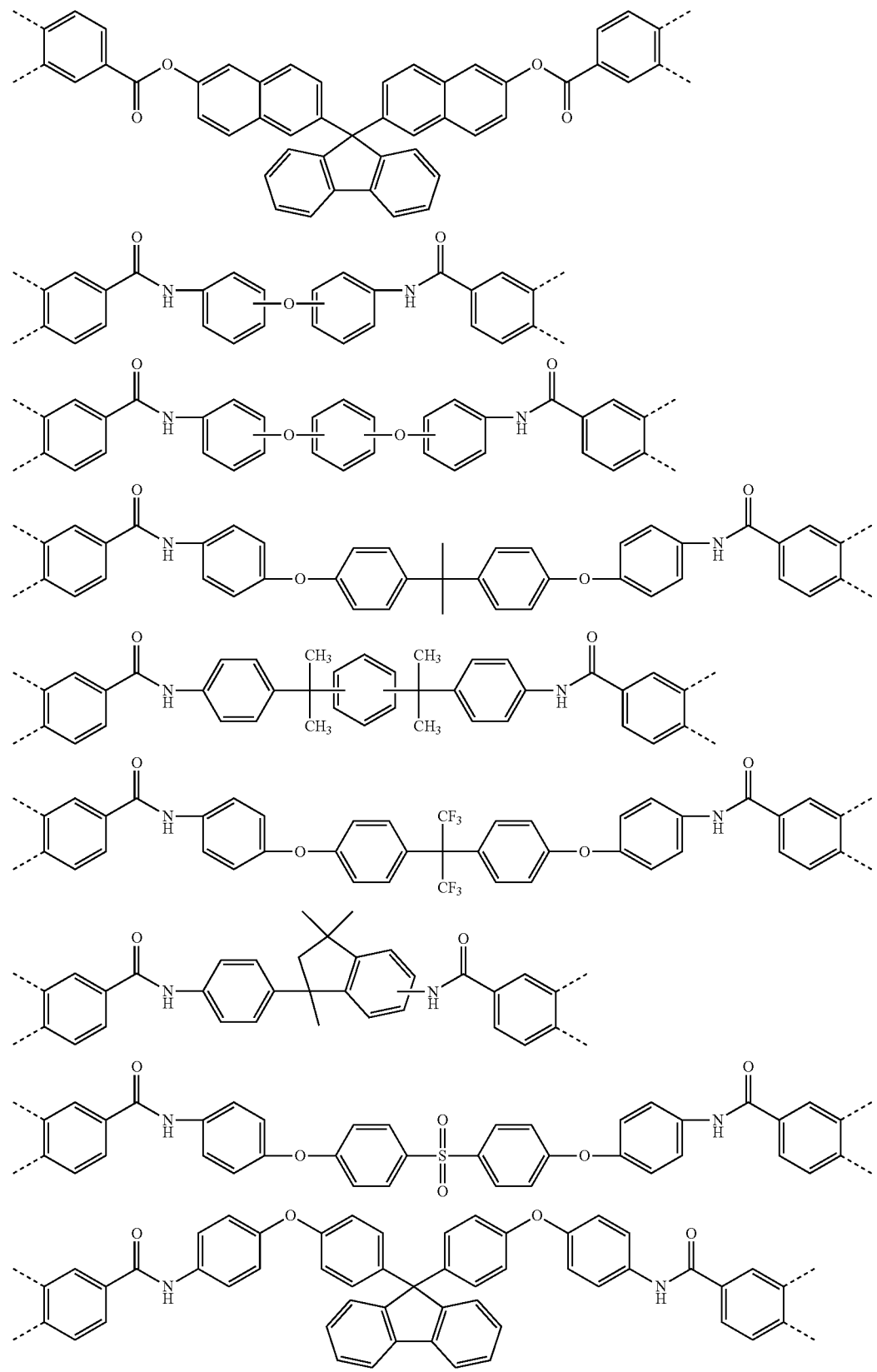

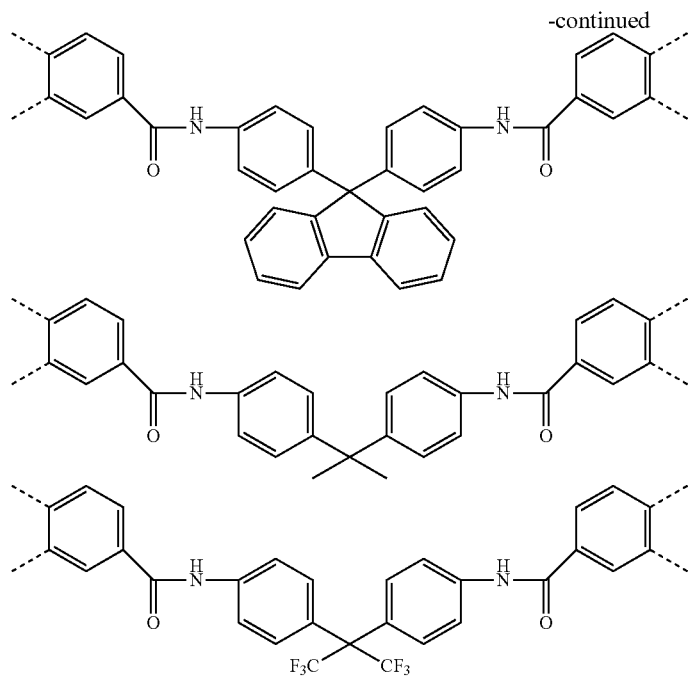

Further, in the polymer used in the material for forming an organic film of the present invention, $W_1$ in the above general formula (1A) is preferably any of the groups represented by the following formula (1F). Among these, preferable are those having one or more of a hexafluoroisoproylidene group, an ether bond, a fluorene structure and an indane structure from the viewpoint of providing solvent solubility and fluidity:

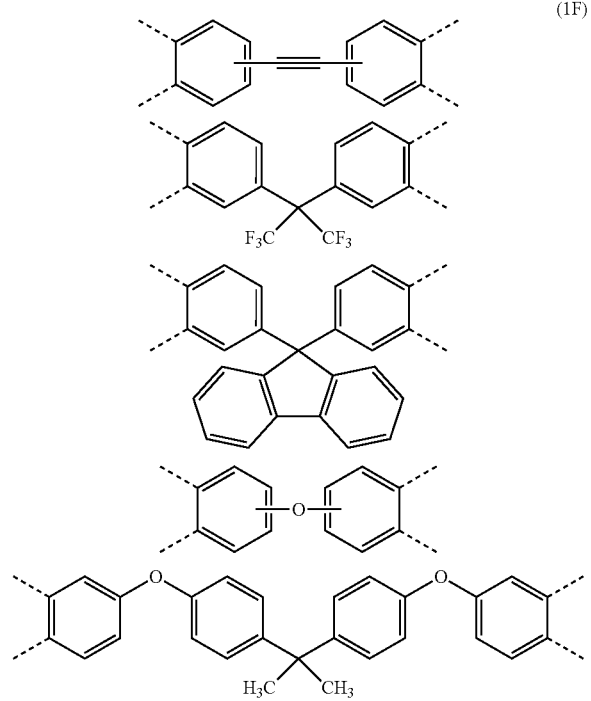

(1F)

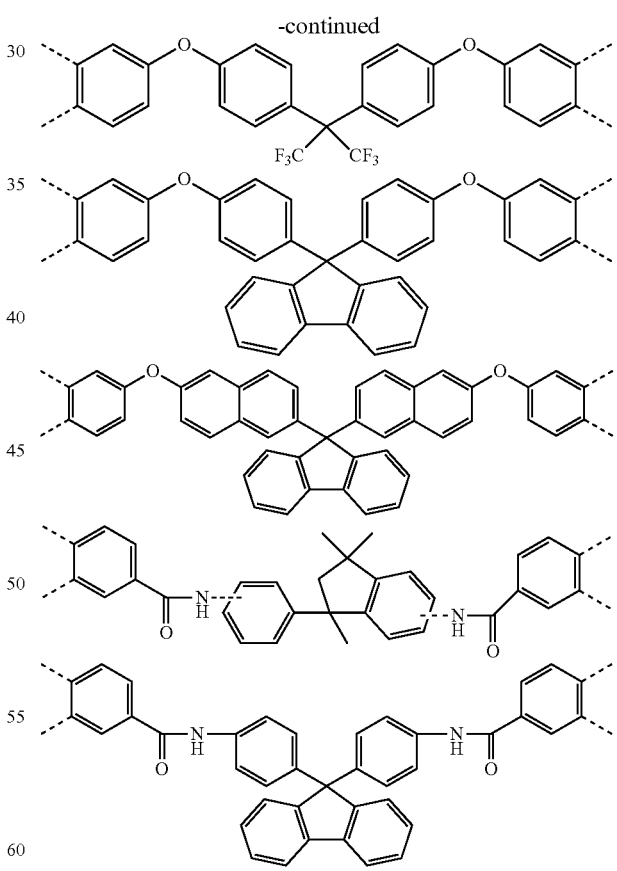

wherein, a substituent(s) may be present on an aromatic ring in the above formula.

Among the above, as a linking group of a main chain, a structure having a hexafluoroisoproylidene group, a structure having an ether bond, and a structure having a fluorene structure are particularly preferable. The ether bond functions as a flexible linking group, and it is possible to provide thermal fluidity and solvent solubility. Similarly, the hexafluoroisoproylidene group and the fluorene structure suppress agglomeration between imide groups by introducing bendability into a main chain, thereby similar effects to the ether bond can be obtained. Thus, both higher degrees embedding/flattening characteristics and heat resistance can be provided.

Further, in the polymer used in the material for forming an organic film of the present invention, $W_2$ in the general formula (1A) is preferably a group represented by the following general formula (1G):

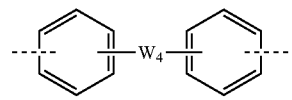

(1G)

wherein, $W_4$ represents a single bond or a divalent organic group, a benzene ring in the formula may have a substituent(s), and the substituent on the benzene ring and the organic group in the $W_4$ may be bonded to each other to form a cyclic organic group.

As the partial structure containing $W_4$ represented by the above general formula (1G), the following formulae may be preferably exemplified.

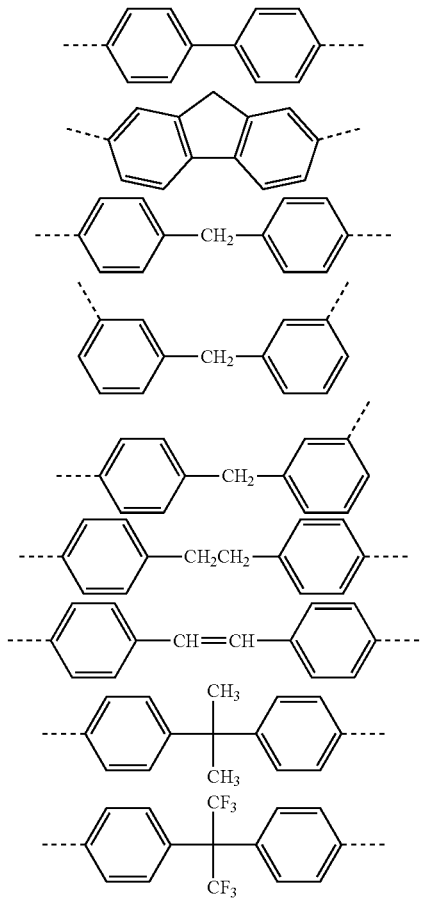

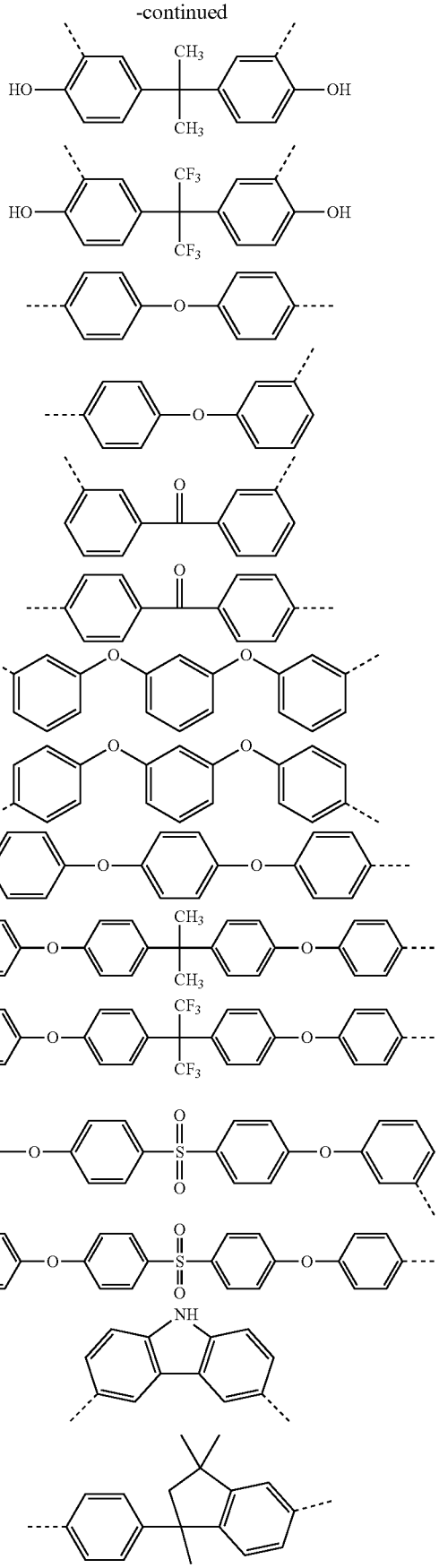

-continued
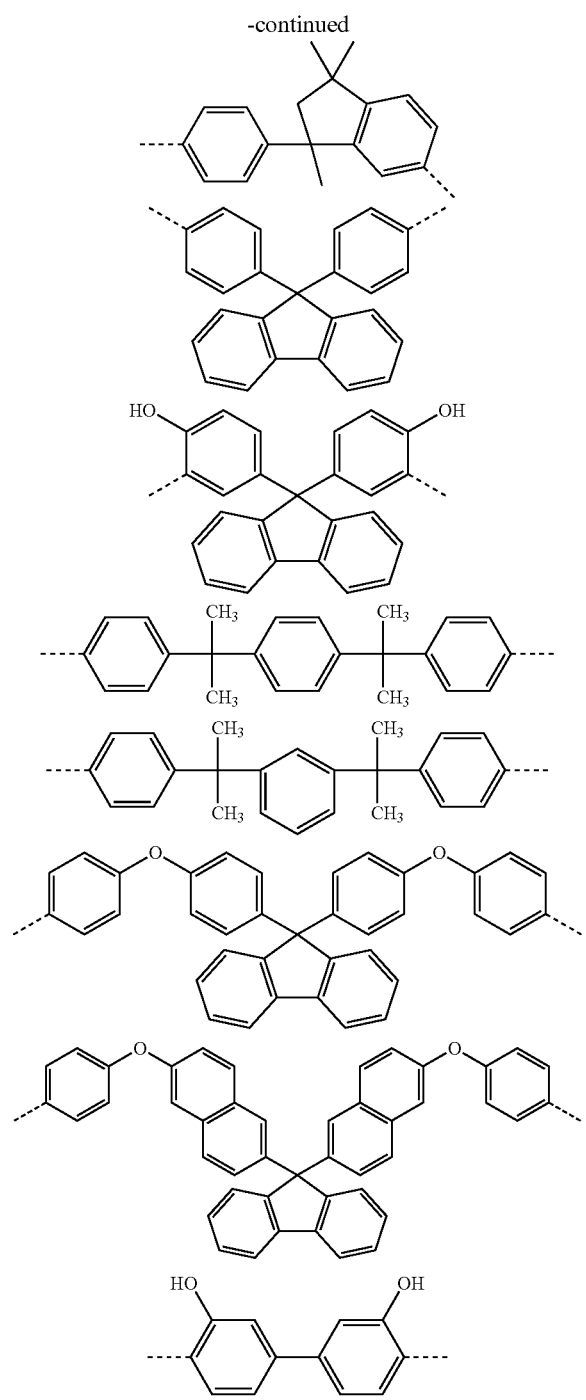
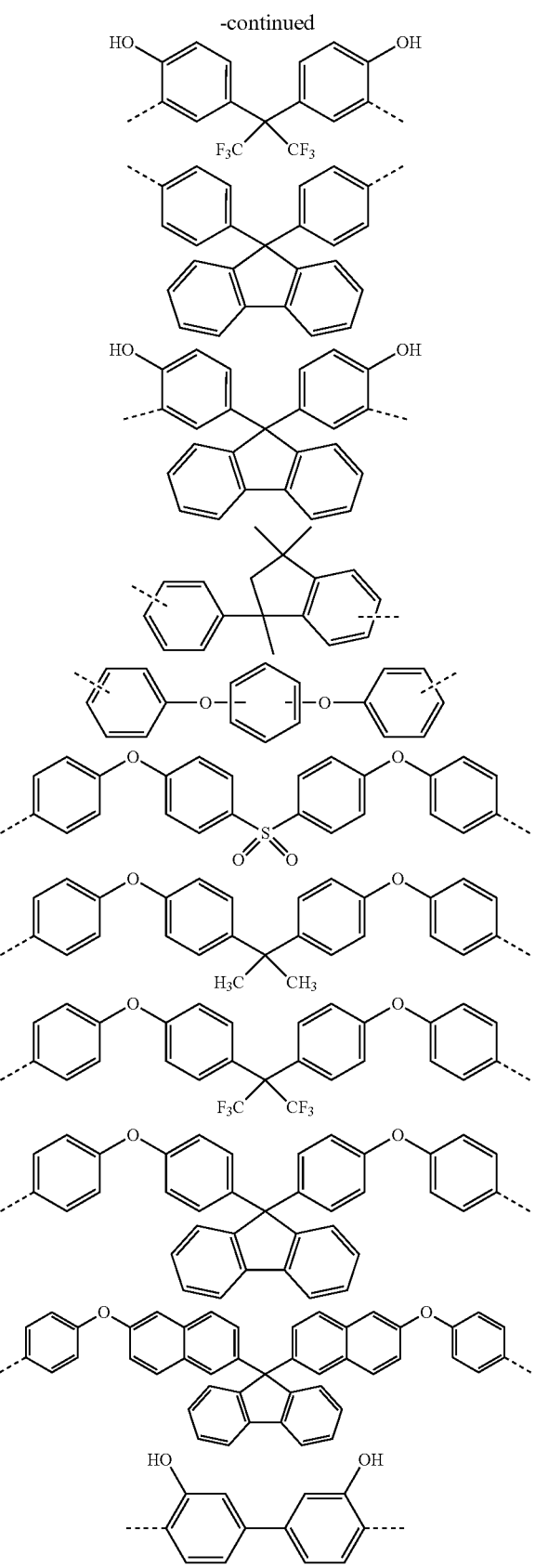
In addition, in the polymer used in the material for forming an organic film of the present invention, $W_2$ in the above general formula (1A) is preferably any of the groups represented by the following formula (1H):
(1H)
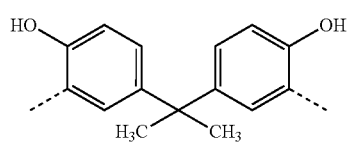
wherein, a substituent(s) may be present on an aromatic ring in the formulae.

Among the above, as a linking group of a main chain, a structure having an ether bond, a fluorene structure, an indane structure and a structure having a hexafluoroisoproylidene group are particularly preferable. The ether bond functions as a flexible linking group, and it is possible to provide thermal fluidity and solvent solubility. Likewise, the indane structure, the fluorene structure, and the structure having a hexafluoroisoproylidene group suppress agglomeration between imide groups by introducing bendability into a main chain, thereby similar effects to the ether bond can be obtained. Thus, both high degrees embedding/flattening characteristics and heat resistance can be provided.

Further, in the polymer used in the material for forming an organic film of the present invention, it is preferable that $W_1$ in the general formula (1A) represents one or more of the groups represented by the formula (1F), and $W_2$ in the general formula (1A) represents one or more of the groups represented by the formula (1H).

By combining the above organic groups for $W_1$ and $W_2$, thermal fluidity, heat resistance and adhesiveness can be made better.

Further, the Mw (weight average molecular weight) of the above polymer is preferably 1,000 to 10,000, and more preferably 1,000 to 8,000.

When the polymer has such a molecular weight, solubility to an organic solvent can be ensured, and sublimates generated upon baking can be suppressed. Also, since thermal fluidity of the polymer (polymer for forming an organic film) of the component (A) becomes good, when it is formulated into the material for forming an organic film, not only a fine structure formed on a substrate can be favorably embedded but also an organic film capable of flattening the entire substrate can be formed.

[Method for Manufacturing Polymer (A)]

As a means for obtaining a polymer used in the material for an organic film of the present invention, there may be mentioned that either of the following diamine and tetracarboxylic anhydride is charged in excess to obtain a polyamic acid intermediate having an amino group or a carboxylic anhydride active terminal at a terminal (STEP 1). Subsequently, after a polyimide precursor is synthesized by a phthalic anhydride derivative or an aniline derivative having $R_1$ as a substituent as a terminal sealing agent (STEP 2), a thermal or chemical imidation (STEP 3) is further carried out to synthesize a polymer of a component (A). The diamine compound or the tetracarboxylic anhydride used in synthesizing the polyamic acid compound of STEP 1, and the phthalic anhydride derivative or the aniline derivative used in sealing the terminal in STEP 2 can be used singly or in combination of two or more kinds. These can be appropriately selected and combined according to properties required. $W_1$, $W_2$ and $R_1$ in the following formula have the same meanings as before.

(Condition for Charging Diamine in Excess)

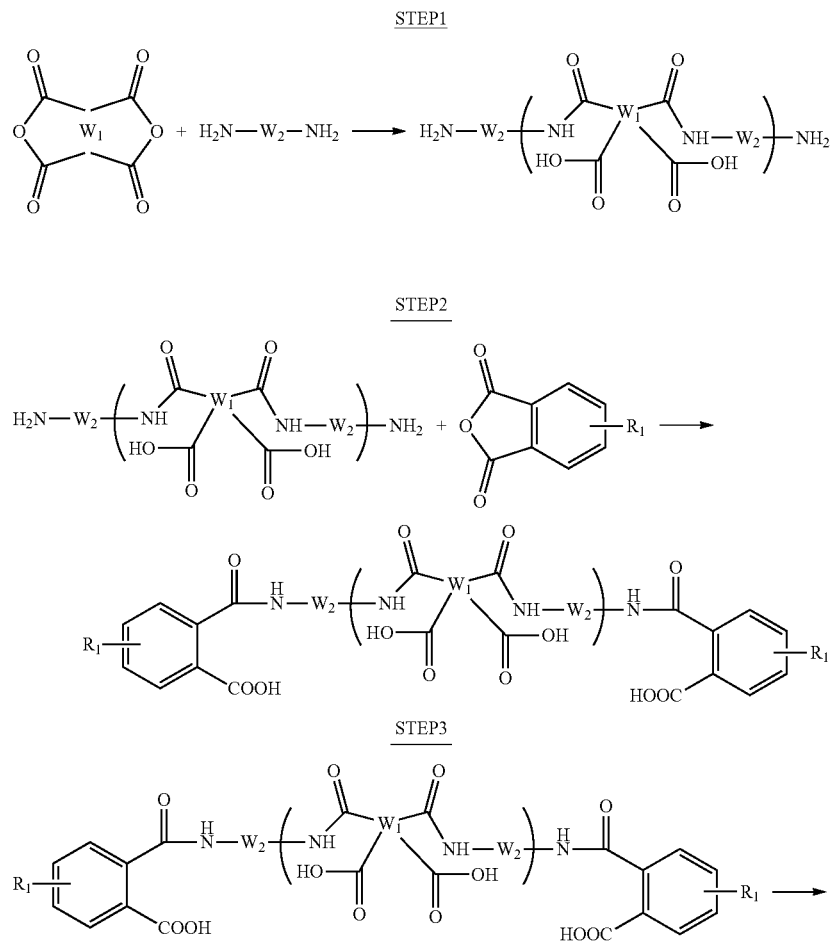

-continued

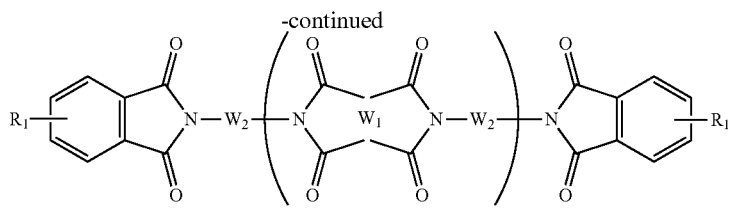

10

(Condition for Charging Tetracarboxylic Acid in Excess)

STEP1

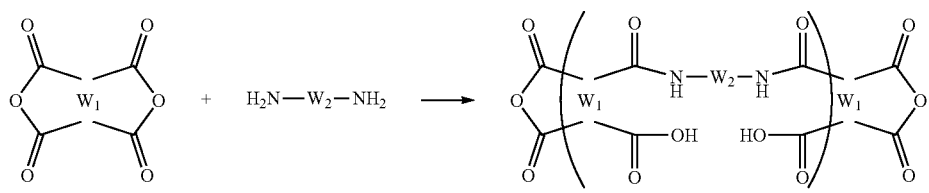

STEP2

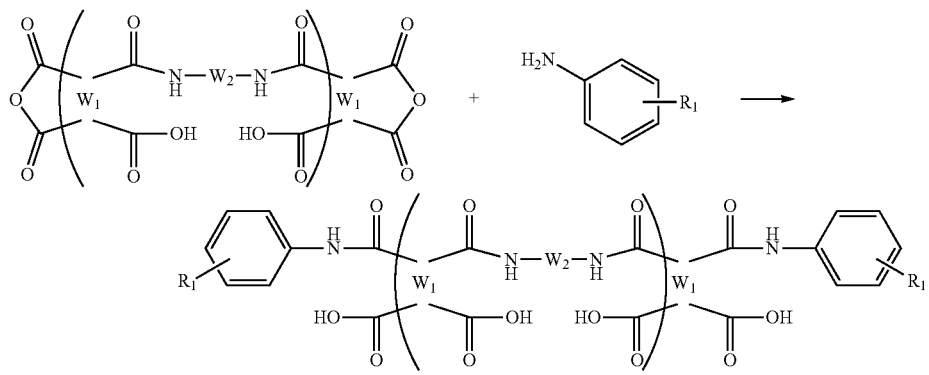

STEP3

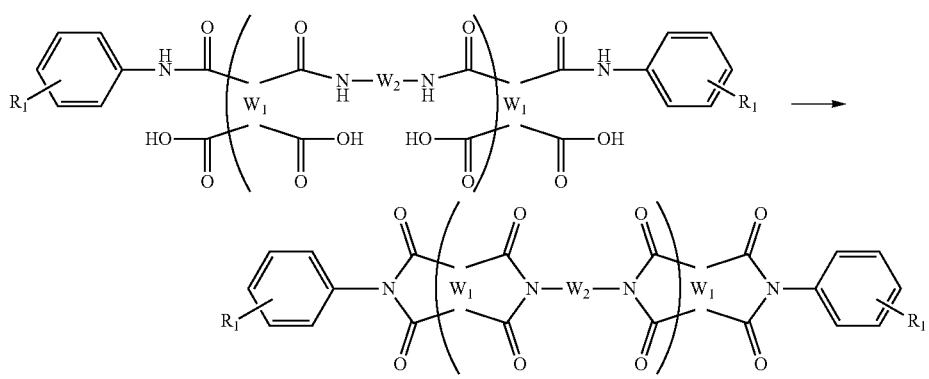

Synthesis of the polyamic acid intermediate shown in STEP 1 can be carried out normally in an organic solvent at room temperature, or as required, under cooling or heating. As the solvent to be used, there may be exemplified by an alcohol such as methanol, ethanol, isopropyl alcohol, butanol, ethylene glycol, propylene glycol, diethylene glycol, glycerol, ethylene glycol monomethyl ether, propylene glycol monomethyl ether and propylene glycol monoethyl ether, an ether such as diethyl ether, dibutyl ether, diethylene glycol diethyl ether, diethylene glycol dimethyl ether, tetrahydrofuran and 1,4-dioxane, a chlorinated solvent such as methylene chloride, chloroform, dichloroethane, and trichloroethylene, a hydrocarbon such as hexane, heptane, benzene, toluene, xylene and cumene, a nitrile such as acetonitrile, a ketone such as acetone, ethyl methyl ketone, isobutyl methyl ketone and cyclohexanone, an ester such as methyl acetate, ethyl acetate, n-butyl acetate, propylene glycol methyl ether acetate and γ-butyrolactone, and an aprotic polar solvent such as N-methyl-2-pyrrolidone, N,N-dimethylacetamide, dimethylsulfoxide, N,N-dimethylformamide and hexamethylphosphoric triamide, and these can be used singly or in combination of two or more kinds.

For the syntheses of these, a base catalyst can be used as required, and examples of the base catalyst may be mentioned an inorganic base compound such as sodium hydrogen carbonate, sodium carbonate, potassium carbonate, calcium carbonate, cesium carbonate, sodium hydroxide, potassium hydroxide, sodium hydride and potassium phosphate, and an organic base such as triethylamine, diisopropylethylamine, N,N-dimethyl-aniline, pyridine and 4-dimethylaminopyridine, and these may be used singly or in combination of two or more kinds.

The reaction method includes: a method in which the diamine compound and the tetracarboxylic anhydride are charged into the solvent at once; a method of charging a dispersed or dissolved diamine compound and tetracarboxylic anhydride separately or mixed by adding dropwise; a method in which either the diamine compound or the tetracarboxylic anhydride is dispersed or dissolved in the solvent, then the other dispersed or dissolved in the solvent is added dropwise to charge; and the like. Furthermore, when multiple diamine compounds and tetracarboxylic anhydrides are each charged, they can be mixed for reaction beforehand, or they can be made to react individually in succession. When a catalyst is used, methods include: a method in which the diamine compound or the tetracarboxylic anhydride is charged at once; a method in which the catalyst is dispersed or dissolved beforehand, then dropwise addition is performed; and the like. It is possible to adjust the ratio of charging the diamine compound and tetracarboxylic anhydride with an optional ratio so that the product has a desired Mw range. For example, when the aniline derivative is used as the terminal sealing agent in the following process, the tetracarboxylic anhydride may be used in excess relative to the diamine compound, and when the phthalic anhydride is used as the terminal sealing agent, the diamine compound may be used in excess relative to the tetracarboxylic anhydride whereby the polyamide intermediate can be synthesized. The obtained polyamic acid intermediate reaction solution may proceed successively to the terminal sealing reaction of STEP 2. Furthermore, in order to remove unreacted raw materials present in the system as a reaction intermediate, the catalyst, and so on, the obtained polyamic acid intermediate reaction solution may be diluted with an organic solvent, then subjected to liquid separation and washing and thus collected as a powder through crystallization with poor solvent.

The terminal sealing process of STEP 2 allows the above reaction solution of the polyamic acid intermediate (when it was collected in the form of a powder, after preparing a solution beforehand) to react with a terminal sealing agent. The reaction solvent and the reaction catalyst used may be the same as in the polyamic acid intermediate of STEP 1. The reaction method can be the same as in STEP 1 except for using the polyamic acid intermediate and the aniline derivative or phthalic anhydride as the terminal sealing agent as the substrates in place of the diamine compound and the tetracarboxylic anhydride. The obtained polyimide precursor reaction solution may proceed successively to the imidation reaction of STEP 3. Furthermore, in order to remove unreacted raw materials present in the system as a reaction intermediate, the catalyst, and so on, the obtained polyimide precursor reaction solution may be diluted with an organic solvent, then subjected to liquid separation and washing and thus collected as a powder through crystallization with poor solvent.

The imidation process shown by STEP 3 can be carried out by thermal or chemical imidation. These methods can be appropriately selected according to thermal stability of the crosslinking group of the target imide compound and reactivity between the introduced substituent and the reagent to be used during the chemical imidation.

When the thermal imidation is carried out, a solvent which can be azeotrope with water is added to the reaction solution of the polyamic acid (when it was collected in the form of a powder, dissolved in a soluble solvent beforehand) obtained in STEP 2, the mixture is heated at 100° C. to 250° C., and imidation is carried out by dehydration ring closing reaction while removing the formed water.

As the solvent which can be azeotrope with water, there may be used an ester such as γ-butyrolactone, a polar solvent such as N-methyl-2-pyrrolidone, N,N-dimethylacetamide, dimethylsulfoxide and N,N-dimethylformamide, and a non-polar solvent such as benzene, toluene, xylene and mesitylene. These solvents are preferably used singly or mixed, and it is preferred that heating is carried out and dehydration is carried out while distilling off the water formed by ring-closure out of the system.

When the chemical imidation is carried out, a base catalyst and an acid anhydride as a dehydrating agent are added to the reaction solution of a polyimide precursor (when it was collected in the form of a powder, dissolved in a soluble solvent beforehand) obtained in STEP 2, and the mixture is heated for imidation.

As the base catalyst to be used in the chemical imidation, there may be mentioned pyridine, triethylamine, trimethylamine, tributylamine and trioctylamine, and among these, pyridine is preferable since it has a suitable basicity for proceeding the reaction. As the dehydrating agent, there may be mentioned acetic anhydride, trimellitic anhydride, pyromellitic anhydride, trifluoroacetic anhydride, polyphosphoric acid, phosphorus pentoxide, phosphorus pentachloride and thionyl chloride, and from the viewpoint of purification after the reaction, acetic anhydride is preferable. In addition, the base catalyst and the dehydrating agent may be used singly or in combination of two or more kinds, and the imidation ration thereof can be controlled appropriately according to the required performance of the target compound by adjusting the amount of the catalyst, the amount of the dehydrating agent, the reaction temperature, and the reaction time.

The solvent to be used at this time is not particularly limited as long as it is a solvent inactive to the above reaction, and there may be exemplified by an ether such as diethylene glycol diethyl ether, diethylene glycol dimethyl ether, tetrahydrofuran and 1,4-dioxane, a chlorinated solvent such as methylene chloride, chloroform, dichloroethane and trichloroethylene, a hydrocarbon such as hexane, heptane, benzene, toluene, xylene and cumene, a nitrile such as acetonitrile, a ketone such as acetone, ethyl methyl ketone, isobutyl methyl ketone and cyclohexanone, an ester such as methyl acetate, ethyl acetate, n-butyl acetate, propylene glycol methyl ether acetate and γ-butyrolactone, and an aprotic polar solvent such as N-methyl-2-pyrrolidone, N,N-dimethylacetamide, dimethylsulfoxide, N,N-dimethylformamide and hexamethylphosphoric triamide, and these can be used singly or in admixture.

After completion of the reaction, the product may be used as a material for forming an organic film as such, but for removing the unreacted raw material(s) and the catalyst existing in the system, it may be diluted with an organic solvent and collected by subjecting to liquid separation and washing.

The organic solvent used in liquid separation and washing is not particularly limited as long as the solvent can dissolve the compound and cause two-layer separation when the solvent is mixed with water, and there may be mentioned a hydrocarbon such as hexane, heptane, benzene, toluene and xylene, an ester such as ethyl acetate, n-butyl acetate and propylene glycol methyl ether acetate, a ketone such as methyl ethyl ketone, methyl amyl ketone, cyclohexanone and methyl isobutyl ketone, an ether such as diethyl ether, diisopropyl ether, methyl-tert-butyl ether and ethyl-cyclopentyl methyl ether, a chlorinated solvent such as methylene chloride, chloroform, dichloroethane and trichloroethylene, and a mixture thereof. The washing water used may normally be deionized water or the so-called ultrapure water. The number of times of washing may be one or more, but preferably about one to 5 times, since even if washing is carried out ten or more times, the full effect of washing is not always obtained.

In order to remove unreacted raw material(s) or acidic component(s) in the system at the time of liquid separation and washing, washing with a basic aqueous solution may be carried out. As the base, there may be mentioned an alkali metal hydroxide, an alkali metal carbonate, an alkaline earth metal hydroxide, an alkaline earth metal carbonate, ammonia and an organic ammonium.

Furthermore, in order to remove unreacted raw material(s), metal impurities or base component(s) in the system at the time of liquid separation and washing, washing with an acidic aqueous solution may be carried out. As the acid, there may be specifically mentioned an inorganic acid such as hydrochloric acid, hydrobromic acid, sulfuric acid, nitric acid, phosphoric acid, heteropoly acid, and an organic acid such as oxalic acid, fumaric acid, maleic acid, trifluoroacetic acid, methanesulfonic acid, benzenesulfonic acid p-toluenesulfonic acid and trifluoromethanesulfonic acid.

The above liquid separation and washing with a basic aqueous solution and an acidic aqueous solution may be carried out on either one of them, or may be carried out in combination. Liquid separation and washing are preferably carried out in the order of a basic aqueous solution and an acidic aqueous solution from the viewpoint of removing metal impurities.

After the liquid separation and washing with the above basic aqueous solution and the acid aqueous solution, washing with neutral water may be successively carried out. The number of times of washing may be one or more, and preferably about one to 5 times. As the neutral water, deionized water or ultrapure water as described above may be used. The number of times of washing may be one or more, but if the number of washings is small, the base component and the acidic component may not be removed in some cases. The number of times of washing is preferably about one to 5, since even if washing is carried out ten or more times, the full effect of washing is not always obtained.

Further, the reaction product after the operation of liquid separation can be collected as a powder by subjecting to concentration of the solvent to dryness under reduced pressure or normal pressure or an operation of crystallization, but for improving the operability when preparing the material for forming an organic film, it is also possible to make it in the state of a solution with an appropriate concentration. The concentration at this time is preferably from 0.1 to 50% by mass, and more preferably from 0.5 to 30% by mass. With such a concentration, it is possible to prevent the operability from being impaired since the viscosity is unlikely to increase, and it is economical since the amount of the solvent is not excessively large.

The solvent at this time is not particularly limited as long as it can dissolve the reaction product (a polymer of the component (A)), and specific examples thereof may be mentioned a ketone such as cyclohexanone and methyl-2-amyl ketone; an alcohol such as 3-methoxy butanol, 3-methyl-3-methoxy butanol, 1-methoxy-2-propanol and 1-ethoxy-2-propanol, an ether such as propylene glycol monomethyl ether, ethylene glycol monomethyl ether, propylene glycol monoethyl ether, ethylene glycol monoethyl ether, propylene glycol dimethyl ether and diethylene glycol dimethyl ether; and an ester such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate and propylene glycol mono-tert-butyl ether acetate, and these can be used singly or in combination of two or more kinds.

For the synthesis of the above polyimide, a diamine compound and tetracarboxylic anhydride derivative that constitute a main chain of a polymer, and a phthalic derivative and an aniline derivative used in sealing the terminal, can be combined in accordance with the required properties. Specifically, a substituent that contributes to improving solvent solubility, adhesiveness and embedding/flattening characteristics, and a substituent that contributes to improving etching resistance and film-forming property can be introduced in accordance with the desired required properties. Materials for forming an organic film using these polymers can achieve both high level of embedding/flattening characteristics and heat resistance.

As described above, the polymer of the component (A) is employed, it becomes a material providing a material for forming an organic film having heat resistance of 400° C. or higher and high degree embedding/flattening characteristics.

In the present invention, flattening characteristics refers to a property of flattening the surface of a substrate. When the material for forming an organic film of the present invention is employed, for example, as shown in FIG. 1, by coating a material for forming an organic film 3' on a substrate 1 and heating to form an organic film 3, it is possible to reduce the level difference of 100 nm of the substrate 1 to 30 nm or less. The shape of the level difference shown in FIG. 1 shows a typical example of the shape of the level difference of the substrate for manufacturing a semiconductor apparatus, and the shape of the level difference of the substrate capable of flattening by the material for forming an organic film of the present invention is, of course, not limited thereto.

<Material for Forming Organic Film>

The present invention provides a material for forming an organic film, which comprises (A) the above described polymer, and (B) an organic solvent. In the material for forming an organic film of the present invention, the above (A) polymer can be used singly or in combination of two or more kinds.

As the organic solvent that can be used in the material for forming an organic film of the present invention, it is not particularly limited as long as constitutional components contained in the material such as the above base polymer and the later-described acid generator, crosslinking agent, and other additives are dissolved. Specifically, the solvents described in the paragraphs (0091) to (0092) in JP 2007-199653A whose boiling point is less than 180° C. can be used. Among these, preferably used are propylene glycol monomethyl ether acetate, propylene glycol monomethyl ether, 2-heptanone, cyclopentanone, cyclohexanone and a mixture of two or more thereof.

Such a material for forming an organic film is employed, it can be coated by spin-coating, and contains (A) a polymer as described above, so that it becomes a material for forming an organic film having both heat resistance of 400° C. or higher and high degree embedding/flattening characteristics.

Further, in the material for forming an organic film of the present invention, as an organic solvent, it is possible to add a high-boiling point solvent whose boiling point is 180° C. or higher to the above solvent whose boiling point is less than 180° C. (a mixture of a solvent whose boiling point is less than 180° C. and a solvent whose boiling point is 180° C. or higher). The high boiling point organic solvent is not particularly limited to a hydrocarbon, an alcohol, a ketone, an ester, an ether or a chlorinated solvent as long as it can dissolve (A) a polymer, and specific example thereof may be exemplified by 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, n-nonyl acetate, ethylene glycol monohexyl ether, ethylene glycol mono-2-ethylhexyl ether, ethylene glycol monophenyl ether, ethylene glycol monobenzyl ether, diethylene glycol monoethyl ether, diethylene glycol monoisopropyl ether, diethylene glycol mono-n-butyl ether, diethylene glycol monoisobutyl ether, diethylene glycol monohexyl ether, diethylene glycol monophenyl ether, diethylene glycol monobenzyl ether, diethylene glycol diethyl ether, diethylene glycol dibutyl ether, diethylene glycol butyl methyl ether, triethylene glycol dimethyl ether, triethylene glycol monomethyl ether, triethylene glycol-n-butyl ether, triethylene glycol butyl methyl ether, triethylene glycol diacetate, tetraethylene glycol dimethyl ether, dipropylene glycol monomethyl ether, dipropylene glycol mono-n-propyl ether, dipropylene glycol mono-n-butyl ether, tripropylene glycol dimethyl ether, tripropylene glycol monomethyl ether, tripropylene glycol mono-n-propyl ether, tripropylene glycol mono-n-butyl ether, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, triacetin, propylene glycol diacetate, dipropylene glycol monomethyl ether acetate, dipropylene glycol methyl-n-propyl ether, dipropylene glycol methyl ether acetate, 1,4-butanediol diacetate, 1,3-butylene glycol diacetate, 1,6-hexanediol diacetate, triethylene glycol diacetate, γ-butyrolactone, dihexyl malonate, diethyl succinate, dipropyl succinate, dibutyl succinate, dihexyl succinate, dimethyl adipate, diethyl adipate and dibutyl adipate, and these may be used singly or in admixture.

The boiling point of the above high-boiling point solvent may be appropriately selected according to the temperature at which the material for forming an organic film is heat-treated, and the boiling point of the high-boiling point solvent added is preferably 180° C. to 300° C., and more preferably 200° C. to 300° C. If such a boiling point is selected, there is no fear that volatilization at the time of baking (heat-treatment) is too fast due to too low boiling point, so that sufficient thermal fluidity can be obtained. In addition, if such a high boiling point is selected, there is no possibility to remain in the film without volatilization after baking due to high boiling point, so that there is no fear of causing harmful effects on film properties such as etching resistance.

Also, when the above high-boiling point solvent is used, the amount to be blended of the high-boiling point solvent is preferably 1 to 30 parts by mass relative to 100 parts by mass of the solvent having a boiling point of less than 180° C. If such an amount to be blended is employed, there is no possibility of failing to provide sufficient thermal fluidity upon baking from too small amount to be blended or no fear of causing degradation of film properties such as etching resistance due to a residual material in the film from too large amount to be blended.

Such a material for forming an organic film is employed, thermal fluidity is provided due to addition of the high-boiling point solvent to the above (A) polymer, so that it becomes a material for forming an organic film having both of higher degree embedding/-flattening characteristics.

In the material for forming an organic film of the present invention, (C) an acid generator can be added to further promote curing reaction. As the acid generator, there is an acid generator that forms an acid by thermal decomposition or forms an acid by light exposure, and either of these can be added. Specifically, those disclosed in the paragraphs (0061) to (0085) of JP 2007-199653A can be added, but it is not limited thereto.

The above acid generators can be used singly or in combination of two or more kinds. The amount of the acid generator to be added is preferably 0.05 to 50 parts relative to 100 parts of (A) the polymer, and more preferably 0.1 to 10 parts.

To the material for forming an organic film of the present invention, (D) a surfactant can be added to improve coatability in spin coating. Such a surfactant used may be those, for example, disclosed in the paragraphs (0142) to (0147) of JP 2009-269953A.

In addition, to the material for forming an organic film of the present invention, (E) a crosslinking agent can be also added to improve curability and further suppress intermixing with an upper layer film. The crosslinking agent is not particularly limited, and known various kinds of crosslinking agents can be widely used. As an example thereof, there may be exemplified by a melamine-based crosslinking agent, a glycoluril-based crosslinking agent, a benzoguanamine-based crosslinking agent, a urea-based crosslinking agent, a β-hydroxyalkylamide-based crosslinking agent, an isocyanurate-based crosslinking agent, an aziridine-based crosslinking agent, an oxazoline-based crosslinking agent and an epoxy-based crosslinking agent.

As the melamine-based crosslinking agent, there may be specifically exemplified by hexamethoxy methylated melamine, hexabutoxy methylated melamine, alkoxy- and/or hydroxy-substituted derivatives thereof, and a partially self-condensed product thereof. As the glycoluril-based crosslinking agent, there may be specifically exemplified by tetramethoxy methylated glycoluril, tetrabutoxy methylated glycoluril, an alkoxy- and/or hydroxy-substituted derivatives thereof, and a partially self-condensed product thereof. As the benzoguanamine-based crosslinking agent, there may be specifically exemplified by tetramethoxy methylated benzoguanamine, tetrabutoxy methylated benzoguanamine, an alkoxy- and/or hydroxy-substituted derivatives thereof, and a partially self-condensed product thereof. As the urea-based crosslinking agent, there may be specifically exemplified by dimethoxy methylated dimethoxy ethylene urea, an alkoxy- and/or hydroxy-substituted derivatives thereof, and a partially self-condensed product thereof. As the β-hydroxyalkylamide-based crosslinking agent, there may be specifically exemplified by N,N,N',N'-tetra(2-hydroxyethyl) adipic acid amide. As the isocyanurate crosslinking agent, there may be specifically exemplified by triglycidyl isocyanurate and triallyl isocyanurate. As the aziridine-based crosslinking agent, there may be specifically exemplified by 4,4'-bis (ethyleneimino-carbonylamino) diphenylmethane and 2,2-bishydroxymethyl butanol-tris[3-(1-aziridinyl)propionate]. As the oxazoline-based crosslinking agent, there may be specifically exemplified by 2,2'-isopropylidenebis(4-benzyl-2-oxazoline), 2,2'-isopropylidenebis(4-phenyl-2-oxazoline), 2,2'-methylenebis-4,5-diphenyl-2-oxazoline, 2,2'-methylenebis-4-phenyl-2-oxazoline, 2,2'-methylenebis-4-tert-butyl- 2-oxazoline, 2,2'-bis(2-oxazoline), 1,3-phenylenebis(2-oxazoline), 1,4-phenylenebis(2-oxazoline), 2-isopropenyl oxazoline copolymer. As the epoxy-based crosslinking agent, there may be specifically exemplified by diglycidyl ether, ethylene glycol diglycidyl ether, 1,4-butanediol diglycidyl ether, 1,4-cyclohexane dimethanol diglycidyl ether, poly(glycidyl methacrylate), trimethylolethane triglycidyl ether, trimethylolpropane triglycidyl ether and pentaerythritol tetraglycidyl ether.

Also, to the material for forming an organic film of the present invention, (F) a plasticizer can be added to further improve flattening/embedding properties. The plasticizer is not particularly limited, and known various kinds of plasticizers can be widely used. As an example thereof, there may be exemplified by a low-molecular compound such as phthalic acid ester, adipic acid ester, phosphoric acid ester, trimellitic acid ester and citric acid ester, and a polymer such as a polyether-based, a polyester-based, and a polyacetal-based polymer disclosed in JP 2013-253227A.

In addition, in the material for forming an organic film of the present invention, as an additive to provide the same level of embedding/flattening characteristics as a plasticizer, for example, a liquid additive having a polyethylene glycol or polypropylene glycol structure, and a thermal decomposition polymer whose weight reduction rate from 30° C. to 250° C. is 40% by mass or more and whose weight average molecular weight is 300 to 200,000 are preferably used. This thermal decomposition polymer is preferably a material containing a repeating unit having an acetal structure represented by the following general formulae (DP1) and (DP1a):

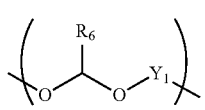
(DP1)

wherein, $R_6$ represents a hydrogen atom or a saturated or unsaturated monovalent organic group having 1 to 30 carbon atoms that may be substituted, and $Y_1$ represents a saturated or unsaturated divalent organic group having 2 to 30 carbon atoms:

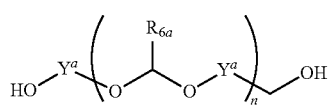
(DP1a)

wherein, $R_{6a}$ represents an alkyl group having 1 to 4 carbon atoms, $Y^a$ represents a saturated or unsaturated divalent hydrocarbon group having 4 to 10 carbon atoms, and may have an ether bond, and "n" represents an average repeating unit number of 3 to 500.

As described above, according to the material for forming an organic film of the present invention, it gives a material for forming an organic film having both of heat resistance of 400° C. or higher and high degree embedding/flattening characteristics. Therefore, the material for forming an organic film of the present invention is extremely useful as a material for forming an organic film of multilayer resist methods such as a two-layer resist method, a three-layer resist method using a silicon-containing resist intermediate film or a silicon-containing inorganic hard mask, and a four-layer resist method using a silicon-containing resist intermediate film or a silicon-containing inorganic hard mask and an organic antireflection film. The material for forming an organic film of the present invention does not generate any by-product during film formation in an inert gas and has excellent embedding/flattening characteristics so that it can be preferably used as a flattening material in a process for manufacturing a semiconductor apparatus other than a multilayer resist method.

<Substrate for Manufacturing Semiconductor Apparatus>

Further, the present invention provides a substrate for manufacturing a semiconductor apparatus, which is obtained by forming an organic film obtained by curing the above material for forming an organic film on a substrate.

If it is an organic film in which the material for forming an organic film of the present invention is cured, it becomes an organic film having no minute hole due to embedding failure and no unevenness on the organic film surface due to insufficient flatness by having both of high degree embedding/flattening characteristics. The substrate for manufacturing a semiconductor apparatus, which is flattened with such an organic film, has a wider process tolerance at the time of patterning, so that a semiconductor apparatus can be manufactured with high yield.

<Method for Forming Organic Film>

For the process of heating and film-forming for forming an organic underlayer film, one-step bake, 2-step bake or 3- or more multi-step bake may be applied, and one-step bake or 2-step bake is economically preferable. Firm formation by one-step bake is carried out, for example, at 100° C. or higher and 600° C. or lower for 5 to 3,600 seconds, and preferably at 150° C. or higher and 500° C. or lower for 10 to 7,200 seconds. The heat treatment under these conditions can promote flattening by thermal flow and crosslinking reaction. In a multilayer resist method, there are cases where a coating type silicon intermediate film or a CVD hard mask is formed on the resulting film. When the coating type silicon intermediate film is applied, film formation is preferably carried out at a temperature higher than a temperature of forming a silicon intermediate film. Normally, a silicon intermediate film is preferably formed at 100° C. or higher and 400° C. or lower, and preferably at 150° C. or higher and 350° C. or lower. When the organic underlayer film is formed at a temperature higher than the temperature, dissolution of the organic underlayer film by a composition for forming a silicon intermediate film can be prevented, and an organic film that is not mixed with the composition can be formed.

When a CVD hard mask is applied, the organic underlayer film is preferably formed at a temperature higher than a temperature of forming the CVD hard mask. The temperature of forming the CVD hard mask can be exemplified by a temperature of 150° C. or higher and 500° C. or lower.

On the other hand, in the film formation by the two-step baking, as the first step baking, the upper limit of the processing temperature in the air is, for example, 300° C. or lower, preferably 250° C. or lower for 10 to 600 seconds, considering the influence of corrosion of the substrate by oxygen in the air. The baking temperature of the second-step is higher than the baking temperature of the first step, and is preferably a temperature of 600° C. or lower, more preferably 500° C. or lower, for a period of 10 to 7,200 seconds. In the multilayer resist method, a coating type silicon intermediate film or a CVD hard mask may be formed on the obtained film in some cases. When applying a coating type silicon intermediate film, film formation at a temperature higher than the temperature at which the silicon intermediate film is formed is preferable. Usually, the silicon intermediate film is formed at a temperature of 100° C. or higher and 400° C. or lower, and preferably 150° C. or higher and 350° C. or lower. When the organic underlayer film is formed at a temperature higher than this temperature, dissolution of the organic underlayer film by the composition for forming a silicon intermediate film can be prevented, and an organic film that does not mix with the composition can be formed.

When a CVD hard mask is applied by the two-step baking, it is preferable to form the organic underlayer film at a temperature higher than the temperature at which the CVD hard mask is formed. As a temperature for forming the CVD hard mask, a temperature of 150° C. or higher and 500° C. or lower can be exemplified.

Also, in the present invention, there is provided a method for forming an organic film that functions as an organic underlayer film used in a manufacturing process of a semiconductor apparatus, wherein the substrate to be processed is subjected to heat treatment in an atmosphere having an oxygen concentration of 1% or less to form a cured film in order to prevent corrosion of the substrate.

In this organic film forming method, for example, first, the above-described material for forming an organic film of the present invention is spin-coated on a substrate to be processed. After the spin coating, in the two-step baking, after baking in air at 300° C. or lower, the second step baking is carried out in an atmosphere having an oxygen concentration of 1% or less. In the case of the one-step baking, the first-step baking in the air may be skipped. The atmosphere during the baking can be exemplified by an inert gas such as nitrogen, argon and helium. When the material for forming an organic film of the present invention is employed, a sufficiently cured organic film can be formed without generating sublimates even when baking in such an inert gas atmosphere.

Also, in the method for forming an organic film of the present invention, a substrate to be processed having a structure or a step having a height of 30 nm or more can be used. As described above, the material for forming an organic film of the present invention has excellent embedding/flattening characteristics, so that even if the substrate to be processed has a structure or a step (unevenness) with a height of 30 nm or more, a flat cured film can be formed. That is, the method for forming an organic film of the present invention is particularly useful for forming a flat organic film on such a substrate to be processed.

Incidentally, whereas the thickness of the organic film to be formed is appropriately selected, it is preferably 30 to 20,000 nm, and particularly preferably 50 to 15,000 nm.

Also, the above-described method for forming an organic film can be applied to both a case where an organic film for an organic underlayer film is formed using the material for forming an organic film of the present invention and a case where an organic film for a flattening film is formed.

According to the present invention, there is provided a method for forming an organic film applied in a process of manufacturing a semiconductor apparatus, which comprises spin-coating the above material for forming an organic film on a substrate to be processed, and heat-treating the substrate to be processed coated with the material for forming an organic film at 50° C. or higher and 600° C. or lower for 10 seconds to 7,200 seconds in an inert gas atmosphere to obtain a cured film.

According to the present invention, there is provided a method for forming an organic film applied in a process of manufacturing a semiconductor apparatus, which comprises spin-coating the above material for forming an organic film on a substrate to be processed, heat-treating the substrate to be processed coated with the material for forming an organic film at 50° C. or higher and 250° C. or lower for 5 seconds to 600 seconds, preferably 10 seconds to 600 seconds in the air to form a coated film, and subsequently heat-treating the same at 200° C. or higher and 600° C. or lower, preferably 250° C. or higher for 10 seconds to 7,200 seconds in an inert gas atmosphere to obtain a cured film.

The organic film applied to the manufacturing process of the semiconductor apparatus formed by the method of the present invention has high heat resistance and high embedding/flattening characteristics, and when used in the manufacturing process of the semiconductor apparatus, the yield of the semiconductor apparatus is good.

In this method for forming an organic film, first, the above-described material for forming an organic film of the present invention is subjected to rotary coating (spin-coating) on a substrate to be processed. By using the spin coating method, good embedding characteristics can be obtained. After spin coating, baking (heat treatment) is carried out to promote flattening by thermal fluidization and cross-linking reaction. Since the solvent in the material for forming an organic film can be evaporated by the baking, mixing can be prevented even when a resist upper layer film or a silicon-containing resist intermediate film is formed on the organic film.

<Patterning Process>
[Three-Layer Resist Method Using Silicon-Containing Resist Intermediate Film]

In addition, in the present invention, it is provided a patterning process which comprises forming an organic film on a body to be processed using the above material for forming an organic film, forming a silicon-containing resist intermediate film on the organic film using a material for a silicon-containing resist intermediate film, forming a resist upper layer film on the silicon-containing resist intermediate film using a photoresist composition, forming a circuit pattern in the resist upper layer film, transferring the pattern to the silicon-containing resist intermediate film by etching using the resist upper layer film in which the pattern has been formed as a mask, transferring the pattern to the organic film by etching using the silicon-containing resist intermediate film to which the pattern has been transferred as a mask, and further transferring the pattern to the body to be processed by etching using the organic film to which the pattern has been transferred as a mask.

As the body to be processed, a semiconductor apparatus substrate, or the semiconductor apparatus substrate coated with any of a metal film, a metal carbide film, a metal oxide film, a metal nitride film, a metal oxycarbide film and a metal oxynitride film is preferably used, and more specifically, although it is not particularly limited, there may be used a substrate such as Si, α-Si, p-Si, $SiO_2$, SiN, SiON, W, TiN or Al, or a material in which the above-mentioned metal film is formed on the substrate as a layer to be processed.

As the layer to be processed, various Low-k films such as Si, $SiO_2$, SiON, SiN, p-Si, α-Si, W, W—Si, Al, Cu and Al—Si, and their stopper films are used, and are usually formed to a thickness of 50 to 10,000 nm, and particularly 100 to 5,000 nm. Incidentally, when the layer to be processed is to be formed, different materials are used for the substrate and the layer to be processed.

Incidentally, the metal constituting the body to be processed is silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof.

In addition, it is preferable to use a substrate to be processed having a structure or a step with a height of 30 nm or more.

When an organic film is formed on a body to be processed using the material for forming an organic film of the present invention, the above-described method for forming an organic film of the present invention may be applied.

Next, a resist intermediate film (silicon-containing resist intermediate film) is formed on the organic film using a material for a resist intermediate film containing silicon atoms. As the material for the silicon-containing resist intermediate film, a material for the polysiloxane-based intermediate film is preferable. By giving the silicon-containing resist intermediate film an antireflection effect, reflection can be suppressed. In particular, for 193 nm exposure, when a material containing a large amount of aromatic groups and having high etching selectivity with the substrate is used as the material for forming an organic film, the k value increases and the substrate reflection increases, but by giving an absorption that gives k value appropriate for silicon-containing resist intermediate film, it is possible to suppress the reflection and the substrate reflection can be reduced to 0.5% or less. As the silicon-containing resist middle layer film having antireflective effect, a polysiloxane is preferably used which has anthracene for 248-nm and 157-nm light exposure, or a phenyl group or a light-absorbing group having a silicon-silicon bond for 193-nm light exposure in a pendant structure or a polysiloxane structure, and which is crosslinked by an acid or heat.

Next, a resist upper layer film is formed on the silicon-containing resist intermediate film using a material for the resist upper layer film comprising a photoresist composition. As the material for the resist upper layer film, either a positive type or a negative type may be used, and the same material as a commonly used photoresist composition can be used. After spin-coating the material for the resist upper layer, it is preferable to carry out pre-baking at 60 to 180° C. for a period of 10 to 300 seconds. There-after, exposure is carried out according to a conventional method, and post-exposure baking (PEB) and development are carried out to obtain a resist upper layer film pattern. Although the thickness of the resist upper layer film is not particularly limited, it is preferably 30 to 500 nm, and particularly preferably 50 to 400 nm.

Next, a circuit pattern (resist upper layer film pattern) is formed in the resist upper layer film. In forming a circuit pattern, it is preferable to form the circuit pattern by lithography using light having a wavelength of 10 nm or longer and 300 nm or shorter, direct drawing by an electron beam, nanoimprinting, or a combination thereof.

The exposure light may be a high energy beam having a wavelength of 300 nm or shorter, and specifically mentioned, far ultraviolet rays, KrF excimer laser light (248 nm), ArF excimer laser light (193 nm), $F_2$ laser light (157 nm), and $Kr_2$ laser light (146 nm), $Ar_2$ laser light (126 nm), soft X-ray (EUV) of 3 to 20 nm, electron beam (EB), ion beam and X-ray.

In the formation of the circuit pattern, it is preferable to develop the circuit pattern by alkali development or an organic solvent.

Next, the pattern is transferred to the silicon-containing resist intermediate film by etching using the resist upper layer film in which the circuit pattern is formed as a mask. The etching of the silicon-containing resist intermediate film using the resist upper layer film pattern as a mask is preferably carried out using a fluorocarbon-based gas. Accordingly, a silicon-containing resist intermediate film pattern is formed.

Next, the pattern is transferred to the organic film by etching using the silicon-containing resist intermediate film to which the pattern has been transferred as a mask. Since the silicon-containing resist intermediate film has a higher etching resistance to an oxygen gas or a hydrogen gas as compared to an organic substance, the etching of the organic film carried out using the silicon-containing resist intermediate film pattern as a mask is preferably carried out by using an etching gas containing an oxygen gas or a hydrogen gas as a main component. Accordingly, an organic film pattern can be formed.

Next, the pattern is transferred to the body to be processed by etching using the organic film to which the pattern has been transferred as a mask. The next etching of the body to be processed (layer to be processed) can be carried out by a conventional method, and for example, if the body to be processed is $SiO_2$, SiN or a silica-based low-dielectric-constant insulating film, etching using a fluorocarbon-based gas as a main component, and in the case of p-Si, Al or W, etching using a chlorine-based or bromine-based gas as a main component is carried out. When processing of the substrate is carried out by etching with a fluorocarbon-based gas, the silicon-containing resist intermediate film pattern is peeled off simultaneously with the processing of the substrate. On the other hand, when the substrate is processed by etching with a chlorine-based or bromine-based gas, it is necessary to separately carry out dry etching and peeling off with a fluorocarbon-based gas after processing the substrate in order to peel off the silicon-containing resist intermediate film pattern.

The organic film obtained by using the material for forming an organic film of the present invention can have excellent etching resistance at the time of etching a body to be processed as described above.

[Four-Layer Resist Method Using Silicon-Containing Resist Intermediate Film and Organic Antireflection Film]

Further, in the present invention, it is provided a patterning process which comprises forming an organic film on a body to be processed using the above material for forming an organic film, forming a silicon-containing resist intermediate film on the organic film using a material for a silicon-containing resist intermediate film, forming an organic antireflection film on the silicon-containing resist intermediate film, forming a resist upper layer film on the organic antireflection film using a photoresist composition to provide a four-layer film structure, forming a circuit pattern in the resist upper layer film, transferring the pattern to the organic antireflection film and the silicon-containing resist intermediate film by etching using the resist upper layer film in which the pattern has been formed as a mask, transferring the pattern to the organic film by etching using the silicon-containing resist intermediate film to which the pattern has been transferred as a mask, and further transferring the pattern to the body to be processed by etching using the organic film to which the pattern has been transferred as a mask.

Incidentally, this method is carried out in the same manner as in the above three-layer resist method using the silicon-containing resist intermediate film except that an organic antireflection film (BARC) is formed between the silicon-containing resist intermediate film and the resist upper layer film.

The organic antireflection film can be formed by spin coating using a known material for an organic antireflection film.

[Three-Layer Resist Method Using Inorganic Hard Mask]

Moreover, in the present invention, it is provided a patterning process which comprises forming an organic film on a body to be processed using the above material for forming an organic film, forming an inorganic hard mask selected from a silicon oxide film, a silicon nitride film, a silicon oxynitride film, a titanium oxide film and a titanium nitride film on the organic film, forming a resist upper layer film on the inorganic hard mask using a photoresist composition, forming a circuit pattern in the resist upper layer film, transferring the pattern to the inorganic hard mask by etching using the resist upper layer film in which the pattern has been formed as a mask, transferring the pattern to the organic film by etching using the inorganic hard mask to which the pattern has been transferred as a mask, and further transferring the pattern to the body to be processed by etching using the organic film to which the pattern has been transferred as a mask.

Incidentally, this method can be carried out in the same manner as the above three-layer resist method using the silicon-containing resist intermediate film, except that an inorganic hard mask is formed on the organic film in place of the silicon-containing resist intermediate film.

An inorganic hard mask selected from a silicon oxide film, a silicon nitride film and a silicon oxynitride film (SiON film) can be formed by a CVD method, an ALD method, and the like. As a method for forming the silicon nitride film, for example, it is described in JP 2002-334869A and WO 2004/066377. A thickness of the inorganic hard mask is preferably 5 to 200 nm, and more preferably 10 to 100 nm. As the inorganic hard mask, an SiON film having a high effect as an antireflection film is most preferably used. Since the substrate temperature when forming the SiON film is 300 to 500° C., the underlayer film must withstand a temperature of 300 to 500° C. An organic film formed using the material for forming an organic film of the present invention has high heat resistance and can withstand a high temperature of 300° C. to 500° C., so that it is possible to combine an inorganic hard mask formed by a CVD method or an ALD method with an organic film formed by a spin coating method.

[Four-Layer Resist Method Using Inorganic Hard Mask and Organic Antireflection Film]

Further, in the present invention, it is provided a patterning process which comprises forming an organic film on a body to be processed using the above material for forming an organic film, forming an inorganic hard mask selected from a silicon oxide film, a silicon nitride film, a silicon oxynitride film, a titanium oxide film and a titanium nitride film on the organic film, forming an organic antireflection film on the inorganic hard mask, forming a resist upper layer film on the organic antireflection film using a photoresist composition to provide a four-layer film structure, forming a circuit pattern in the resist upper layer film, transferring the pattern to the organic antireflection film and the inorganic hard mask by etching using the resist upper layer film in which the pattern has been formed as a mask, transferring the pattern to the organic film by etching using the inorganic hard mask to which the pattern has been transferred as a mask, and further transferring the pattern to the body to be processed by etching using the organic film to which the pattern has been transferred as a mask.

Incidentally, this method can be carried out in the same manner as in the above three-layer resist method using an inorganic hard mask, except that an organic antireflection film (BARC) is formed between the inorganic hard mask and the resist upper layer film.

In particular, when an SiON film is used as the inorganic hard mask, it is possible to suppress reflection even in a liquid-immersion exposure with a high NA exceeding 1.0 by the two-layer antireflection film of the SiON film and the BARC. Another advantage of forming the BARC is that it has the effect of reducing footing of the resist upper layer film pattern immediately above the SiON film.

Here, an example of a patterning process by the three-layer resist method of the present invention is shown in FIGS. 2(A) to (F). In the case of the three-layer resist method, as shown in FIG. 2(A), after forming the organic film 3 on the layer 2 to be processed formed on the substrate 1 using the material for forming an organic film of the present invention, a silicon-containing resist intermediate film 4 is formed, and a resist upper layer film 5 is formed thereon. Next, as shown in FIG. 2(B), the exposed portion 6 of the resist upper layer film 5 is exposed, and PEB (post-exposure baking) is carried out. Then, as shown in FIG. 2(C), development is carried out to form a resist upper layer film pattern 5a. Next, as shown in FIG. 2(D), the silicon-containing resist intermediate film 4 is subjected to dry-etching processing using a fluorocarbon-based gas and using the resist upper layer film pattern 5a as a mask to form a silicon-containing resist intermediate film pattern 4a. Then, as shown in FIG. 2(E), after removing the resist upper layer film pattern 5a, the organic film 3 is subjected to oxygen plasma etching using the silicon-containing resist intermediate film pattern 4a as a mask to form an organic film pattern 3a. Further, as shown in FIG. 2(F), after removing the silicon-containing resist intermediate film pattern 4a, the layer 2 to be processed is subjected to etching processing using the organic film pattern 3a as a mask to form a pattern 2a.

When an inorganic hard mask is to be formed, the silicon-containing resist intermediate film 4 may be changed to an inorganic hard mask, and when a BARC is to be formed, a BARC may be formed between the silicon-containing resist intermediate film 4 and the resist upper layer film 5. Etching of the BARC may be carried out continuously prior to the etching of the silicon-containing resist intermediate film 4, or etching of the BRAC alone is carried out and then etching of the silicon-containing resist intermediate film 4 may be carried out by changing the etching apparatus.

As described above, according to the patterning process of the present invention, fine pattern can be formed on a body to be processed with high precision by a multilayer resist method.

EXAMPLE

Hereinafter, the present invention will be described in more detail with reference to Synthesis Examples, Comparative Synthesis Examples, Examples and Comparative Examples, but the present invention is not limited thereto. As to the molecular weight and the degree of dispersion, the weight average molecular weight (Mw) and the number average molecular weight (Mn) were calculated in terms of polystyrene by gel permeation chromatography (GPC) using tetrahydrofuran as an eluent to obtain a degree of dispersion (Mw/Mn).

Synthesis Example: Synthesis of Polymer for Material for Forming Organic Film

For the syntheses of the polymers (A1) to (A16) for a material for forming an organic film, tetracarboxylic anhydrides (B1) to (B6), diamine compounds (C1) to (C6), and aniline derivatives and phthalic anhydride derivatives (D1) to (D5) as terminal sealing agents shown below were used. An isomer mixture of 60:40 was used for (C3).
Tetracarboxylic Anhydride:
(B1)
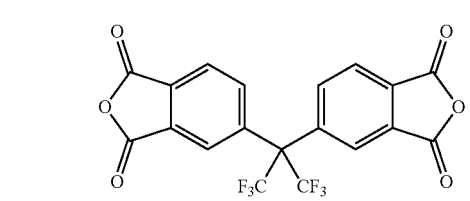
(B2)
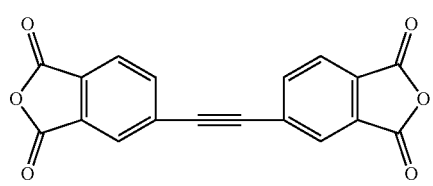
(B3)
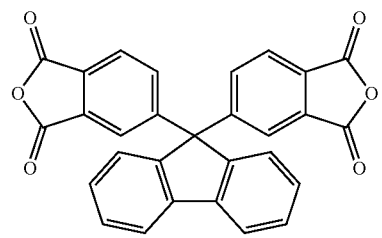
(B4)
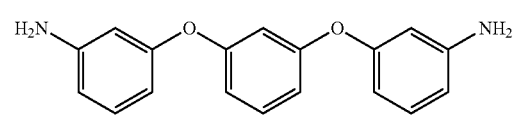
(B5)
(B6)
Diamine Compound:
(C1)
(C2)
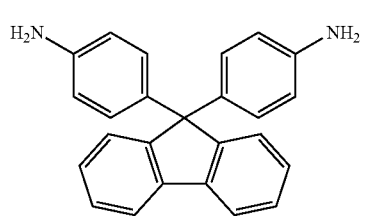
(C3)
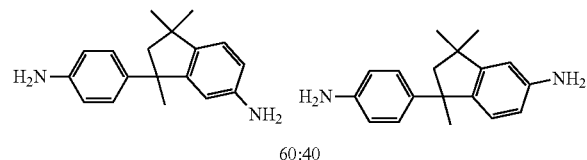
60:40
(C4)
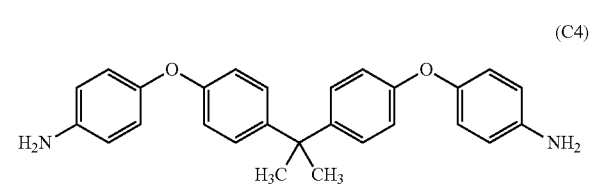
(C5)
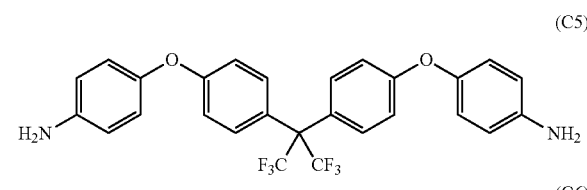
(C6)
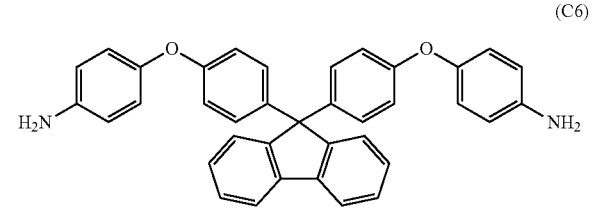
Terminal Sealing Agent:
(D1)
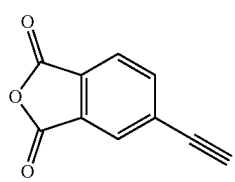
(D2)
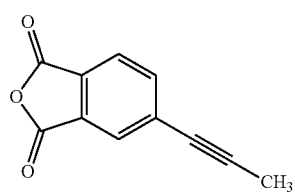

-continued (D3)
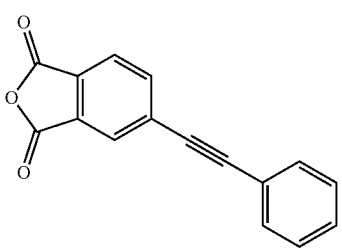

(D4)
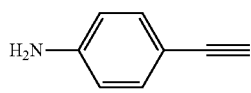

(D5)
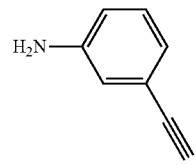

[Synthesis Example 1] Synthesis of Polymer (A1)

To 15.55 g of tetracarboxylic anhydride (B1) and 14.62 g of a diamine compound (C1) was added 120 g of NMP (N-methyl-2-pyrrolidone) and the reaction was carried out at an internal temperature of 40° C. for 3 hours under nitrogen atmosphere. To the resulting polyamic acid intermediate solution was added 5.16 g of a terminal sealing agent (D1) and the reaction was carried out at an internal temperature of 40° C. for further 3 hours to obtain a polyimide precursor solution. To the resulting reaction solution was added 4.00 g of pyridine, and then 12.25 g of acetic anhydride was gradually added dropped thereinto, and the reaction was carried out at an internal temperature of 60° C. for 4 hours to carry out imidation. After completion of the reaction, the mixture was cooled to room temperature, 400 g of methyl isobutyl ketone was added thereto, the organic layer was washed with 100 g of a 3% aqueous nitric acid solution twice, and further washed with 100 g of pure water 6 times, and the organic layer was evaporated to dryness under reduced pressure. To the residue was added 100 g of THF (tetrahydrofuran) to make a homogeneous solution, and the product was crystallized with 400 g of methanol. The precipitated crystals were separated by filtration, washed twice with 300 g of methanol and collected. The collected crystals were vacuum-dried at 70° C. to obtain a polymer (A1).

When the weight average molecular weight (Mw) and the degree of dispersion (Mw/Mn) were obtained by the GPC method, the results were as follows.

[Synthesis Examples 2 to 16] Syntheses of Polymers (A2) to (A16)

The synthesis was carried out under the same reaction conditions as in Synthesis Example 1 except that the diamine compound, the tetracarboxylic anhydride, and the terminal sealing agent shown in Table 1 were used to obtain polymers (A2) to (A16) shown in Table 1 as a product. The weight average molecular weight (Mw) and the degree of dispersion (Mw/Mn) of these polymers were obtained and shown in Table 2.

TABLE 1

| Synthesis Example | Tetracarboxylic anhydride | Diamine compound | Terminal sealing agent | Product |
|---|---|---|---|---|
| 1 | B1: 15.55 g | C1: 14.62 g | D1: 5.16 g | A1 |
| 2 | B2: 7.96 g | C2: 17.42 g | D1: 8.61 g | A2 |
| 3 | B3: 11.46 g | C3: 13.32 g | D2: 9.31 g | A3 |
| 4 | B4: 7.81 g | C4: 12.32 g | D3: 7.45 g | A4 |
| 5 | B5: 7.71 g | C5: 15.55 g | D1: 6.20 g | A5 |
| 6 | B6: 8.91 g | C6: 15.98 g | D3: 8.94 g | A6 |
| 7 | B6: 22.28 g | C2: 5.23 g | D4: 3.52 g | A7 |
| 8 | B5: 19.28 g | C3: 4.00 g | D5: 3.52 g | A8 |
| 9 | B4: 20.82 g | C4: 8.21 g | D4: 4.69 g | A9 |
| 10 | B3: 18.34 g | C5: 8.30 g | D5: 5.62 g | A10 |
| 11 | B2: 12.73 g | C6: 8.52 g | D4: 5.62 g | A11 |
| 12 | B1: 13.33 g | C2: 7.32 g | D5: 2.11 g | A12 |
| 13 | B2: 2.39 g B5: 4.82 g | C6: 15.98 g | D1: 5.16 g | A13 |
| 14 | B5: 12.85 g | C2: 13.94 g | D1: 3.43 g D3: 4.97 g | A14 |
| 15 | B4: 15.61 g | C3: 4.18 g | D4: 2.11 g D5: 2.11 g | A15 |
| 16 | B1: 5.33 g B4: 9.37 g | C2: 7.84 g | D5: 1.76 g | A16 |

The polymers (A17) and (A18) for materials for forming an organic film and the polymers (R1) to (R3) for Comparative Examples were synthesized using the following compounds (E1) to (E5) and the above tetracarboxylic anhydrides (B4) and (B5), the diamine compounds (C2) and (C3), and the terminal sealing agents (D3) and (D5).

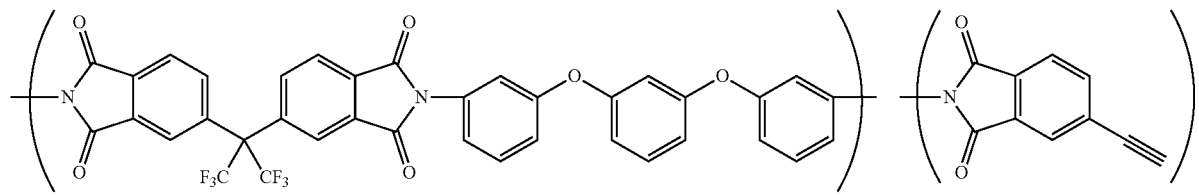

(A1)

(A1): Mw=4320, Mw/Mn=1.72

(E1)
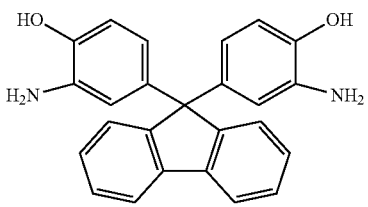

(E2)
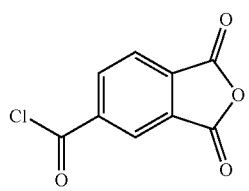

(E3)
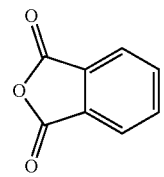

[Synthesis Example 17] Synthesis of Polymer (A17)

To 6.32 g of the compound (E2) was added 50 g of THF to make the mixture a homogeneous solution in ice bath under nitrogen atmosphere. A solution containing 4.00 g of a diamine compound (C3) and 3.34 g of triethylamine dissolved beforehand in 20 g of NMP was slowly added dropwise to the mixture and the resulting mixture was reacted at room temperature for one hour. To the mixture were further added 14.28 g of the compound (E1) and 100 g of NMP and the mixture was reacted at an internal temperature of 40° C. for 3 hours, and 11.18 g of the terminal sealing agent (D3) was added thereto to obtain a polyimide precursor. To the resulting reaction solution was added 150 g of o-xylene, and the reaction was carried out for 9 hours while removing a low-boiling point material formed at an internal temperature of 180° C. and the forming water from the system to carry out imidation. After completion of the reaction, the mixture was cooled to room temperature, and the product was crystallized with 600 g of diisopropyl ether. The precipitated crystals were separated by filtration, washed twice with 200 g of diisopropyl ether and collected. The collected crystals were vacuum-dried at 70° C. to obtain (A17).

When the weight average molecular weight (Mw) and the degree of dispersion (Mw/Mn) were obtained by GPC and the results were as follows.

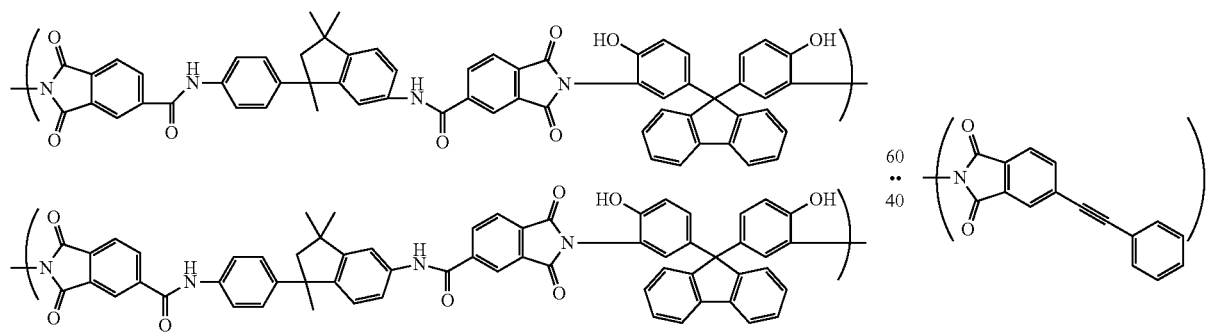

(A17): Mw = 2,930, Mw/Mn = 1.42

-continued (E4)
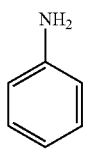

(E5)
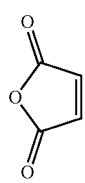

[Synthesis Example 18] Synthesis of Polymer (A18)

To 12.07 g of a compound (E2) was added 100 g of THF to make it a homogeneous solution in ice bath under nitrogen atmosphere. A solution containing 10.00 g of a diamine compound (C2) and 6.39 g of triethylamine dissolved beforehand in 60 g of NMP was slowly added dropwise to the mixture and the resulting mixture was reacted at room temperature for one hour. To the mixture was further added 4.00 g of the diamine compound (C2) and the mixture was reacted at an internal temperature of 40° C. for 3 hours, and 5.93 g of the terminal sealing agent (D5) was added thereto to obtain a polyimide precursor. To the resulting reaction solution was added 2.27 g of pyridine, and then 7.04 g of acetic anhydride was slowly added dropwise to the mixture, and the mixture was reacted at an internal temperature of 60° C. for 4 hours to carry out imidation. After completion of the reaction, 400 g of methyl isobutyl ketone was added thereto, then 100 g of a 5% hydrochloric acid aqueous solution was added slowly to the mixture while cooling with an ice bath and the reaction was quenched. After quenching, the aqueous layer was removed, the organic layer was washed 6 times with 100 g of a 3% aqueous nitric acid solution and 100 g of pure water, and the organic layer was evaporated to dryness under reduced pressure. To the residue was added 100 g of THF to make it a homogeneous solution, and the product was crystallized with 400 g of methanol. The precipitated crystals were separated by filtration, washed twice with 300 g of methanol and collected. The collected crystals were vacuum-dried at 70° C. to obtain (A18).

When the weight average molecular weight (Mw) and the degree of dispersion (Mw/Mn) were obtained by GPC and the results were as follows.

washed twice with 100 g of a 3% aqueous nitric acid solution and further washed 6 times with 100 g of pure water, and the organic layer was evaporated to dryness under reduced pressure. To the residue was added 100 g of THF (tetrahydrofuran) to make it a homogeneous solution, and the product was crystallized with 400 g of methanol. The precipitated crystals were separated by filtration, washed twice with 300 g of methanol and collected. The collected crystals were vacuum-dried at 70° C. to obtain a polymer (R1).

When the weight average molecular weight (Mw) and the degree of dispersion (Mw/Mn) were obtained by GPC and the results were as follows.

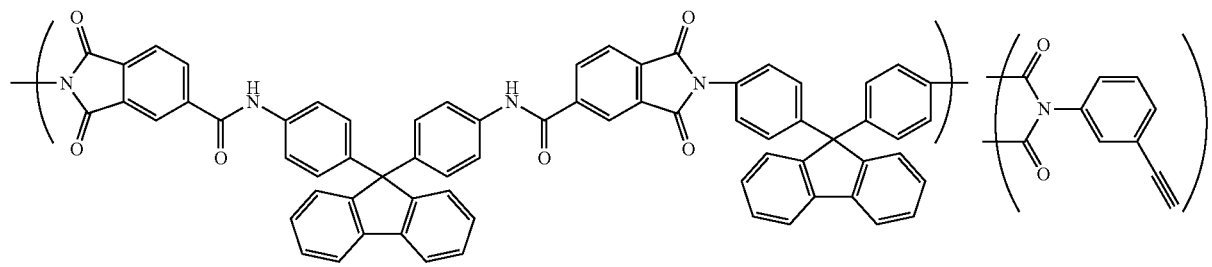

(A18): Mw = 2,760, Mw/Mn = 1.37

[Synthesis Example 19] Synthesis of Polymer (R1)

To 10.28 g of tetracarboxylic anhydride (B5) and 13.94 g of a diamine compound (C2) was added 120 g of NMP (N-methyl-2-pyrrolidone) and the mixture was reacted at an internal temperature of 40° C. for 3 hours under nitrogen

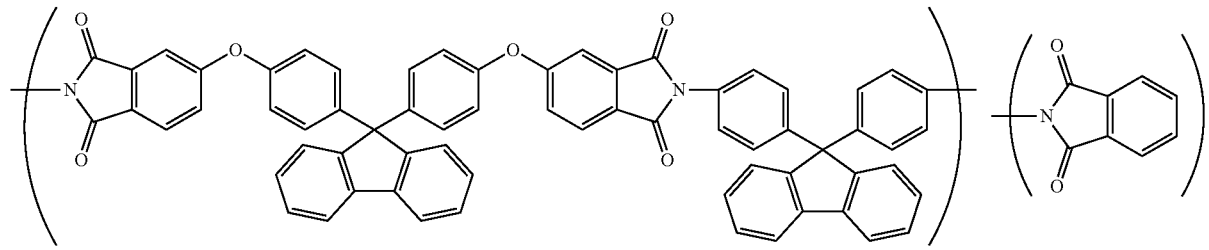

(R1): Mw = 2,450, Mw/Mn = 1.44 atmosphere. To the resulting polyamic acid intermediate solution was added 7.11 g of a terminal sealing agent (E3) and the mixture was reacted at an internal temperature of 40° C. for further 3 hours to obtain a polyimide precursor solution. To the resulting reaction solution was added 1.98 g of pyridine, and then 12.25 g of acetic anhydride was slowly added dropwise thereinto, and the mixture was reacted at an internal temperature of 60° C. for 4 hours to carry out imidation. After completion of the reaction, the mixture was cooled to room temperature, 400 g of methyl isobutyl ketone was added thereto, the organic layer was

[Synthesis Example 20] Synthesis of Polymer (R2)

To 19.28 g of tetracarboxylic anhydride (B5) and 4.18 g of a diamine compound (C2) was added 120 g of NMP (N-methyl-2-pyrrolidone) and the mixture was reacted at an internal temperature of 40° C. for 3 hours under nitrogen atmosphere. To the resulting polyamic acid intermediate solution was added 3.35 g of a terminal sealing agent (E4) and the mixture was reacted at an internal temperature of 40° C. for further 3 hours to obtain a polyimide precursor solution. To the resulting reaction solution was added 1.98 g of pyridine, and then 12.25 g of acetic anhydride was slowly added dropwise thereinto, and the mixture was reacted at an internal temperature of 60° C. for 4 hours to carry out imidation. After completion of the reaction, the mixture was cooled to room temperature, 400 g of methyl isobutyl ketone was added thereto, the organic layer was washed twice with 100 g of a 3% aqueous nitric acid solution and further washed 6 times with 100 g of pure water, and the organic layer was evaporated to dryness under reduced pressure. To the residue was added 100 g of THF (tetrahydrofuran) to make it a homogeneous solution, and the product was crystallized with 400 g of methanol. The precipitated crystals were separated by filtration, washed twice with 300 g of methanol and collected. The collected crystals were vacuum-dried at 70° C. to obtain a polymer (R2).

When the weight average molecular weight (Mw) and the degree of dispersion (Mw/Mn) were obtained by GPC and the results were as follows.

solution was added 3.92 g of a terminal sealing agent (E5) and the mixture was reacted at an internal temperature of 40° C. for further 3 hours to obtain a polyimide precursor solution. To the resulting reaction solution was added 3.28 g of sodium acetate, and then 9.81 g of acetic anhydride was slowly added dropwise thereinto, and the mixture was reacted at an internal temperature of 60° C. for 4 hours to carry out imidation. After completion of the reaction, the mixture was cooled to room temperature, 400 g of methyl isobutyl ketone was added thereto, the organic layer was washed twice with 100 g of a 3% aqueous nitric acid solution and further washed 6 times with 100 g of pure water, and the organic layer was evaporated to dryness under reduced pressure. To the residue was added 100 g of THF (tetrahydrofuran) to make it a homogeneous solution, and the product was crystallized with 400 g of diisopropyl ether. The precipitated crystals were separated by filtration,

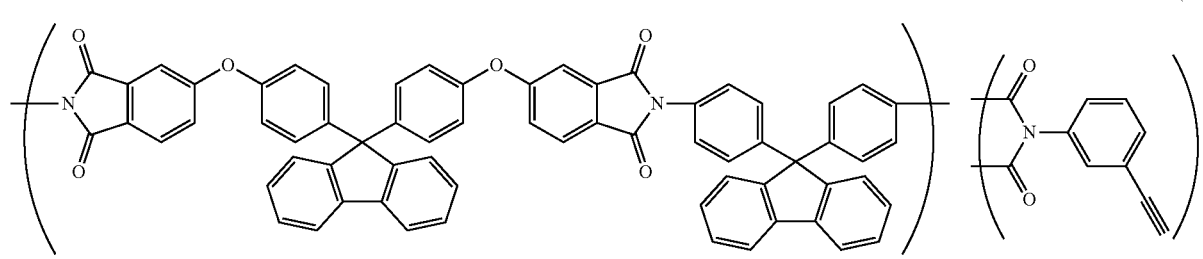

(R2): Mw = 2,320, Mw/Mn = 1.39

[Synthesis Example 21] Synthesis of Polymer (R3)

To 10.41 g of tetracarboxylic anhydride (B4) and 10.66 g of a diamine compound (C3) was added 100 g of NMP (N-methyl-2-pyrrolidone) and the mixture was reacted at an internal temperature of 40° C. for 3 hours under nitrogen atmosphere. To the resulting polyamic acid intermediate washed twice with 300 g of diisopropyl ether and collected. The collected crystals were vacuum-dried at 70° C. to obtain a polymer (R3).

When the weight average molecular weight (Mw) and the degree of dispersion (Mw/Mn) were obtained by GPC and the results were as follows.

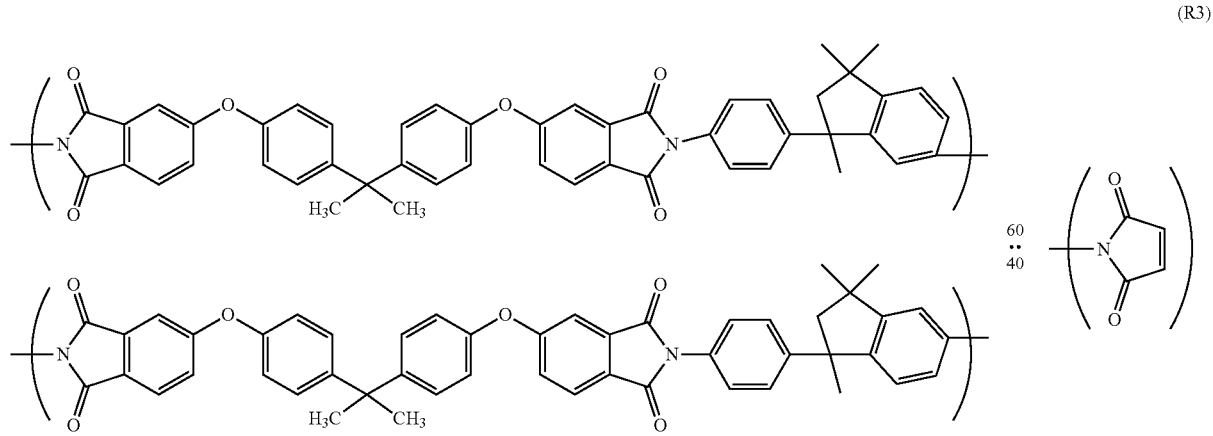

(R3): Mw = 2,370, Mw/Mn = 1.41

[Synthesis Example 22] Synthesis of Compound (R4)

After 10.00 g of 1,3-diethynylbenzene, 30.00 g of 1,3-diiodobenzene, 0.6 g of bis(triphenylphosphine) dichloropalladium and 0.4 g of copper iodide (I) as catalysts, 40 g of piperidine and 200 g of THF were charged and the mixture was reacted at an internal temperature of 30° C. for 3 hour under nitrogen atmosphere, 3.57 g of ethynylbenzene was added to the mixture as a terminal sealing agent, and the resulting mixture was reacted at an internal temperature of 30° C. for further 3 hours. After completion of the reaction, the product was crystallized with 400 g of methanol. The precipitated crystals were separated by filtration, washed twice with 200 g of methanol and collected. The collected crystals were vacuum-dried at 70° C. to obtain a polymer (R4).

When the weight average molecular weight (Mw) and the degree of dispersion (Mw/Mn) were obtained by GPC and the results were as follows.

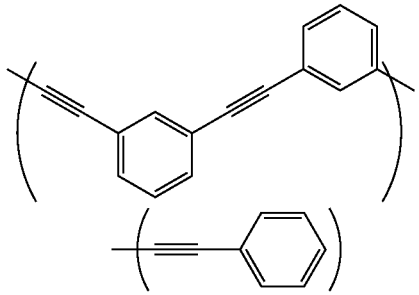

(R4): Mw = 2,120, Mw/Mn = 1.81

A list of the structural formula, the weight average molecular weight (Mw) and the degree of dispersion (Mw/Mn) of the obtained polymers as mentioned above is shown in Table 2. In addition, the Mw and Mw/Mn of the polymers (R1) to (R4) used as the Comparative Examples are also shown in Table 2.

TABLE 2-1

| Synthesis Example | Compound | | Mw | Mw/Mn |
|---|---|---|---|---|
| 1 | (A1) | [structure] | 4320 | 1.72 |
| 2 | (A2) | [structure] | 1920 | 1.32 |
| 3 | (A3) | [structure, 60:40] | 1990 | 1.35 |

TABLE 2-1-continued

| Synthesis Example | Compound | Mw | Mw/Mn |
|---|---|---|---|
| 4 | (A4) | 2340 | 1.41 |
| 5 | (A5) | 2420 | 1.26 |
| 6 | (A6) | 2580 | 1.27 |
| 7 | (A7) | 2780 | 1.42 |

TABLE 2-1-continued
| Synthesis Example | Compound | Mw | Mw/Mn |
|---|---|---|---|
| 8 | (A8) 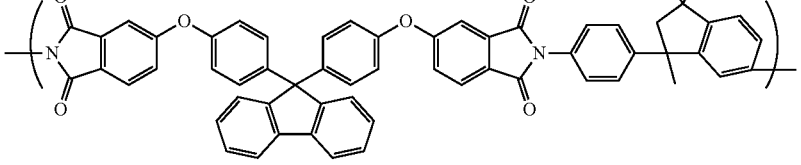 60 : 40 | 2290 | 1.45 |
| 9 | (A9) 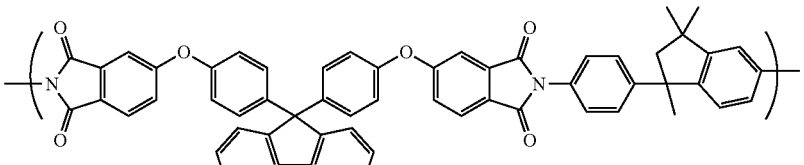 | 2470 | 1.38 |
| 10 | (A10) 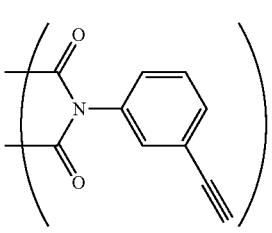 | 2240 | 1.27 |

TABLE 2-1-continued

| Synthesis Example | Compound | Mw | Mw/Mn |
|---|---|---|---|
| 11 | (A11) [structure] | 2150 | 1.22 |
| 12 | (A12) [structure] | 3780 | 1.67 |
| 13 | (A13) [structure, 50:50] | 2840 | 1.55 |
| 14 | (A14) [structure] | 2780 | 1.51 |

TABLE 2-1-continued

| Synthesis Example | Compound | Mw | Mw/Mn |
|---|---|---|---|
| 15 | (A15) | 1580 | 1.29 |
| 16 | (A16) | 4500 | 1.78 |

50:50

60 ‥ 40

50:50

40 ‥ 60

TABLE 2-1-continued
| Synthesis Example | Compound | | Mw | Mw/Mn |
|---|---|---|---|---|
| 17 | (A17) | 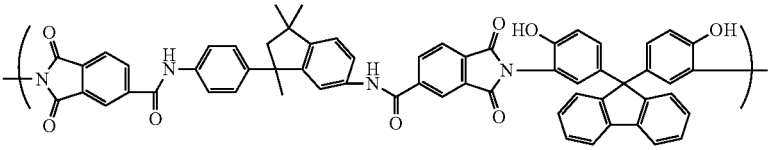 | 2930 | 1.42 |
| 18 | (A18) | 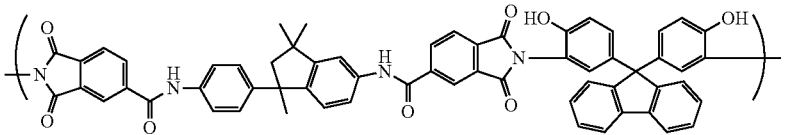 | 2760 | 1.37 |
| 19 | (R1) | 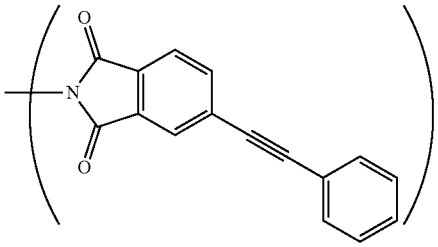 | 2450 | 1.44 |

TABLE 2-1-continued

| Synthesis Example | Compound | Mw | Mw/Mn |
|---|---|---|---|
| 20 | (R2) [chemical structure] | 2320 | 1.39 |
| 21 | (R3) [chemical structure with 60:40 ratio] | 2370 | 1.41 |
| 22 | (R4) [chemical structure] | 2120 | 1.81 |

Preparation of Compositions for Forming Organic Film (UDL-1 to 22 and Comparative UDL1 to 4)

The above polymers (A1) to (A18) and (R1) to (R4), and as high-boiling point solvents, (S1) 1,6-diacetoxyhexane having a boiling point of 260° C., (S2) γ-butyrolactone having a boiling point of 204° C., and (S3) tripropylene glycol monomethyl ether having a boiling point of 242° C. were used. Using propylene glycol monomethyl ether acetate (PGMEA) containing 0.1% by mass of FC-4430 (Product from Sumitomo 3M) and cyclohexanone (CyHO), after the materials were dissolved therein with ratios shown in Table 3, the mixture was filtered through a 0.1 μm filter made of a fluorine resin to prepare compositions for forming organic films (UDL-1 to 22 and Comparative UDL-1 to 4), respectively.

TABLE 3

| Composition for forming organic film | Polymer (1) (parts by mass) | Polymer (2) (parts by mass) | High-boiling point solvent (parts by mass) | CYHO (parts by mass) | PGMEA (parts by mass) |
|---|---|---|---|---|---|
| UDL-1  | A1 (10)  | — | — | —  | 90 |
| UDL-2  | A2 (10)  | — | — | 90 | —  |
| UDL-3  | A3 (10)  | — | — | —  | 90 |
| UDL-4  | A4 (10)  | — | — | 90 | —  |
| UDL-5  | A5 (10)  | — | — | —  | 90 |
| UDL-6  | A6 (10)  | — | — | 90 | —  |
| UDL-7  | A7 (10)  | — | — | —  | 90 |
| UDL-8  | A8 (10)  | — | — | 90 | —  |
| UDL-9  | A9 (10)  | — | — | 90 | —  |
| UDL-10 | A10 (10) | — | — | 90 | —  |

TABLE 3-continued

| Composition for forming organic film | Polymer (1) (parts by mass) | Polymer (2) (parts by mass) | High-boiling point solvent (parts by mass) | CYHO (parts by mass) | PGMEA (parts by mass) |
|---|---|---|---|---|---|
| UDL-11 | A11 (10) | — | — | 90 | — |
| UDL-12 | A12 (10) | — | — | — | 90 |
| UDL-13 | A13 (10) | — | — | 90 | — |
| UDL-14 | A14 (10) | — | — | 90 | — |
| UDL-15 | A15 (10) | — | — | 90 | — |
| UDL-16 | A16 (10) | — | — | — | 90 |
| UDL-17 | A17 (10) | — | — | — | 90 |
| UDL-18 | A18 (10) | — | — | 90 | — |
| UDL-19 | A3 (5) | A8 (5) | — | — | 90 |
| UDL-20 | A2 (10) | — | S1 (10) | 80 | — |
| UDL-21 | A7 (10) | — | S2 (10) | 80 | — |
| UDL-22 | A15 (10) | — | S3 (10) | — | 80 |
| Comparative Example UDL-1 | R1 (10) | — | — | 90 | — |
| Comparative Example UDL-2 | R2 (10) | — | — | 90 | — |
| Comparative Example UDL-3 | R3 (10) | — | — | — | 90 |
| Comparative Example UDL-4 | R4 (10) | — | — | 90 | — |

Example 1 Measurement of Solvent Resistance (Examples 1-1 to 1-22 and Comparative Examples 1-1 to 1-4)

The compositions for forming an organic film prepared above (UDL-1 to 22 and Comparative UDL-1 to 4) were coated on a silicon substrate, fired at 450° C. for 60 seconds under a nitrogen gas stream having a controlled oxygen concentration of 0.2% or less, and then the film thickness was measured, a PGMEA solvent was dispensed thereon, it was left to stand for 30 seconds and spin-dried, baked at 100° C. for 60 seconds to evaporate the PGMEA, and the film thickness was measured to obtain a difference in film thickness between before and after the PGMEA treatment.

TABLE 4

| | Composition for forming organic film | Film thickness after film formation: a (Å) | Film thickness after PGMEA treatment: b (Å) | B/A × 100 (%) |
|---|---|---|---|---|
| Example 1-1 | UDL-1 | 2008 | 2001 | 99.7 |
| Example 1-2 | UDL-2 | 2001 | 1995 | 99.7 |
| Example 1-3 | UDL-3 | 2009 | 2001 | 99.6 |
| Example 1-4 | UDL-4 | 2007 | 2000 | 99.7 |
| Example 1-5 | UDL-5 | 2015 | 2013 | 99.9 |
| Example 1-6 | UDL-6 | 2009 | 2003 | 99.7 |
| Example 1-7 | UDL-7 | 2000 | 1995 | 99.8 |
| Example 1-8 | UDL-8 | 1985 | 1979 | 99.7 |
| Example 1-9 | UDL-9 | 1990 | 1988 | 99.9 |
| Example 1-10 | UDL-10 | 2002 | 1994 | 99.6 |
| Example 1-11 | UDL-11 | 1999 | 1990 | 99.5 |
| Example 1-12 | UDL-12 | 2006 | 2002 | 99.8 |
| Example 1-13 | UDL-13 | 1998 | 1993 | 99.7 |
| Example 1-14 | UDL-14 | 1986 | 1982 | 99.8 |
| Example 1-15 | UDL-15 | 2015 | 2011 | 99.8 |
| Example 1-16 | UDL-16 | 1999 | 1993 | 99.7 |
| Example 1-17 | UDL-17 | 2013 | 2007 | 99.7 |
| Example 1-18 | UDL-18 | 1985 | 1979 | 99.7 |
| Example 1-19 | UDL-19 | 2000 | 1996 | 99.8 |
| Example 1-20 | UDL-20 | 1990 | 1979 | 99.4 |
| Example 1-21 | UDL-21 | 2001 | 1995 | 99.7 |
| Example 1-22 | UDL-22 | 2008 | 2002 | 99.7 |
| Comparative Example 1-1 | Comparative UDL-1 | 2007 | 1412 | 70.4 |
| Comparative Example 1-2 | Comparative UDL-2 | 2012 | 1398 | 69.5 |
| Comparative Example 1-3 | Comparative UDL-3 | 2001 | 1987 | 99.3 |
| Comparative Example 1-4 | Comparative UDL-4 | 2001 | 1988 | 99.4 |

As shown in Table 4, the materials for forming an organic film of the present invention (Examples 1-1 to 1-22) demonstrate the film residual rate after the PGMEA treatment of 99% or more and sufficient solvent resistance due to crosslinking reaction generated even under nitrogen atmosphere. On the other hand, Comparative Examples 1-1 and 1-2 using polyimides having no crosslinking group indicated the film residual rate of about 70% after the PGMEA treatment and accordingly did not show sufficient solvent resistance. From these results, it can be understood that $R_1$ introduced as a substituent effectively functions as a thermal crosslinking group.

Example 2 Evaluation of Heat Resistant Characteristics (Examples 2-1 to 2-22 and Comparative Examples 2-1 to 2-4)

The above compositions for forming an organic film (UDL-1 to 22 and Comparative UDL-1 to 4) were each coated on a silicon substrate, fired at 180° C. for 60 seconds in the atmosphere to form a coating film having 200 nm, and the film thickness A was measured. The substrate was further fired at 450° C. for further 10 minutes under a nitrogen gas stream having a controlled oxygen concentration of 0.2% or less, and the film thickness B was measured. These results are shown in Table 5.

TABLE 5

| | Composition for forming organic film | Film thickness at 180° C.: A (Å) | Film thickness at 450° C.: B (Å) | Film remaining rate % (B/A) |
|---|---|---|---|---|
| Example 2-1 | UDL-1 | 1999 | 1991 | 99.6 |
| Example 2-2 | UDL-2 | 1993 | 1986 | 99.6 |
| Example 2-3 | UDL-3 | 1996 | 1983 | 99.4 |
| Example 2-4 | UDL-4 | 2014 | 2000 | 99.3 |
| Example 2-5 | UDL-5 | 1987 | 1976 | 99.5 |
| Example 2-6 | UDL-6 | 1999 | 1992 | 99.6 |
| Example 2-7 | UDL-7 | 1987 | 1979 | 99.6 |
| Example 2-8 | UDL-8 | 1994 | 1983 | 99.5 |
| Example 2-9 | UDL-9 | 1995 | 1991 | 99.8 |
| Example 2-10 | UDL-10 | 1988 | 1978 | 99.5 |
| Example 2-11 | UDL-11 | 2000 | 1994 | 99.7 |
| Example 2-12 | UDL-12 | 2003 | 1995 | 99.6 |
| Example 2-13 | UDL-13 | 2005 | 1993 | 99.4 |
| Example 2-14 | UDL-14 | 2003 | 1992 | 99.4 |
| Example 2-15 | UDL-15 | 1995 | 1991 | 99.8 |
| Example 2-16 | UDL-16 | 1999 | 1990 | 99.5 |
| Example 2-17 | UDL-17 | 1997 | 1985 | 99.4 |
| Example 2-18 | UDL-18 | 1990 | 1982 | 99.6 |
| Example 2-19 | UDL-19 | 1988 | 1978 | 99.5 |
| Example 2-20 | UDL-20 | 2011 | 1997 | 99.3 |
| Example 2-21 | UDL-21 | 1996 | 1984 | 99.4 |

TABLE 5-continued

| Composition for forming organic film | Film thickness at 180° C.: A (Å) | Film thickness at 450° C.: B (Å) | Film remaining rate % (B/A) |
|---|---|---|---|
| Example 2-22 | UDL-22 | 2009 | 2000 | 99.5 |
| Comparative Example 2-1 | Comparative UDL-1 | 1995 | 1393 | 69.8 |
| Comparative Example 2-2 | Comparative UDL-2 | 2000 | 1378 | 68.9 |
| Comparative Example 2-3 | Comparative UDL-3 | 2004 | 1489 | 74.3 |
| Comparative Example 2-4 | Comparative UDL-4 | 2001 | 1987 | 99.3 |

As shown in Table 5, the materials for forming an organic film of the present invention (Examples 2-1 to 2-22) demonstrate that reduction in the film thickness is less than 1% even after firing at 450° C., and the film thickness prior to high-temperature baking is maintained even after firing at 450° C. whereby it can be understood that they have high heat resistance. To the contrary, when they are compared to Comparative Examples 2-1 and 2-2 using polyimides having no crosslinking group, it can be understood that the materials for forming an organic film of the present invention form a dense film by thermal crosslinking by the terminal crosslinking group $R_1$ and a film having excellent heat resistance is formed. Also, in Comparative Example 2-3 having a bismaleimide structure as a crosslinking group, solvent resistance is found by thermal crosslinking under the conditions of Example 1, but sufficient heat resistance is not found by thermal crosslinking by a bismaleimide structure under the conditions of high-temperature treatment for a long-time as in Example 2.

Example 3 Evaluation of Embedding Characteristics (Examples 3-1 to 3-22 and Comparative Examples 3-1 to 3-4)

As shown in FIG. 3, the compositions for forming the above organic film (UDL-1 to 22 and Comparative UDL-1 to 4) were each coated on a $SiO_2$ wafer substrate having a dense hole pattern (hole diameter: 0.16 μm, hole depth: 0.50 μm, distance between the centers of two adjacent holes: 0.32 μm) and fired at 450° C. for 60 seconds under a nitrogen gas stream having a controlled oxygen concentration of 0.2% or less using a hot plate to form an organic film 8. The substrate used was a foundation substrate 7 ($SiO_2$ wafer substrate) having a dense hole pattern shown in FIGS. 3 (G) (plane view) and (H) (cross-sectional view). The shape of the cross section of each of the resulting wafer substrates was observed with scanning electron microscope (SEM) to confirm whether the substrate is filled with the organic film without voids inside of holes. The results are shown in Table 6. When the material for an organic film having poor embedding characteristics is used, voids are generated inside of holes in this evaluation. When the material for an organic film having good embedding characteristics is used, the organic film is filled without voids inside of holes as shown in FIG. 3 (I), in this evaluation.

TABLE 6

| | Composition for forming organic film | Void |
|---|---|---|
| Example 3-1 | UDL-1 | None |
| Example 3-2 | UDL-2 | None |
| Example 3-3 | UDL-3 | None |
| Example 3-4 | UDL-4 | None |
| Example 3-5 | UDL-5 | None |
| Example 3-6 | UDL-6 | None |
| Example 3-7 | UDL-7 | None |
| Example 3-8 | UDL-8 | None |
| Example 3-9 | UDL-9 | None |
| Example 3-10 | UDL-10 | None |
| Example 3-11 | UDL-11 | None |
| Example 3-12 | UDL-12 | None |
| Example 3-13 | UDL-13 | None |
| Example 3-14 | UDL-14 | None |
| Example 3-15 | UDL-15 | None |
| Example 3-16 | UDL-16 | None |
| Example 3-17 | UDL-17 | None |
| Example 3-18 | UDL-18 | None |
| Example 3-19 | UDL-19 | None |
| Example 3-20 | UDL-20 | None |
| Example 3-21 | UDL-21 | None |
| Example 3-22 | UDL-22 | None |
| Comparative Example 3-1 | Comparative Example UDL-1 | Found |
| Comparative Example 3-2 | Comparative Example UDL-2 | Found |
| Comparative Example 3-3 | Comparative Example UDL-3 | Found |
| Comparative Example 3-4 | Comparative Example UDL-4 | Found |

As shown in Table 6, it could be confirmed that the materials for forming an organic film of the present invention (Examples 3-1 to 3-22) were capable of filling hole pattern without generating voids and have good embedding characteristics. On the other hand, in Comparative Examples 3-1 to 3-3, it was confirmed that voids are generated and embedding characteristics is poor. From these results, it can be understood that, in the materials for forming an organic film of the present invention, heat resistance can be ensured by thermal curing reaction and embedding characteristics are improved. On the other hand, in Comparative Examples 3-1 to 3-3, even in Comparative UDL-3 that showed solvent resistance, heat resistance was insufficient so that voids were generated, thereby good embedding characteristics could not be obtained. In Comparative Example 3-4, whereas solvent resistance and heat resistance under nitrogen atmosphere were ensured, thermal fluidity was insufficient so that embedding was resulted to be insufficient.

Example 4 Evaluation of Flattening Characteristics (Examples 4-1 to 4-22 and Comparative Examples 4-1 to 4-4)

The compositions for forming an organic film (UDL-1 to 22 and Comparative UDL-1 to 4) were each coated on a foundation substrate 9 ($SiO_2$ wafer substrate) having a huge isolated trench pattern (FIG. 4 (J), trench width: 10 μm, trench depth: 0.10 μm) and fired at 450° C. for 60 seconds under a nitrogen gas stream having a controlled oxygen concentration of 0.2% or less, and a level difference of an organic film 10 between a trench portion and a non-trench portion (a delta 10 in FIG. 4 (K)) was observed using an NX10 atomic force microscope (AFM) manufactured by Park Systems. The results are shown in Table 7. In this evaluation, the smaller the level difference is, the better flattening characteristic is. In this evaluation, a trench pattern with a depth of 0.10 µm is flattened using a material for an organic film having a general film thickness of about 0.2 µm, and conditions for evaluating the degree of the flattening characteristics are severe.

TABLE 7

| | Composition for forming organic film | Level difference (nm) |
|---|---|---|
| Example 4-1 | UDL-1 | 30 |
| Example 4-2 | UDL-2 | 60 |
| Example 4-3 | UDL-3 | 35 |
| Example 4-4 | UDL-4 | 45 |
| Example 4-5 | UDL-5 | 50 |
| Example 4-6 | UDL-6 | 55 |
| Example 4-7 | UDL-7 | 50 |
| Example 4-8 | UDL-8 | 40 |
| Example 4-9 | UDL-9 | 45 |
| Example 4-10 | UDL-10 | 45 |
| Example 4-11 | UDL-11 | 60 |
| Example 4-12 | UDL-12 | 45 |
| Example 4-13 | UDL-13 | 50 |
| Example 4-14 | UDL-14 | 60 |
| Example 4-15 | UDL-15 | 30 |
| Example 4-16 | UDL-16 | 35 |
| Example 4-17 | UDL-17 | 40 |
| Example 4-18 | UDL-18 | 60 |
| Example 4-19 | UDL-19 | 40 |
| Example 4-20 | UDL-20 | 45 |
| Example 4-21 | UDL-21 | 40 |
| Example 4-22 | UDL-22 | 25 |
| Comparative Example 4-1 | Comparative UDL-1 | 90 |
| Comparative Example 4-2 | Comparative UDL-2 | 90 |
| Comparative Example 4-3 | Comparative UDL-3 | 85 |
| Comparative Example 4-4 | Comparative UDL-3 | 80 |

As shown in Table 7, as compared with Comparative Examples 4-1 to 4-4, the materials for forming an organic film of the present invention (Examples 4-1 to 4-22) were confirmed to be excellent in flattening characteristics since the level difference of an organic film between the trench portion and the non-trench portion is small. In Comparative Example 4-3, as shown in the results of the heat resistance evaluation of Example 2, since the heat resistance was inferior and film reduction caused by the high-temperature baking was large, the difference in film thickness between the upper and lower steps was emphasized, and the flatness was deteriorated so that it gave the above results. Similarly, in Comparative Examples 4-1 and 4-2, the non-crosslinking polyimide was used, so that the effect of film reduction due to the high-temperature treatment was large, resulting in poor flatness. In Comparative Example 4-4, film reduction was suppressed because of sufficient heat resistance, but as can be seen from the evaluation results of the embedding characteristics of Example 3, thermal fluidity was poor whereby good flatness was not obtained. Further, Examples 4-20 to 4-22 to which a high boiling point solvent was added are compared with Examples 4-2, 4-7 and 4-15 which are not added, it can be understood that flatness was further improved by adding a high boiling point solvent.

Example 5 Patterning Test (Examples 5-1 to 5-22 and Comparative Examples 5-1 to 5-4)

The above compositions for forming an organic film (UDL-1 to 22 and Comparative UDL-1 to 4) were each coated on a silicon wafer substrate on which a SiO$_2$ film having 300 nm has been formed, and fired at 450° C. for 60 seconds under a nitrogen gas stream having a controlled oxygen concentration of 0.2% or less to form an organic film (resist underlayer film) having a thickness of 200 nm. A CVD-SiON hard mask was formed thereon, a material for an organic antireflection film (ARC-29A: available from Nissan Chemical Corporation) was further coated thereon, and baked at 210° C. for 60 seconds to form an organic antireflection film having a thickness of 80 nm, on which a single-layer resist for ArF of a material for a resist upper layer film was coated and baked at 105° C. for 60 seconds to form a photoresist film having a thickness of 100 nm. A liquid-immersion protective film material (TC-1) was coated on the photoresist film and baked at 90° C. for 60 seconds to form a protective film having a thickness of 50 nm.

As a material for a resist upper layer film (single-layer resist for ArF), a polymer (RP1), an acid generator (PAG1) and a basic compound (Amine 1) were dissolved in a solvent containing 0.1% by mass of FC-430 (available from Sumitomo 3M) with the ratio shown in Table 8 and filtered through a 0.1 µm filter made of a fluorine resin to prepare the material.

TABLE 8

| | Polymer (parts by mass) | Acid generator (parts by mass) | Basic compound (parts by mass) | Solvent (parts by mass) |
|---|---|---|---|---|
| For ArF Single-layer resist | RP1 (100) | PAG1 (6.6) | Amine 1 (0.8) | PGMEA (2500) |

The polymer (RP1), the acid generator (PAG1) and the basic compound (Amine 1) used in the material for a resist upper layer film (single-layer resist for ArF) are shown in the following.

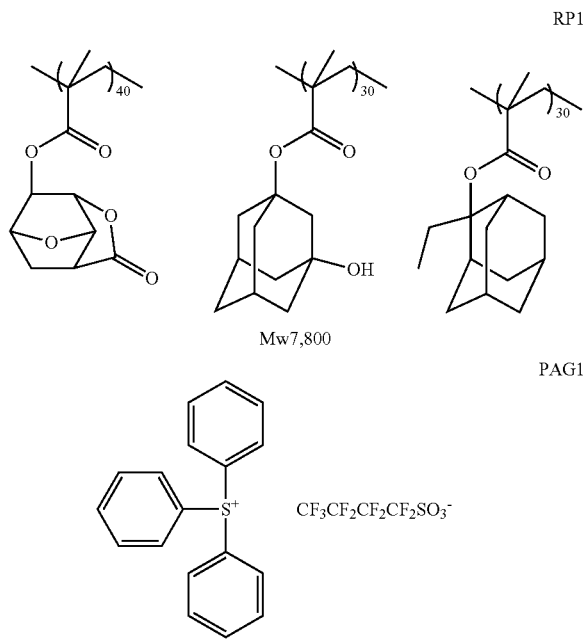

Amine1

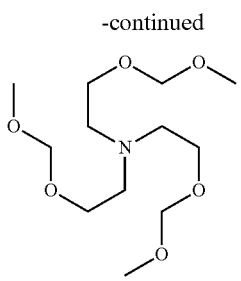

As the material for a liquid-immersion protective film (TC-1), a protective film polymer (PP1) was dissolved in an organic solvent with the ratio shown in Table 9 and filtered through a 0.1 μm filter made of a fluorine resin to prepare the material.

TABLE 9

| | Polymer (parts by mass) | Organic solvent (parts by mass) |
|---|---|---|
| TC-1 | PP1 (100) | Diisoamyl ether (2700) 2-methyl-1-butanol (270) |

The polymer (PP1) used in the material for a liquid-immersion protective film (TC-1) is shown in the following.

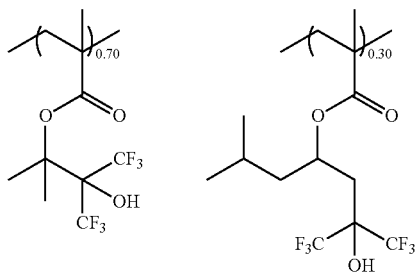

PP1

Mw8,800 Mw/Mn1.69

Then, exposure was carried out with an ArF immersion exposure apparatus (manufactured by Nikon Corporation; NSR-S610C, NA: 1.30, σ: 0.98/0.65, 35-degree dipole s-polarized illumination, 6% halftone phase shift mask), by baking (PEB) at 100° C. for 60 seconds, and developing with a 2.38% by mass aqueous tetramethylammonium hydroxide (TMAH) solution for 30 seconds to obtain a 55 nm 1:1 positive type line and space pattern.

Next, the organic antireflection film and the CVD-SiON hard mask are etched using a resist pattern as a mask by dry etching using an etching apparatus Telius manufactured by Tokyo Electron to form a hard mask pattern, and the obtained hard mask pattern is used as a mask, the organic film was etched to form an organic film pattern, and an $SiO_2$ film was etched using the obtained organic film pattern as a mask. The etching conditions are as shown below.

Conditions for Transferring Resist Pattern to SiON Hard Mask
Chamber pressure: 10.0 Pa
RF power: 1,500 W
$CF_4$ gas flow rate: 75 sccm
$O_2$ gas flow rate: 15 sccm
Duration: 15 seconds Conditions for Transferring Hard Mask Pattern to Organic Film
Chamber pressure: 2.0 Pa
RF power: 500 W
Ar gas flow rate: 75 sccm
$O_2$ gas flow rate: 45 sccm
Duration: 120 seconds Conditions for Transferring Organic Film Pattern to $SiO_2$ Film
Chamber pressure: 2.0 Pa
RF power: 2,200 W
$C_5F_{12}$ gas flow rate: 20 sccm
$C_2F_6$ gas flow rate: 10 sccm
Ar gas flow rate: 300 sccm
$O_2$ gas flow rate: 60 sccm
Duration: 90 seconds The results of observing the cross section of the pattern with an electron microscope (S-4700) manufactured by Hitachi, Ltd., are shown in Table 10.

TABLE 10

| | Composition for forming organic film | Pattern profile after etching for transferring to substrate |
|---|---|---|
| Example 5-1 | UDL-1 | Perpendicular profile |
| Example 5-2 | UDL-2 | Perpendicular profile |
| Example 5-3 | UDL-3 | Perpendicular profile |
| Example 5-4 | UDL-4 | Perpendicular profile |
| Example 5-5 | UDL-5 | Perpendicular profile |
| Example 5-6 | UDL-6 | Perpendicular profile |
| Example 5-7 | UDL-7 | Perpendicular profile |
| Example 5-8 | UDL-8 | Perpendicular profile |
| Example 5-9 | UDL-9 | Perpendicular profile |
| Example 5-10 | UDL-10 | Perpendicular profile |
| Example 5-11 | UDL-11 | Perpendicular profile |
| Example 5-12 | UDL-12 | Perpendicular profile |
| Example 5-13 | UDL-13 | Perpendicular profile |
| Example 5-14 | UDL-14 | Perpendicular profile |
| Example 5-15 | UDL-15 | Perpendicular profile |
| Example 5-16 | UDL-16 | Perpendicular profile |
| Example 5-17 | UDL-17 | Perpendicular profile |
| Example 5-18 | UDL-18 | Perpendicular profile |
| Example 5-19 | UDL-19 | Perpendicular profile |
| Example 5-20 | UDL-20 | Perpendicular profile |
| Example 5-21 | UDL-21 | Perpendicular profile |
| Example 5-22 | UDL-22 | Perpendicular profile |
| Comparative Example 5-1 | Comparative UDL-1 | Perpendicular profile |
| Comparative Example 5-2 | Comparative UDL-2 | Perpendicular profile |
| Comparative Example 5-3 | Comparative UDL-3 | Perpendicular profile |
| Comparative Example 5-4 | Comparative UDL-4 | Perpendicular profile |

As shown in Table 10, from the results of the materials for forming an organic film of the present invention (Examples 5-1 to 5-22), in each case, the resist upper layer film pattern was finally transferred well to the substrate, and thus, it was confirmed that the materials for forming an organic film of the present invention was suitably used for fine processing by a multilayer resist method. In Comparative Example 5-3, a pattern could be formed although heat resistance was insufficient. Further, in Comparative Examples 5-1 and 5-2, a pattern could be formed although heat resistance and solvent resistance were both insufficient.

Example 6 Patterning Test (Examples 6-1 to 6-22 and Comparative Examples 6-1 to 6-4)

The above-mentioned materials for forming an organic film (UDL-1 to 22 and comparative UDL-1 to 4) are respectively coated on a SiO$_2$ wafer substrate having a trench pattern (trench width: 10 μm and trench depth: 0.10 μm), and a coating film was formed in the same manner as in Example 5 except that the coating film was baked at 450° C. for 60 seconds under a nitrogen gas stream having a controlled oxygen concentration of 0.2% or less, and patterning and dry etching were carried out, and the shape of the resulting pattern was observed.

TABLE 11

| | Composition for forming organic film | Pattern profile after etching for transferring to substrate |
|---|---|---|
| Example 6-1 | UDL-1 | Perpendicular profile |
| Example 6-2 | UDL-2 | Perpendicular profile |
| Example 6-3 | UDL-3 | Perpendicular profile |
| Example 6-4 | UDL-4 | Perpendicular profile |
| Example 6-5 | UDL-5 | Perpendicular profile |
| Example 6-6 | UDL-6 | Perpendicular profile |
| Example 6-7 | UDL-7 | Perpendicular profile |
| Example 6-8 | UDL-8 | Perpendicular profile |
| Example 6-9 | UDL-9 | Perpendicular profile |
| Example 6-10 | UDL-10 | Perpendicular profile |
| Example 6-11 | UDL-11 | Perpendicular profile |
| Example 6-12 | UDL-12 | Perpendicular profile |
| Example 6-13 | UDL-13 | Perpendicular profile |
| Example 6-14 | UDL-14 | Perpendicular profile |
| Example 6-15 | UDL-15 | Perpendicular profile |
| Example 6-16 | UDL-16 | Perpendicular profile |
| Example 6-17 | UDL-17 | Perpendicular profile |
| Example 6-18 | UDL-18 | Perpendicular profile |
| Example 6-19 | UDL-19 | Perpendicular profile |
| Example 6-20 | UDL-20 | Perpendicular profile |
| Example 6-21 | UDL-21 | Perpendicular profile |
| Example 6-22 | UDL-22 | Perpendicular profile |
| Comparative Example 6-1 | Comparative UDL-1 | Pattern collapse found |
| Comparative Example 6-2 | Comparative UDL-2 | Pattern collapse found |
| Comparative Example 6-3 | Comparative UDL-3 | Pattern collapse found |
| Comparative Example 6-4 | Comparative UDL-4 | Pattern collapse found |

As shown in Table 11, from the results of the material for forming an organic film of the present invention (Examples 6-1 to 6-22), in each case, the resist upper layer film pattern was finally transferred well to the substrate, and thus, it was confirmed that the material for forming an organic film of the present invention was suitably used for fine processing by a multilayer resist method. On the other hand, in Comparative Examples 6-1 to 6-4, even if the heat resistance and the solvent resistance were ensured, the pattern was collapsed during pattern processing because the embedding of the pattern was poor, and a good pattern could not be finally obtained.

Example 7 Adhesiveness Test (Examples 7-1 to 7-22 and Comparative Examples 7-1 to 7-4)

The above compositions for forming an organic film (UDL-1 to 22 and comparative UDL-1 to 4) were each coated on a SiO$_2$ wafer substrate and fired at 450° C. for 60 seconds under a nitrogen gas stream having a controlled oxygen concentration of 0.2% or less to form an organic film having a thickness of 200 nm. The wafer having the organic film was cut into a square of 1×1 cm, and an aluminum pin with an epoxy adhesive was attached to the cut wafer using a dedicated jig. Thereafter, the wafer was heated at 150° C. for 1 hour using an oven to adhere the aluminum pin to the substrate. After cooling to room temperature, the initial adhesiveness was evaluated by resistance force using a thin film adhesive strength measuring apparatus (Sebastian Five-A).

In FIG. 5, an explanatory view showing a method for measuring the adhesiveness is shown. In FIG. 5, the reference numeral "11" is a silicon wafer (substrate), "12" is a cured film, "13" is an aluminum pin with an adhesive, "14" is a support, "15" is a grip and "16" is a tensile direction. The adhesion is an average value of 12-point measurements, and the higher the value, the higher the adhesiveness of the organic film to the substrate. The adhesiveness was evaluated by comparing the obtained numerical values. The results are shown in Table 12.

TABLE 12

| | Composition for forming organic film | Adhesion (mN) |
|---|---|---|
| Example 7-1 | UDL-1 | 410 |
| Example 7-2 | UDL-2 | 440 |
| Example 7-3 | UDL-3 | 430 |
| Example 7-4 | UDL-4 | 360 |
| Example 7-5 | UDL-5 | 330 |
| Example 7-6 | UDL-6 | 440 |
| Example 7-7 | UDL-7 | 340 |
| Example 7-8 | UDL-8 | 330 |
| Example 7-9 | UDL-9 | 430 |
| Example 7-10 | UDL-10 | 450 |
| Example 7-11 | UDL-11 | 370 |
| Example 7-12 | UDL-12 | 440 |
| Example 7-13 | UDL-13 | 390 |
| Example 7-14 | UDL-14 | 380 |
| Example 7-15 | UDL-15 | 450 |
| Example 7-16 | UDL-16 | 430 |
| Example 7-17 | UDL-17 | 430 |
| Example 7-18 | UDL-18 | 370 |
| Example 7-19 | UDL-19 | 440 |
| Example 7-20 | UDL-20 | 390 |
| Example 7-21 | UDL-21 | 360 |
| Example 7-22 | UDL-22 | 450 |
| Comparative Example 7-1 | Comparative UDL-1 | 390 |
| Comparative Example 7-2 | Comparative UDL-2 | 360 |
| Comparative Example 7-3 | Comparative UDL-3 | 390 |
| Comparative Example 7-4 | Comparative UDL-4 | 20 |

As shown in Table 12, the compositions for forming an organic film using polyimide (Examples 7-1 to 7-22) were excellent in adhesiveness as compared to Comparative Example 7-4 having no imide structure, and it can be understood that the imide group contained in the main chain of the polymer contributes to the development of adhesiveness. From the results of the adhesiveness test, it was confirmed that the material for forming an organic film of the present invention was suitably used as a patterning material.

From the above, when the material for forming an organic film of the present invention is employed, it has both of heat resistance of 400° C. or higher and high degree embedding/flattening characteristics even under an inert gas containing no oxygen, and thus is extremely useful as a material for an organic film used for a multilayer resist method, and it becomes clear that when the patterning process of the present invention is employed, a fine pattern can be formed with high precision even if the body to be processed is a substrate having a level difference.

It should be noted that the present invention is not restricted to the above-described embodiments. The embodiments are merely examples so that any embodiments that have substantially the same feature and demonstrate the same functions and effects as those in the technical concept as disclosed in claims of the present invention are included in the technical range of the present invention.

The invention claimed is:

1. A material for forming an organic film, which comprises
   (A) a polymer having a repeating unit represented by the following general formula (1A) whose terminal group is a group represented by either of the following general formulae (1B) or (1C), and
   (B) an organic solvent:

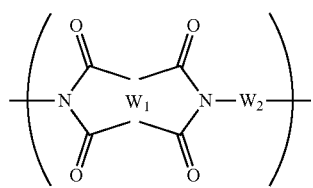
(1A)

wherein, $W_1$ represents a tetravalent organic group, and $W_2$ represents a divalent organic group:

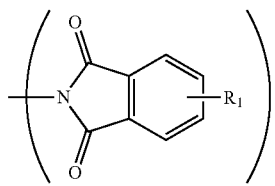
(1B)

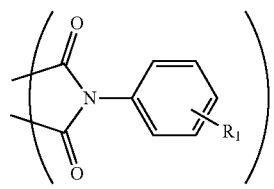
(1C)

wherein, $R_1$ represents any of the groups represented by the following formula (1D), and two or more of $R_1$s may be used in combination,

(1D)

2. The material for forming an organic film according to claim 1, wherein $W_1$ in the general formula (1A) is a group represented by the following general formula (1E):

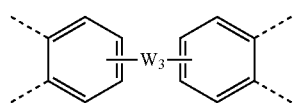
(1E)

wherein, $W_3$ represents a single bond or a divalent organic group, a benzene ring in the formula may have a substituent(s), and the substituent on the benzene ring and the organic group in $W_3$ may be bonded to each other to form a cyclic organic group.

3. The material for forming an organic film according to claim 1, wherein $W_1$ in the general formula (1A) is any of the groups represented by the following formula (1F):

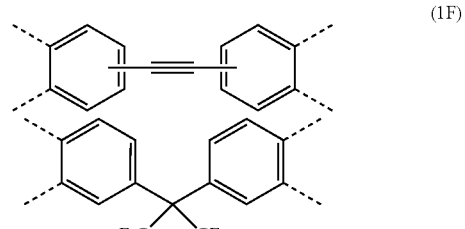
(1F)

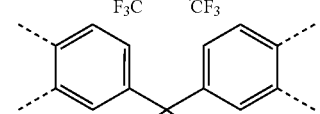

wherein, a substituent(s) may be present on an aromatic ring in the above formula.

4. The material for forming an organic film according to claim 1, wherein $W_2$ in the general formula (1A) is a group represented by the following general formula (1G):

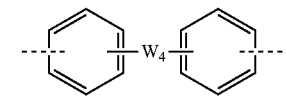

(1G)

wherein, $W_4$ represents a single bond or a divalent organic group, a benzene ring in the formula may have a substituent(s), and the substituent on the benzene ring and the organic group in $W_4$ may be bonded to each other to form a cyclic organic group.

5. The material for forming an organic film according to claim 1, wherein $W_2$ in the general formula (1A) is any of the groups represented by the following formula (1H):

(1H)

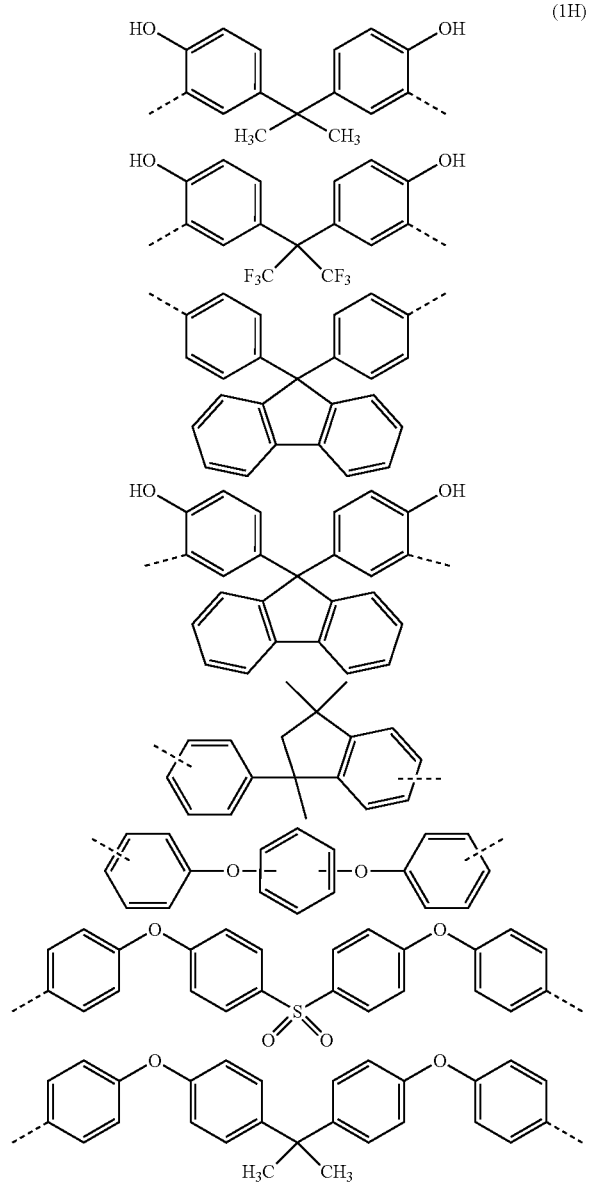

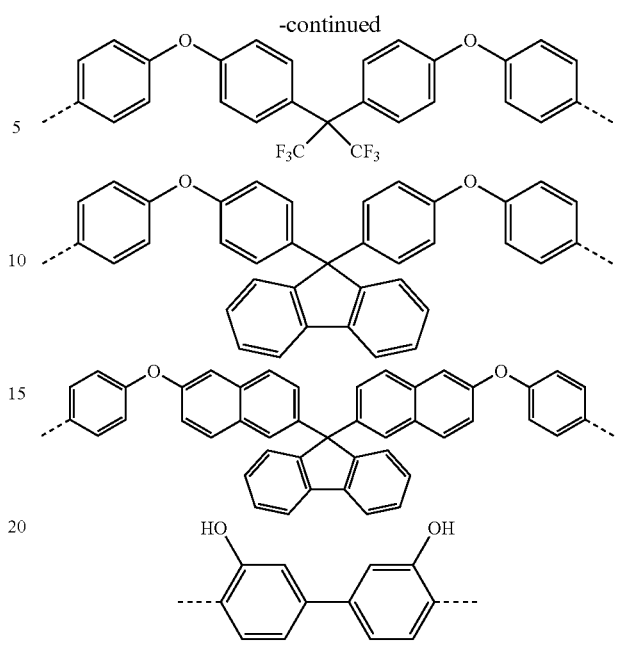

wherein, a substituent(s) may be present on an aromatic ring in the formula.

6. The material for forming an organic film according to claim 5, wherein $W_1$ in the general formula (1A) is one or more of the groups represented by the formula (1F) and $W_2$ in the general formula (1A) is one or more of the groups represented by the formula (1H).

7. The material for forming an organic film according to claim 1, wherein the weight average molecular weight of the component (A) is 1,000 to 10,000.

8. The material for forming an organic film according to claim 1, wherein the component (B) is a mixture of one or more kinds of organic solvents having a boiling point of less than 180° C., and one or more kinds of organic solvents having a boiling point of 180° C. or higher.

9. The material for forming an organic film according to claim 1, wherein the material for forming an organic film further comprises one or more of (C) an acid generator, (D) a surfactant, (E) a crosslinking agent and (F) a plasticizer.

10. A substrate for manufacturing a semiconductor apparatus, which comprises an organic film obtained by curing the material for forming an organic film according to claim 1 being formed on a substrate.

11. A method for forming an organic film applied in a process of manufacturing a semiconductor apparatus, which comprises spin-coating the material for forming an organic film according to claim 1 on a substrate to be processed, and heat-treating the substrate to be processed coated with the material for forming an organic film at 50° C. or higher and 600° C. or lower for 10 seconds to 7,200 seconds in an inert gas atmosphere to obtain a cured film.

12. The method for forming an organic film according to claim 11, wherein the oxygen concentration in the inert gas is 1% or less.

13. The method for forming an organic film according to claim 11, wherein the substrate to be processed used has a structure or a step with a height of 30 nm or more.

14. A method for forming an organic film applied in a process of manufacturing a semiconductor apparatus, which comprises spin-coating the material for forming an organic film according to claim 1 on a substrate to be processed, heat-treating the substrate to be processed coated with the material for forming an organic film at 50° C. or higher and 250° C. or lower for 5 seconds to 600 seconds in the air to form a coated film, and subsequently heat-treating the same at 200° C. or higher and 600° C. or lower for 10 seconds to 7,200 seconds in an inert gas atmosphere to obtain a cured film.

15. A patterning process which comprises forming an organic film on a body to be processed using the material for forming an organic film according to claim 1, forming a silicon-containing resist intermediate film on the organic film using a material for a silicon-containing resist intermediate film, forming a resist upper layer film on the silicon-containing resist intermediate film using a photoresist composition, forming a circuit pattern in the resist upper layer film, transferring the pattern to the silicon-containing resist intermediate film by etching using the resist upper layer film in which the pattern has been formed as a mask, transferring the pattern to the organic film by etching using the silicon-containing resist intermediate film to which the pattern has been transferred as a mask, and further transferring the pattern to the body to be processed by etching using the organic film to which the pattern has been transferred as a mask.

16. The patterning process according to claim 15, wherein the circuit pattern is formed by lithography using a light whose wavelength is 10 nm or more and 300 nm or less, direct writing by electron beam, nanoimprinting, or a combination thereof.

17. The patterning process according to claim 15, wherein the circuit pattern formed is developed by an alkaline development or an organic solvent.

18. The patterning process according to claim 15, wherein the body to be processed used is a semiconductor apparatus substrate, or the semiconductor apparatus substrate coated with any of a metal film, a metal carbide film, a metal oxide film, a metal nitride film, a metal oxycarbide film and a metal oxynitride film.

19. The patterning process according to claim 18, wherein the body to be processed used contains silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof.

20. A patterning process which comprises forming an organic film on a body to be processed using the material for forming an organic film according to claim 1, forming a silicon-containing resist intermediate film on the organic film using a material for a silicon-containing resist intermediate film, forming an organic antireflection film on the silicon-containing resist intermediate film, forming a resist upper layer film on the organic antireflection film using a photoresist composition to provide a four-layer film structure, forming a circuit pattern in the resist upper layer film, transferring the pattern to the organic antireflection film and the silicon-containing resist intermediate film by etching using the resist upper layer film in which the pattern has been formed as a mask, transferring the pattern to the organic film by etching using the silicon-containing resist intermediate film to which the pattern has been transferred as a mask, and further transferring the pattern to the body to be processed by etching using the organic film to which the pattern has been transferred as a mask.

21. A patterning process which comprises forming an organic film on a body to be processed using the material for forming an organic film according to claim 1, forming an inorganic hard mask selected from a silicon oxide film, a silicon nitride film, a silicon oxynitride film, a titanium oxide film and a titanium nitride film on the organic film, forming a resist upper layer film on the inorganic hard mask using a photoresist composition, forming a circuit pattern in the resist upper layer film, transferring the pattern to the inorganic hard mask by etching using the resist upper layer film in which the pattern has been formed as a mask, transferring the pattern to the organic film by etching using the inorganic hard mask to which the pattern has been transferred as a mask, and further transferring the pattern to the body to be processed by etching using the organic film to which the pattern has been transferred as a mask.

22. The patterning process according to claim 21, wherein the inorganic hard mask is formed by a CVD method or an ALD method.

23. A patterning process which comprises forming an organic film on a body to be processed using the material for forming an organic film according to claim 1, forming an inorganic hard mask selected from a silicon oxide film, a silicon nitride film, a silicon oxynitride film, a titanium oxide film and a titanium nitride film on the organic film, forming an organic antireflection film on the inorganic hard mask, forming a resist upper layer film on the organic antireflection film using a photoresist composition to provide a four-layer film structure, forming a circuit pattern in the resist upper layer film, transferring the pattern to the organic antireflection film and the inorganic hard mask by etching using the resist upper layer film in which the pattern has been formed as a mask, transferring the pattern to the organic film by etching using the inorganic hard mask to which the pattern has been transferred as a mask, and further transferring the pattern to the body to be processed by etching using the organic film to which the pattern has been transferred as a mask.

* * * * *